United States Patent
Huang et al.

(10) Patent No.: US 12,557,620 B2
(45) Date of Patent: Feb. 17, 2026

(54) TRANSISTOR CONTACTS AND METHODS OF FORMING THE SAME

(71) Applicant: Taiwan Semiconductor Manufacturing Co., Ltd., Hsinchu (TW)

(72) Inventors: Yu-Lien Huang, Jhubei (TW); Tze-Liang Lee, Hsinchu (TW); Jr-Hung Li, Chupei (TW); Chun-Kai Chen, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 406 days.

(21) Appl. No.: 18/151,181

(22) Filed: Jan. 6, 2023

(65) Prior Publication Data

US 2024/0021476 A1    Jan. 18, 2024

Related U.S. Application Data

(60) Provisional application No. 63/411,875, filed on Sep. 30, 2022, provisional application No. 63/368,369, filed on Jul. 14, 2022.

(51) Int. Cl.
*H01L 21/768* (2006.01)
*H01L 29/66* (2006.01)
*H10D 64/01* (2025.01)

(52) U.S. Cl.
CPC .. *H01L 21/76897* (2013.01); *H01L 21/76813* (2013.01); *H10D 64/021* (2025.01); *H10D 64/017* (2025.01)

(58) Field of Classification Search
CPC ........ H01L 21/76897; H01L 21/76813; H10D 64/021; H10D 64/017
See application file for complete search history.

(56) References Cited

U.S. PATENT DOCUMENTS

| | | | |
|---|---|---|---|
| 6,998,343 B1 * | 2/2006 | Sun | H01L 21/76826 438/653 |
| 9,105,490 B2 | 8/2015 | Wang et al. | |

(Continued)

FOREIGN PATENT DOCUMENTS

| | | |
|---|---|---|
| CN | 112582403 A | 3/2021 |
| CN | 113764351 A | 12/2021 |

(Continued)

*Primary Examiner* — Peniel M Gumedzoe
(74) *Attorney, Agent, or Firm* — Slater Matsil, LLP

(57) ABSTRACT

In an embodiment, a device includes: a source/drain region over a semiconductor substrate; a dielectric layer over the source/drain region, the dielectric layer including a first dielectric material; an inter-layer dielectric over the dielectric layer, the inter-layer dielectric including a second dielectric material and an impurity, the second dielectric material different from the first dielectric material, a first portion of the inter-layer dielectric having a first concentration of the impurity, a second portion of the inter-layer dielectric having a second concentration of the impurity, the first concentration less than the second concentration; and a source/drain contact extending through the inter-layer dielectric and the dielectric layer to contact the source/drain region, the first portion of the inter-layer dielectric disposed between the source/drain contact and the second portion of the inter-layer dielectric.

20 Claims, 46 Drawing Sheets

(56) References Cited

U.S. PATENT DOCUMENTS

| | | | |
|---|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,763,168 B2 | 9/2020 | Hsieh et al. |
| 11,145,751 B2 | 10/2021 | Chen et al. |
| 11,362,212 B2 | 6/2022 | Khaderbad et al. |
| 11,646,377 B2 | 5/2023 | Chien et al. |
| 2002/0061654 A1 | 5/2002 | Kanegae et al. |
| 2003/0127427 A1 | 7/2003 | Yuan et al. |
| 2014/0070373 A1 | 3/2014 | Tsai et al. |
| 2019/0148153 A1 | 5/2019 | Cheng et al. |
| 2020/0135641 A1 | 4/2020 | Lee et al. |
| 2020/0321332 A1 | 10/2020 | Zainuddin et al. |
| 2021/0351039 A1 | 11/2021 | Huang et al. |
| 2021/0376101 A1 | 12/2021 | Wang et al. |
| 2022/0052169 A1 | 2/2022 | More et al. |
| 2022/0102202 A1 | 3/2022 | Hsiung et al. |

FOREIGN PATENT DOCUMENTS

| | | |
|---|---|---|
| TW | 201924062 A | 6/2019 |
| TW | 201942977 A | 11/2019 |

\* cited by examiner

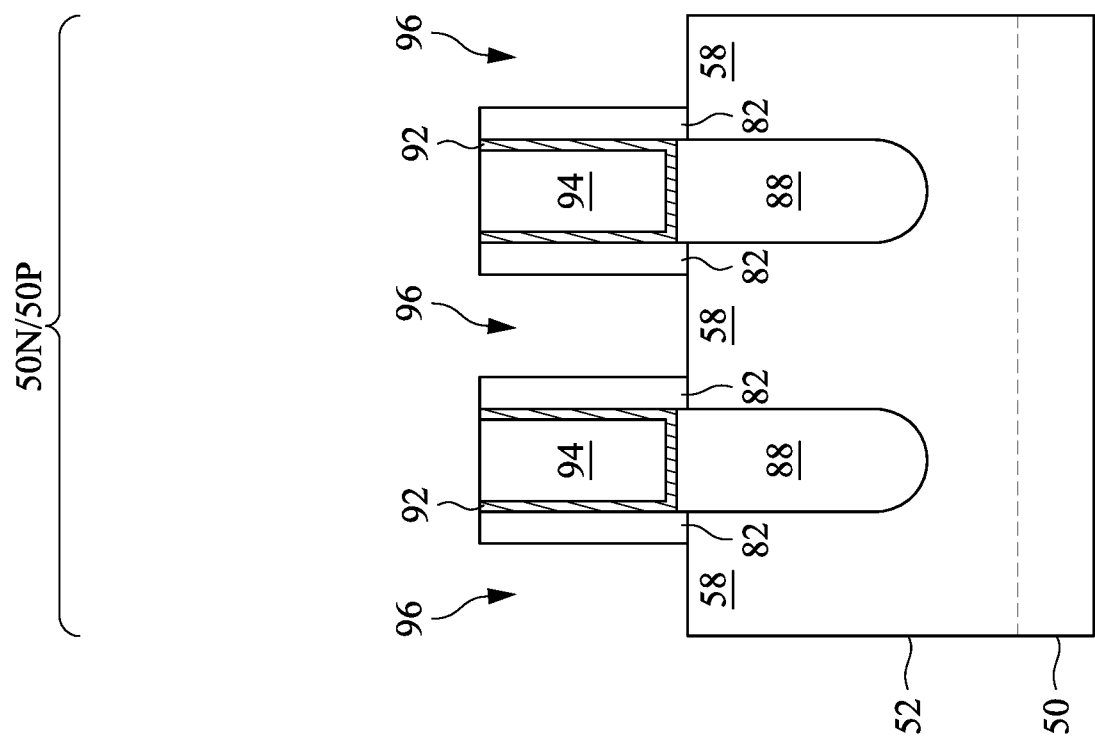

TRANSISTOR CONTACTS AND METHODS OF FORMING THE SAME

PRIORITY CLAIM AND CROSS-REFERENCE

This application claims the benefit of U.S. Provisional Application No. 63/411,875, filed on Sep. 30, 2022 and U.S. Provisional Application No. 63/368,369, filed on Jul. 14, 2022, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
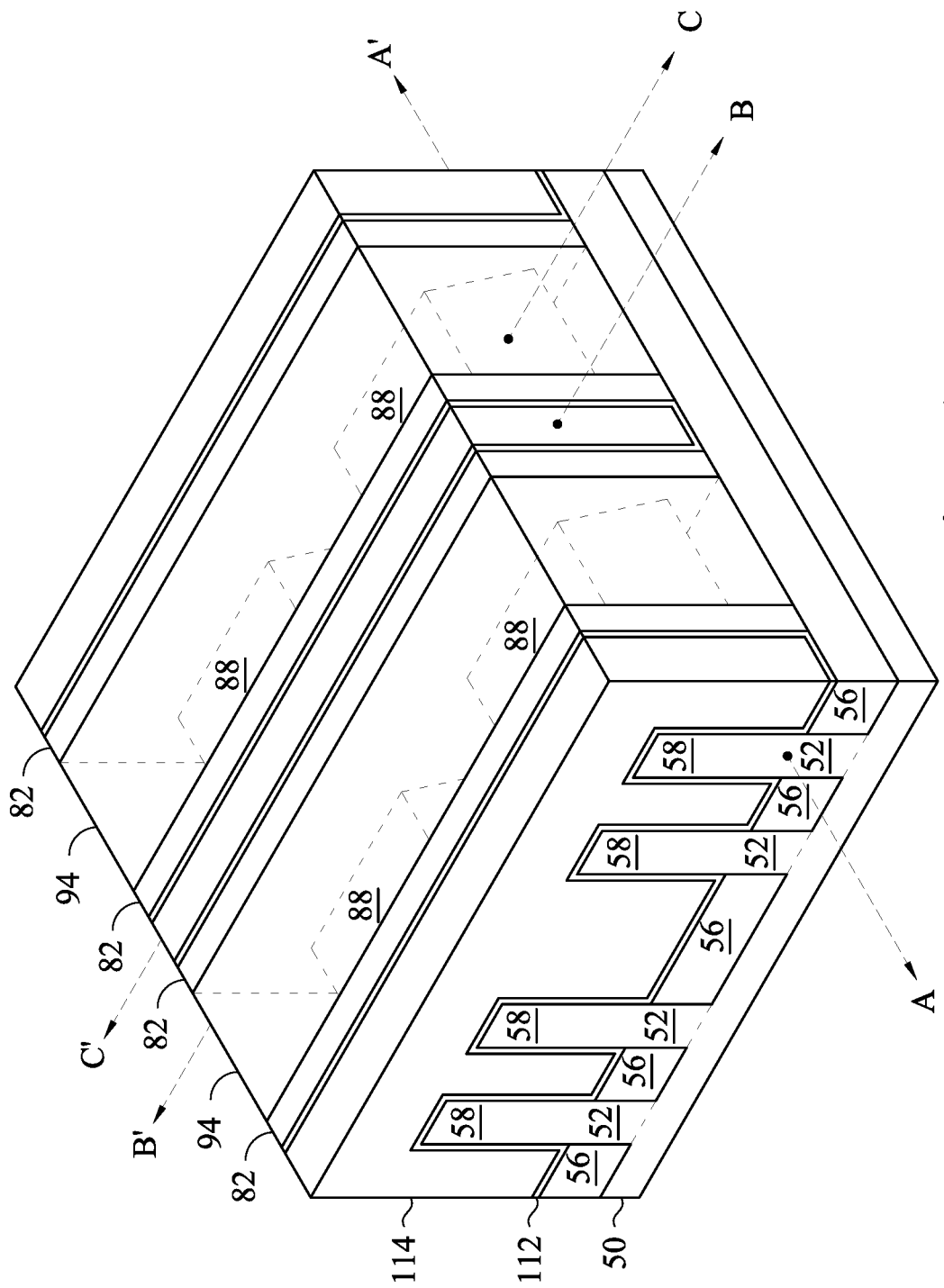
FIG. 1 illustrates an example of Fin Field-Effect Transistors (FinFETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an opening for a contact/via is formed through a dielectric material, such as an inter-layer dielectric or an inter-metal dielectric. The dielectric material is disposed on an etch stop layer. One or more treatment process(es) are performed to decrease an etch rate of the dielectric material around the opening, relative an etching process that will be used to clean the opening. Damage to the dielectric material during the cleaning process may thus be reduced, thereby increasing the electrical isolation ability of the dielectric material.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include fins 52 extending above a primary surface of a substrate 50 (e.g., a semiconductor substrate), with the fins 52 acting as channel regions 58 for the FinFETs. Isolation regions 56, such as shallow trench isolation (STI) regions, are disposed between adjacent fins 52, which may protrude above and from between adjacent isolation regions 56. The isolation regions 56 between the fins 52 are fin isolation structures. Although the isolation regions 56 are described/illustrated as being separate from the substrate 50, as used herein, the term "substrate" may refer to the semiconductor substrate alone or a combination of the semiconductor substrate and the isolation regions. Additionally, although the lower portions of the fins 52 are illustrated as being single, continuous materials with the substrate 50, the lower portions of the fins 52 and/or the substrate 50 may include a single material or a plurality of materials.

Gate dielectrics 112 are along sidewalls and over top surfaces of the fins 52. Gate electrodes 114 are over the gate dielectrics 112. Source/drain regions 88 (illustrated in ghost) are disposed in opposite sides of the fins 52 with respect to the gate dielectrics 112 and the gate electrodes 114. Source/drain region(s) 88 may refer to a source or a drain, individually or collectively dependent upon the context. Gate spacers 82 separate the source/drain regions 88 from the gate dielectrics 112 and the gate electrodes 114. An inter-layer dielectric (ILD) 94 is formed over the source/drain regions 88. Contacts (subsequently described) to the source/drain regions 88 will be formed through the ILD 94. The source/drain regions 88 may be shared between various fins 52. For example, adjacent source/drain regions 88 may be electrically connected, such as through coalescing the source/drain regions 88 by epitaxial growth, or through coupling the source/drain regions 88 with a same source/drain contact.

FIG. 1 further illustrates reference cross-sections that are used in later figures. Cross-section A-A' is along a longitudinal axis of a fin 52 and in a direction of, for example, a current flow between the source/drain regions 88 of a FinFET. Cross-section B-B' is perpendicular to cross-section A-A' and is along a longitudinal axis of a gate electrode 114. Cross-section C-C' is parallel to cross-section B-B' and extends through the source/drain regions 88 of the FinFETs. Subsequent figures refer to these reference cross-sections for clarity.

Some embodiments discussed herein are discussed in the context of FinFETs formed using a gate-last process. In other embodiments, a gate-first process may be used.

FIGS. 2-23D are views of intermediate stages in the manufacturing of FinFETs, in accordance with some embodiments. FIGS. 2, 3, 4, and 5 are three-dimensional views showing a similar three-dimensional view as FIG. 1. FIGS. 6A, 7A, 8A, 9A, 10A, 11A, 12A, 13A, 14A, 15A, 16A, 17A, 18A, 19A, 20A, 21A, 22A, and 23A are cross-sectional views illustrated along a similar cross-section as reference cross-section A-A' in FIG. 1. FIGS. 6B, 7B, 8B, 9B, 10B, 11B, 12B, 13B, 14B, 15B, 16B, 17B, 18B, 19B, 20B, 21B, 22B, and 23B are cross-sectional views illustrated along a similar cross-section as reference cross-section B-B' in FIG. 1. FIGS. 6C, 7C, 8C, 9C, 10C, 11C, 12C, 13C, 14C, 15C, 16C, 17C, 18C, 19C, 20C, 21C, 22C, and 23C are cross-sectional views illustrated along a similar cross-section as reference cross-section C-C' in FIG. 1. FIGS. 19D and 23D are top-down views.

Figure 2:
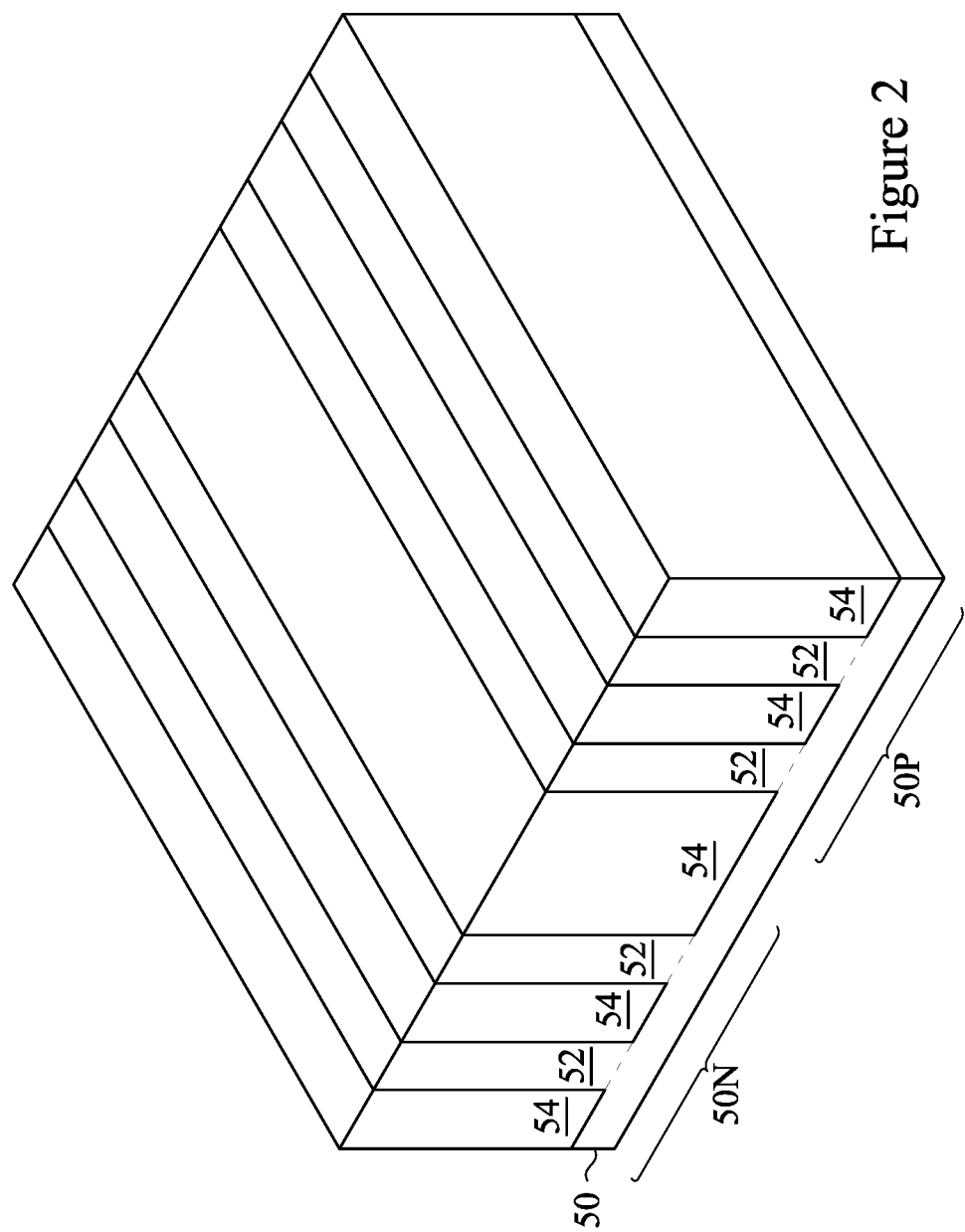
FIGS. 2-23D are views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Fins 52 are formed in the substrate 50. The fins 52 are semiconductor strips, and may also be referred to as semiconductor fin. The fins 52 may be formed in the substrate 50 by etching trenches in the substrate 50. The etching may be any acceptable etching process, such as a reactive ion etch (RIE), neutral beam etch (NBE), the like, or a combination thereof. The etching process may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

An insulation material 54 is formed over the substrate 50 and between neighboring fins 52. The insulation material 54 may be an oxide, such as silicon oxide, a nitride, the like, or a combination thereof, and may be formed by a chemical vapor deposition (CVD) process, such as a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, the insulation material 54 is silicon oxide formed by a FCVD process. An anneal process may be performed once the insulation material is formed. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as one of the previously described insulation materials may be formed over the liner.

In an embodiment, the insulation material 54 is formed such that excess insulation material 54 covers the fins 52. A removal process may be applied to the insulation material 54 to remove excess insulation material 54 over the fins 52. In some embodiments, a planarization process such as a chemical mechanical polish (CMP), an etch-back process, combinations thereof, or the like is utilized. The planarization process may expose the fins 52 such that top surfaces of the fins 52 and the insulation material 54 are substantially coplanar (within process variations) after the planarization process. In embodiments in which a mask remains on the fins 52, the planarization process may expose the mask or remove the mask such that top surfaces of the mask or the fins 52, respectively, and the insulation material 54 are substantially coplanar (within process variations) after the planarization process.

The previously described process is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches to form the fins 52. Additionally, in some embodiments, heteroepitaxial structures can be used for the fins 52. For example, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50 to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region 50N (e.g., an NMOS region) different from the material in the p-type region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Figure 3:
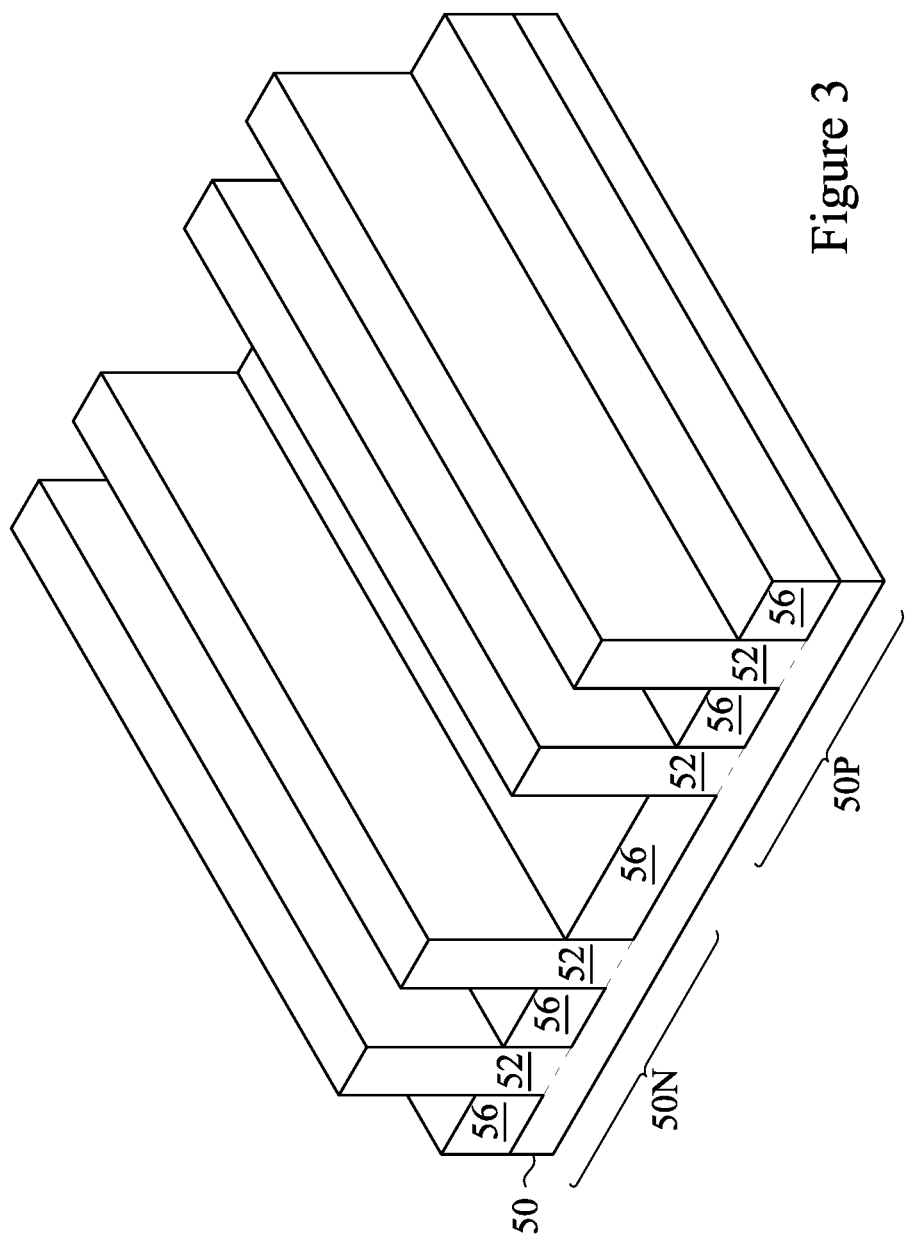

In FIG. 3, the insulation material 54 is recessed to form STI regions 56. The insulation material 54 is recessed such that upper portions of the fins 52 protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal may be performed using dilute hydrofluoric (dHF) acid.

Further, appropriate wells (not separately illustrated) may be formed in the fins 52 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In the embodiments with different well types, the different implant steps for the n-type region 50N and the p-type region 50P may be achieved using a mask (not separately illustrated) such as a photoresist. For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between $10^{16}$ cm$^{-3}$ and $10^{18}$ cm$^{-3}$. After the implant, the photoresist is removed, such as by an acceptable ashing process.

Following or prior to the implanting of the p-type region 50P, a mask (not separately illustrated) such as a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between $10^{16}$ cm$^{-3}$ and $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments where, epitaxial structures are epitaxially grown for the fins 52, the grown materials may be in situ doped during growth, which may obviate the implantations, although in situ and implantation doping may be used together.

Figure 4:
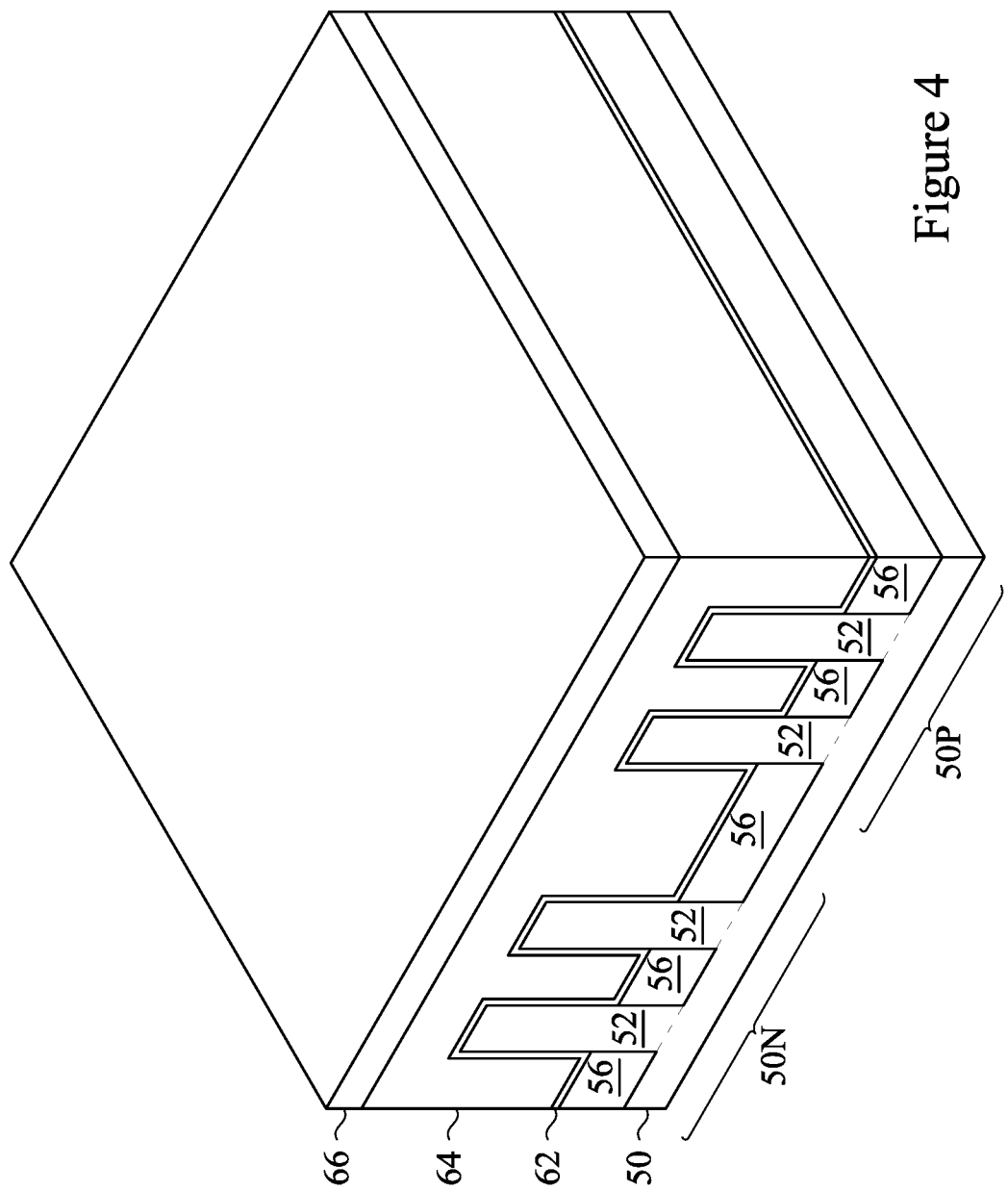

In FIG. 4, a dummy dielectric layer 62 is formed on the fins 52. The dummy dielectric layer 62 may be formed of a dielectric material such as silicon oxide, silicon nitride, a combination thereof, or the like, which may be deposited or thermally grown according to acceptable techniques. A dummy gate layer 64 is formed over the dummy dielectric layer 62. The dummy gate layer 64 may be deposited over the dummy dielectric layer 62 and then planarized, such as by a CMP. The dummy gate layer 64 may be formed of a conductive or non-conductive material, such as amorphous silicon, polycrystalline-silicon (polysilicon), poly-crystal-line silicon-germanium (poly-SiGe), a metal, a metallic nitride, a metallic silicide, a metallic oxide, or the like, which may be deposited by physical vapor deposition (PVD), CVD, or the like. The dummy gate layer 64 may be formed of material(s) that have a high etching selectivity from insulation materials, e.g., the STI regions 56 and/or the dummy dielectric layer 62. A mask layer 66 is formed over the dummy gate layer 64. The mask layer 66 may be deposited over the dummy gate layer 64. The mask layer 66 may be formed of a dielectric material such as silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the fins 52 and the STI regions 56, such that the dummy dielectric layer 62 extends over the STI regions 56 and between the dummy gate layer 64 and the STI regions 56. In another embodiment, the dummy dielectric layer 62 covers only the fins 52.

Figure 5:
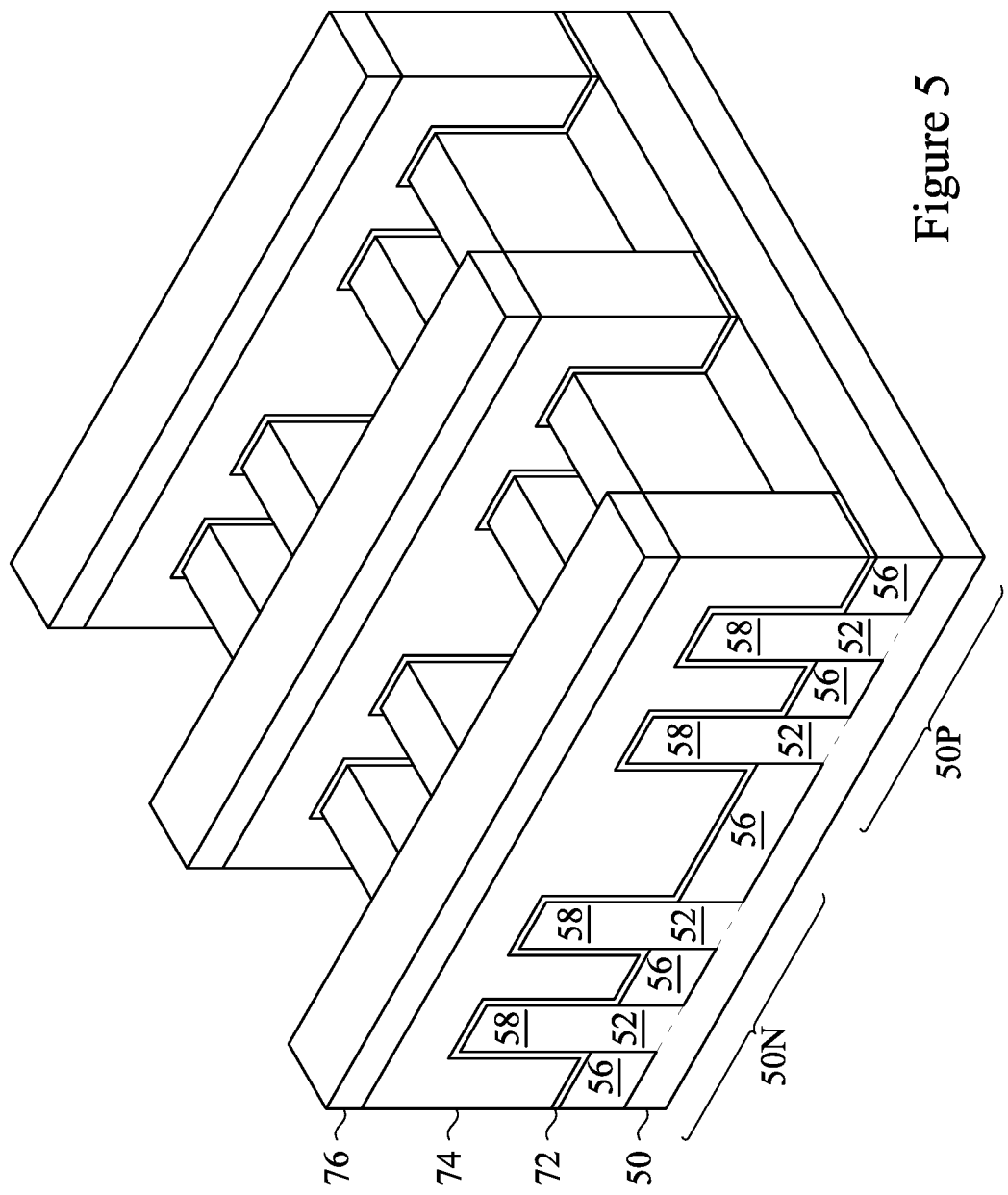

In FIG. 5, the mask layer 66 is patterned using acceptable photolithography and etching techniques to form masks 76. The pattern of the masks 76 is then transferred to the dummy gate layer 64 by any acceptable etching technique to form dummy gates 74. The pattern of the masks 76 may optionally be further transferred to the dummy dielectric layer 62 by any acceptable etching technique to form dummy dielectrics 72. The dummy gates 74 cover respective channel regions 58 of the fins 52. The pattern of the masks 76 may be used to physically separate adjacent dummy gates 74. The dummy gates 74 may also have lengthwise directions substantially perpendicular (within process variations) to the lengthwise directions of the fins 52. The masks 76 may be removed during the patterning of the dummy gate 74, or may be removed during subsequent processing.

FIGS. 6A-23D illustrate various additional steps in the manufacturing of embodiment devices. FIGS. 6A-23D illustrate features in either of the n-type region and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figure 6A:
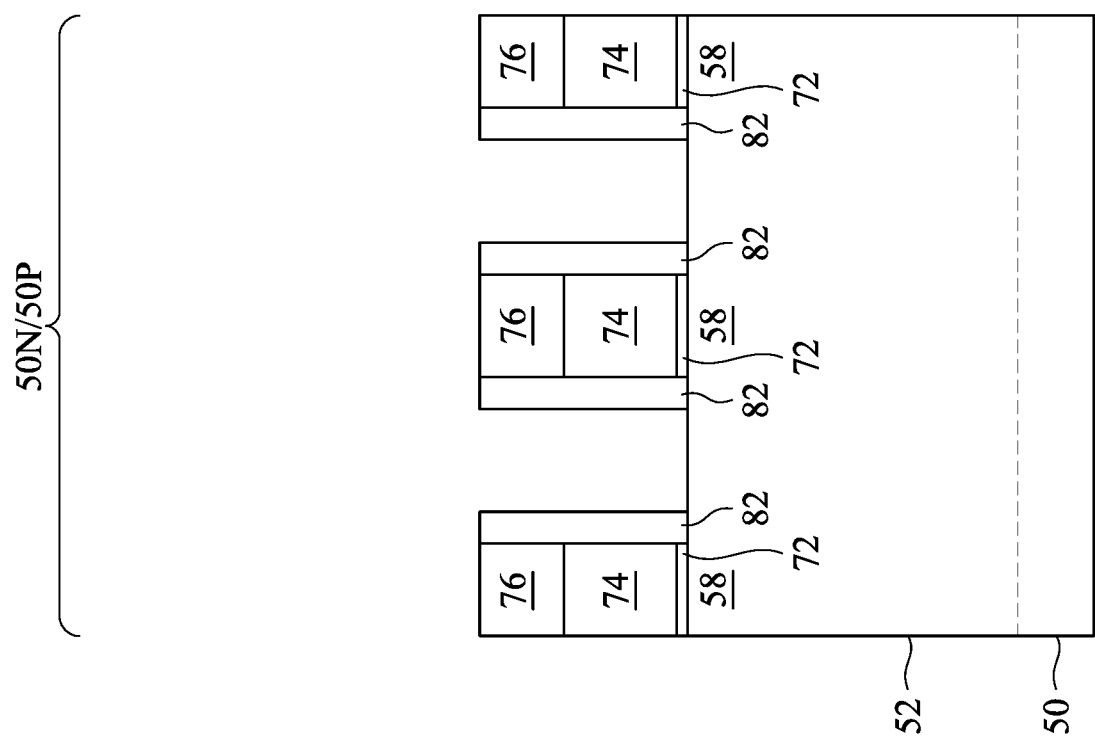
Figure 6C:
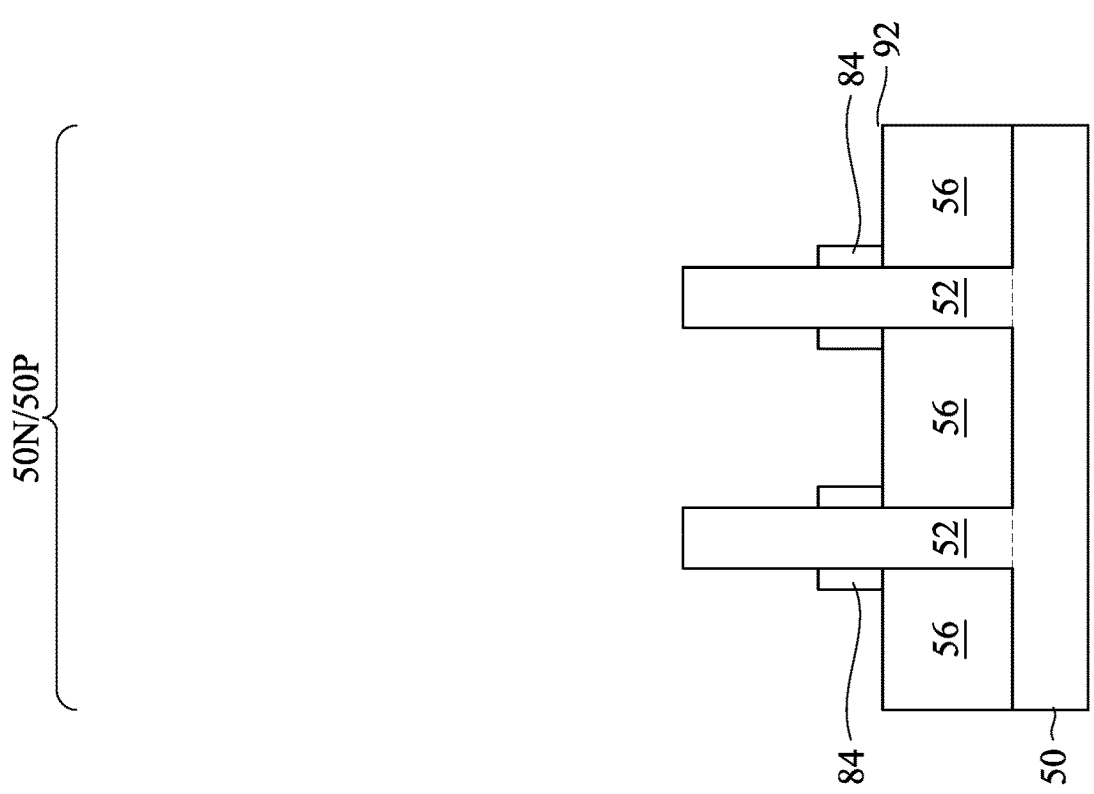
Figure 6B:
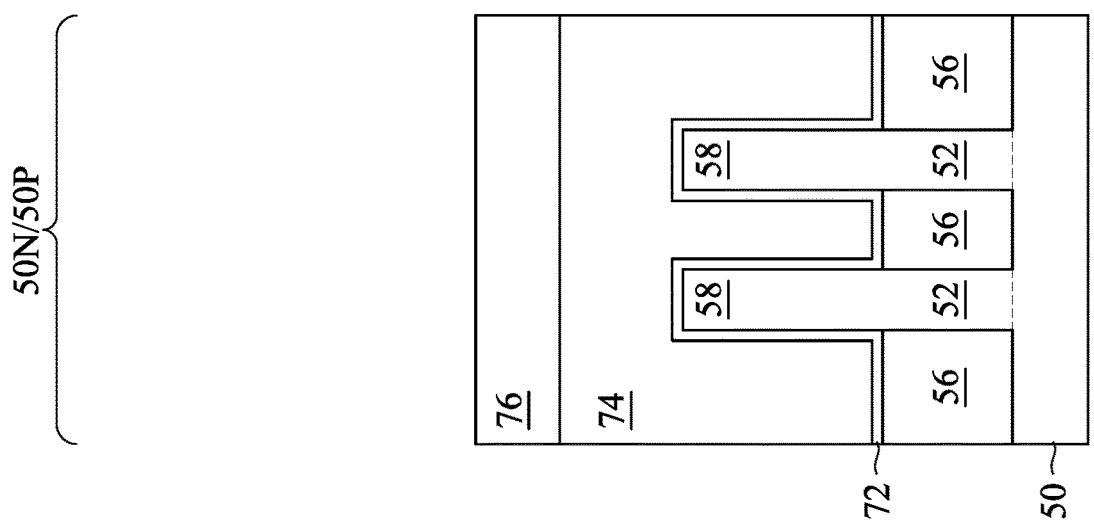

In FIGS. 6A-6C, gate spacers 82 are formed over the fins 52 and on exposed sidewalls of the masks 76 (if present), the dummy gates 74, and the dummy dielectrics 72. The gate spacers 82 may be formed by conformally depositing one or more dielectric material(s) and subsequently etching the dielectric material(s). Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other dielectric materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 82, see FIG. 6A). In some embodiments the etch used to form the gate spacers 82 is adjusted so that the dielectric material(s), when etched, also have portions left on the sidewalls of the fins 52 (thus forming fin spacers 84, see FIG. 6C). After etching, the fin spacers 84 (if present) and the gate spacers 82 can have straight sidewalls (as illustrated) or can have rounded sidewalls (not separately illustrated).

Further, implants may be performed to form lightly doped source/drain (LDD) regions (not separately illustrated) in the fins 52. In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 52 exposed in the p-type region 50P. The mask may then be removed. Subsequently, a mask (not separately illustrated) such as a photoresist may be formed over the p-type region 50P while exposing the n-type region and appropriate type impurities (e.g., n-type) may be implanted into the fins 52 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 74, so that the channel regions 58 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, spacers may be formed and removed, and/or the like. Furthermore, the n-type and p-type devices may be formed using different structures and steps.

Figure 7A:
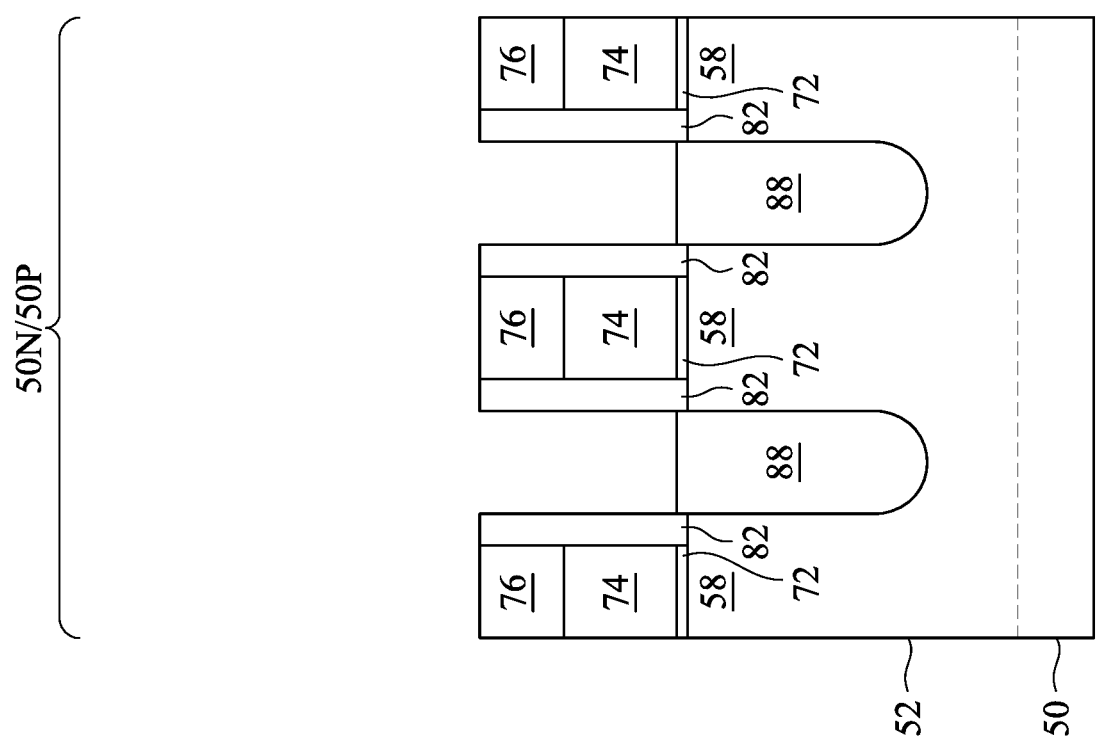
Figure 7C:
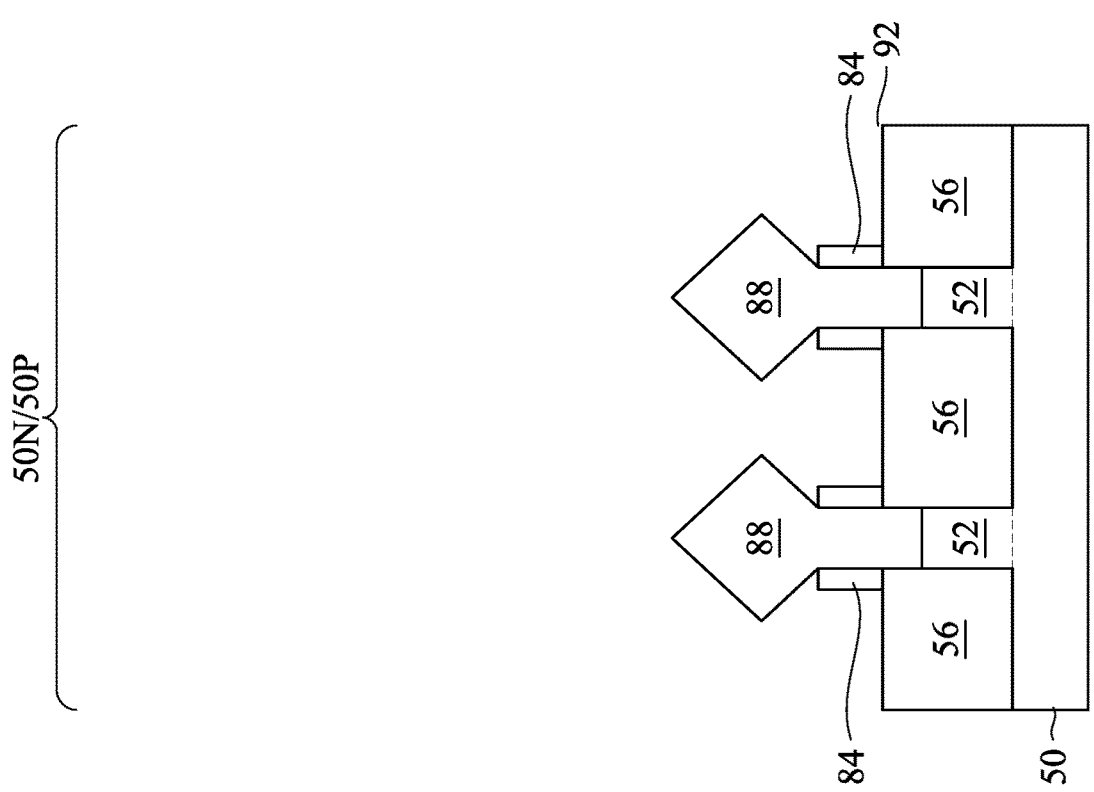
Figure 7B:
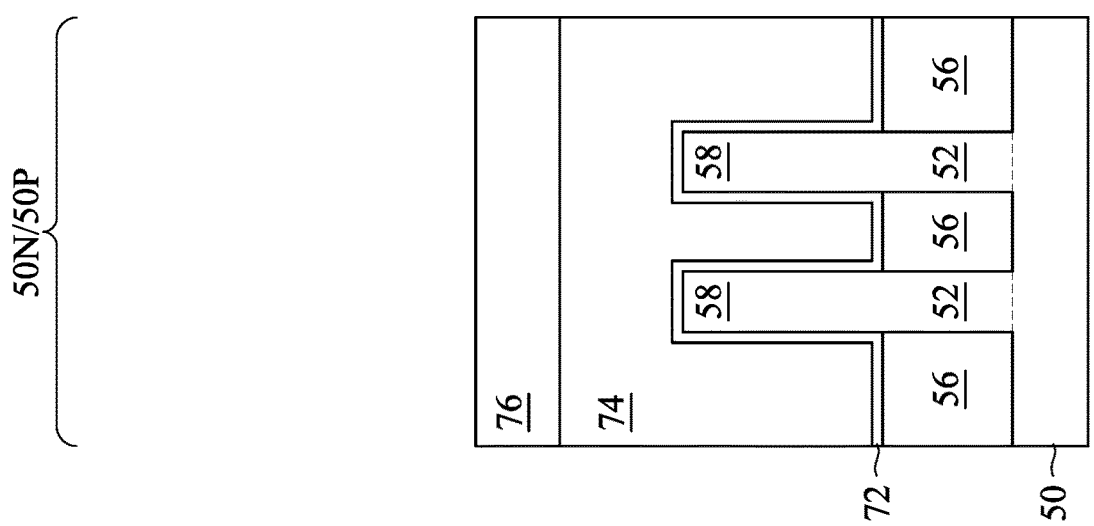

In FIGS. 7A-7C, epitaxial source/drain regions 88 are formed in the fins 52. The epitaxial source/drain regions 88 are formed in the fins 52 such that each dummy gate 74 is disposed between respective neighboring pairs of the epitaxial source/drain regions 88. In some embodiments the epitaxial source/drain regions 88 may extend into, and may also penetrate through, the fins 52. In some embodiments, the gate spacers 82 are used to separate the epitaxial source/drain regions 88 from the dummy gates 74 by an appropriate lateral distance so that the epitaxial source/drain regions 88 do not short out subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P and etching source/drain regions of the fins 52 in the n-type region 50N to form recesses in the fins 52. Then, the epitaxial source/drain regions 88 in the n-type region 50N are epitaxially grown in the recesses. The epitaxial source/drain regions 88 may include any acceptable material appropriate for n-type devices. For example, if the fins 52 are silicon, the epitaxial source/drain regions 88 in the n-type region 50N may include materials exerting a tensile strain on the channel regions 58, such as silicon, silicon carbide, phosphorous-doped silicon, phosphorous-doped silicon carbide, silicon phosphide, or the like. The epitaxial source/drain regions 88 in the n-type region 50N may be referred to as "n-type source/drain regions." The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N and etching source/drain regions of the fins 52 in the p-type region 50P to form recesses in the fins 52. Then, the epitaxial source/drain regions 88 in the p-type region 50P are epitaxially grown in the recesses. The epitaxial source/drain regions 88 may include any acceptable material appropriate for p-type devices. For example, if the fins 52 are silicon, the epitaxial source/drain regions 88 in the p-type region 50P may include materials exerting a compressive strain on the channel regions 58, such as silicon germanium, boron-doped silicon germanium, germanium, germanium tin, or the like. The epitaxial source/drain regions 88 in the p-type region 50P may be referred to as "p-type source/drain regions." The epitaxial source/drain regions 88 in the p-type region 50P may have surfaces raised from respective surfaces of the fins 52 and may have facets.

The epitaxial source/drain regions 88 and/or the fins 52 may be implanted with dopants to form source/drain regions, similar to the process previously discussed for forming lightly-doped source/drain regions, followed by an anneal. The source/drain regions may have an impurity concentration of between $10^{19}$ cm$^{-3}$ and $10^{21}$ cm$^{-3}$. The n-type and/or p-type impurities for source/drain regions may be any of the impurities previously discussed. In some embodiments, the epitaxial source/drain regions 88 may be in situ doped during growth.

As a result of the epitaxy processes used to form the epitaxial source/drain regions 88, upper surfaces of the epitaxial source/drain regions have facets which expand laterally outward beyond sidewalls of the fins 52. In some embodiments, these facets cause adjacent epitaxial source/drain regions 88 to merge, as illustrated by FIG. 1. In some embodiments, adjacent epitaxial source/drain regions 88 remain separated after the epitaxy process is completed, as illustrated by FIG. 7C. In the illustrated embodiments, the fin spacers 84 are formed to cover a portion of the sidewalls of the fins 52 that extend above the STI regions 56, thereby blocking the epitaxial growth. In another embodiment, the spacer etch used to form the gate spacers 82 is adjusted to not form the fin spacers 84, so as to allow the epitaxial source/drain regions 88 to extend to the surface of the STI regions 56.

Figure 8A:
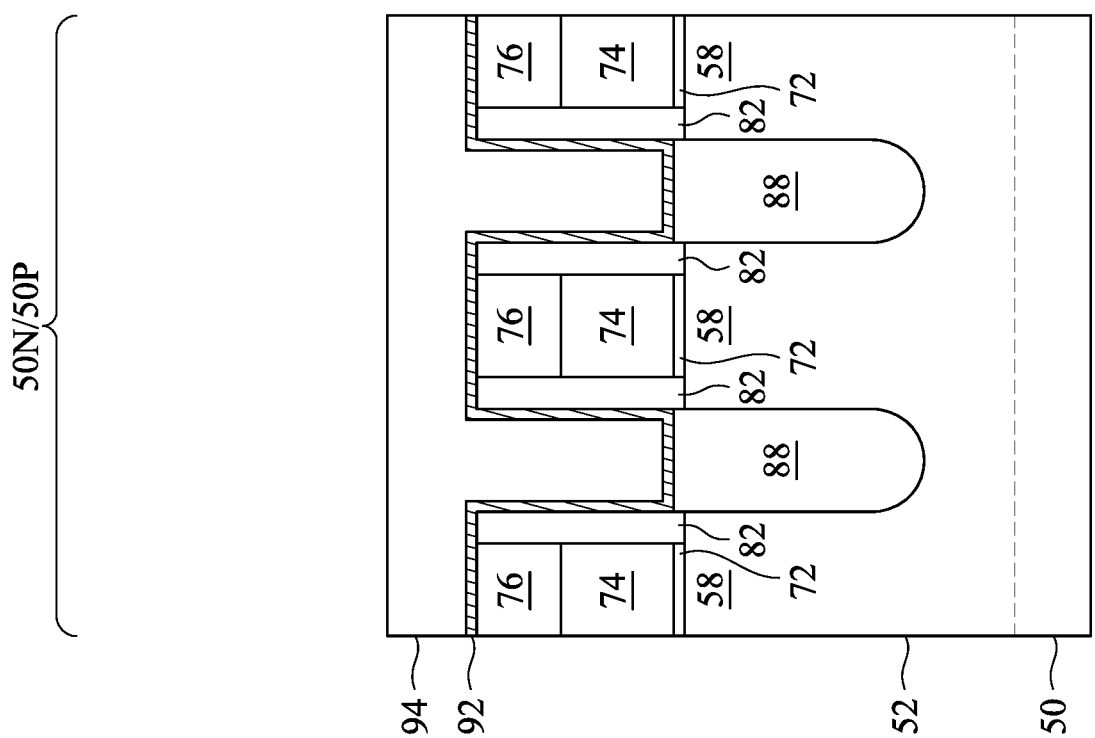
Figure 8C:
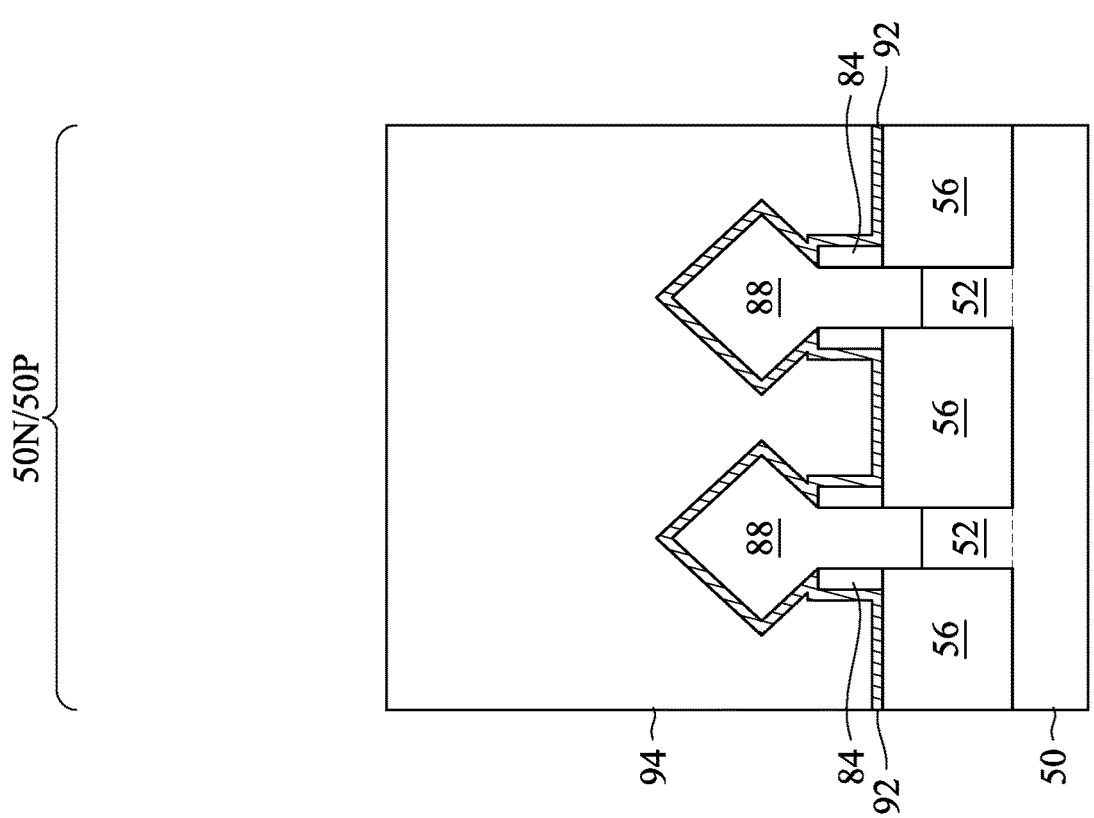
Figure 8B:
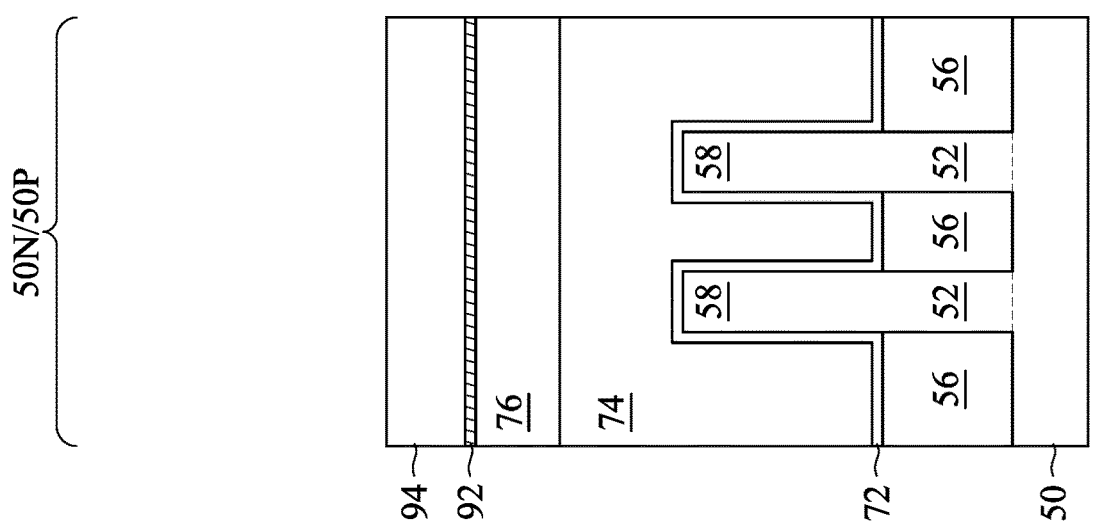

In FIGS. 8A-8C, a first ILD 94 is deposited over the epitaxial source/drain regions 88, the gate spacers 82, and the masks 76 (if present) or the dummy gates 74. The first ILD 94 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other dielectric materials formed by any acceptable process may be used.

In some embodiments, a contact etch stop layer (CESL) 92 is formed between the first ILD 94 and the epitaxial source/drain regions 88, the gate spacers 82, and the masks 76 (if present) or the dummy gates 74. The CESL 92 may be formed of a dielectric material having a high etching selectivity from the first ILD 94. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like.

Figure 9A:
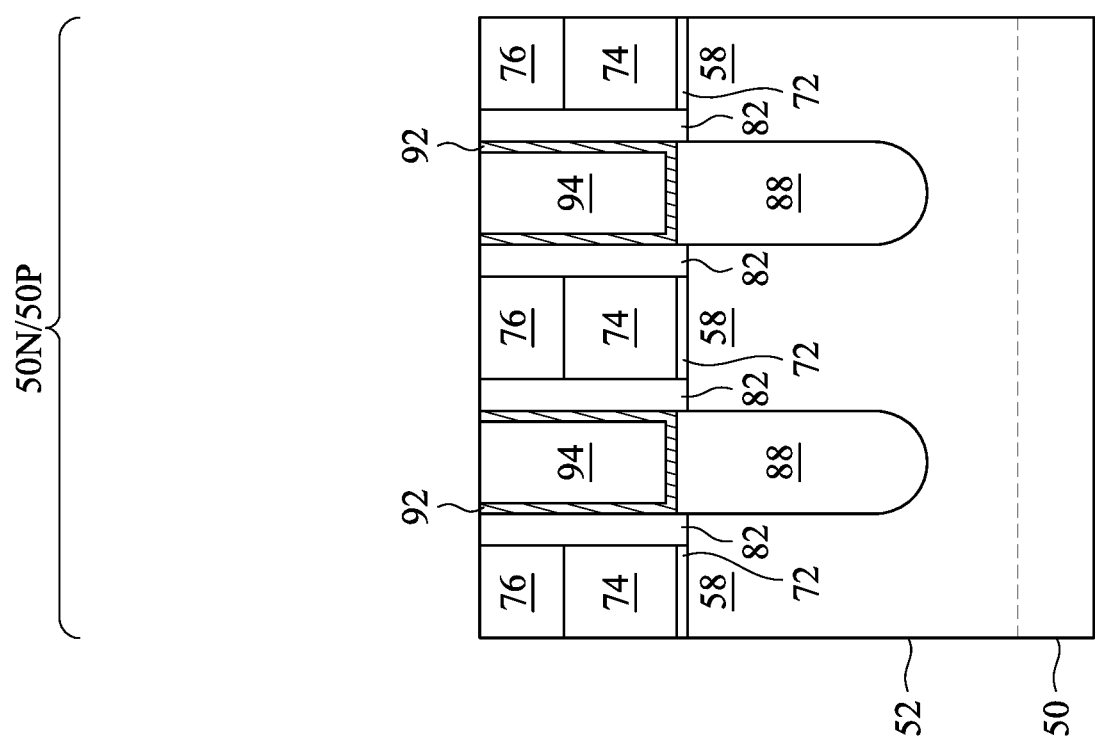
Figure 9C:
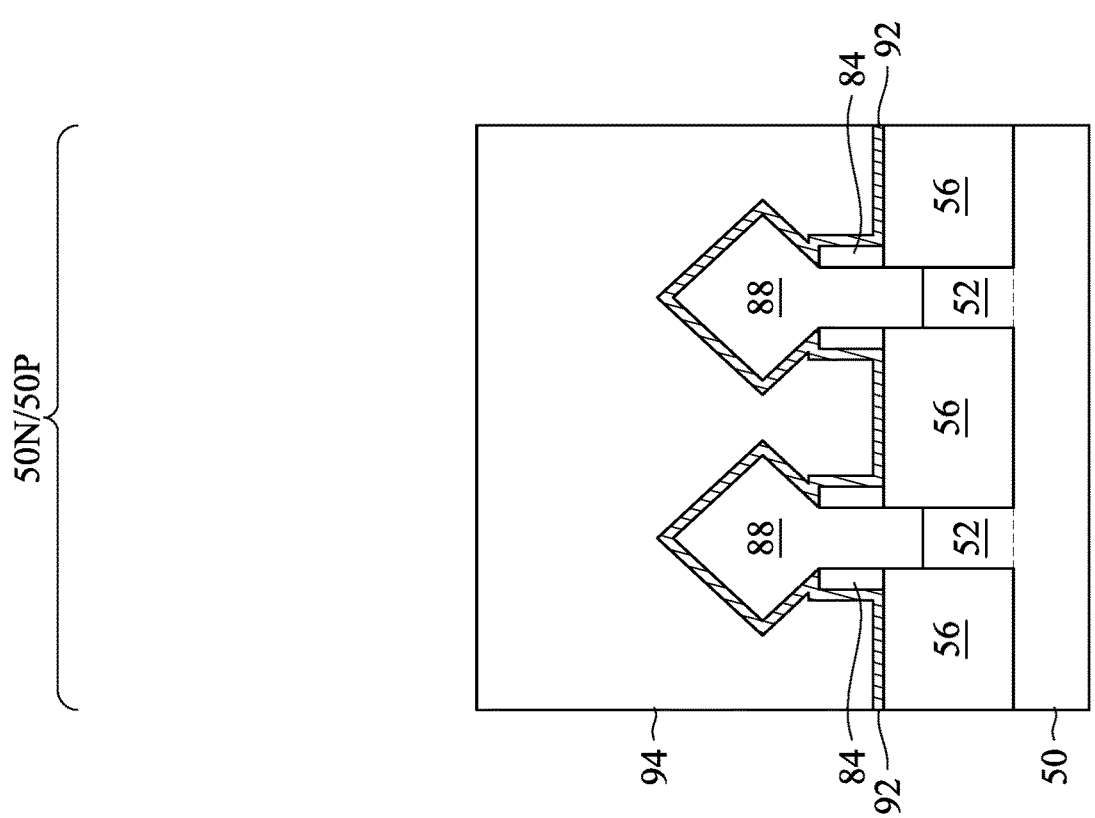
Figure 9B:
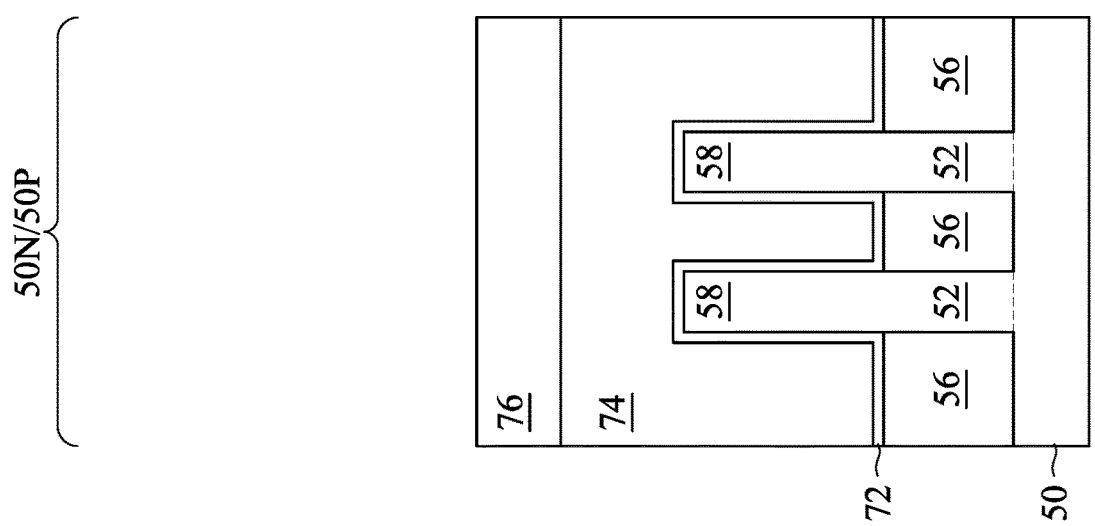

In FIGS. 9A-9C, a removal process is performed to level the top surfaces of the first ILD 94 with the top surfaces of the masks 76 (if present) or the dummy gates 74. In some embodiments, a planarization process such as a chemical mechanical polish (CMP), an etch-back process, combinations thereof, or the like is utilized. The planarization process may also remove the masks 76 on the dummy gates 74, and portions of the gate spacers 82 along sidewalls of the masks 76. After the planarization process, the top surfaces of the first ILD 94, the CESL 92, the gate spacers 82, and the masks 76 (if present) or the dummy gates 74 are substantially coplanar (within process variations). Accordingly, the top surfaces of the masks 76 (if present) or the dummy gates 74 are exposed through the first ILD 94. In the illustrated embodiment, the masks 76 remain, and the planarization process levels the top surfaces of the first ILD 94 with the top surfaces of the masks 76.

Figure 10C:
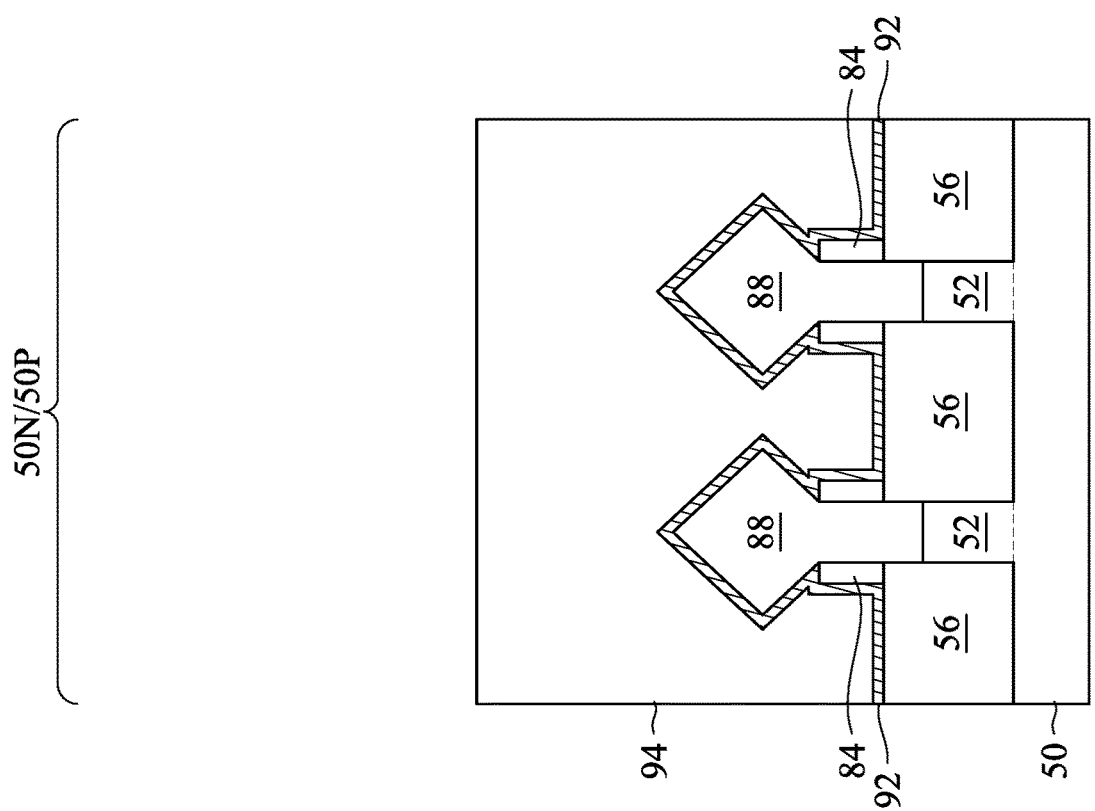
Figure 10B:
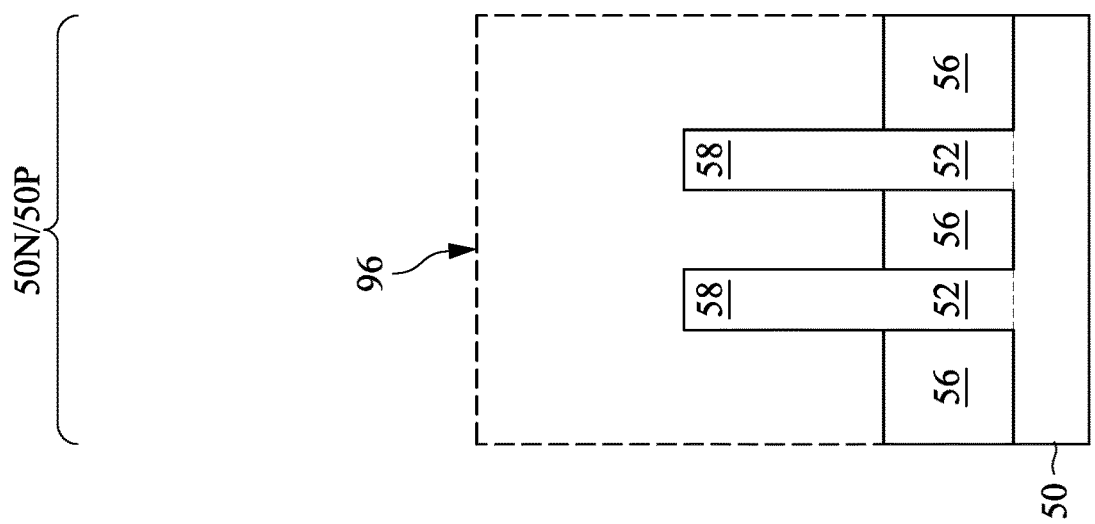

In FIGS. 10A-10C, the masks 76 (if present) and the dummy gates 74 are removed in an etching process, so that recesses 96 are formed. Portions of the dummy dielectrics 72 in the recesses 96 may also be removed. In some embodiments, only the dummy gates 74 are removed and the dummy dielectrics 72 remain and are exposed by the recesses 96. In some embodiments, the dummy dielectrics 72 are removed from recesses 96 in a first region of a die (e.g., a core logic region) and remain in recesses 96 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the first ILD 94 or the gate spacers 82. During the removal, the dummy dielectrics 72 may be used as etch stop layers when the dummy gates 74 are etched. The dummy dielectrics 72 may then be optionally removed after the removal of the dummy gates 74. Each recess 96 exposes and/or overlies a channel region 58 of a respective fin 52.

Figure 11A:
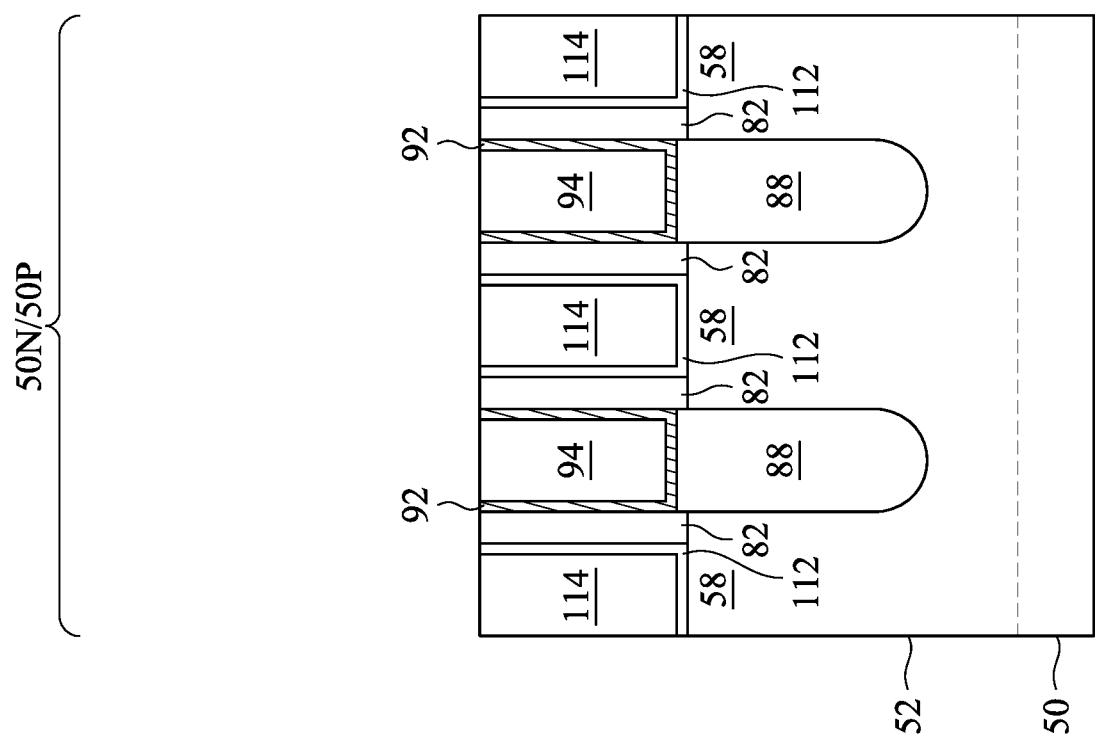
Figure 11C:
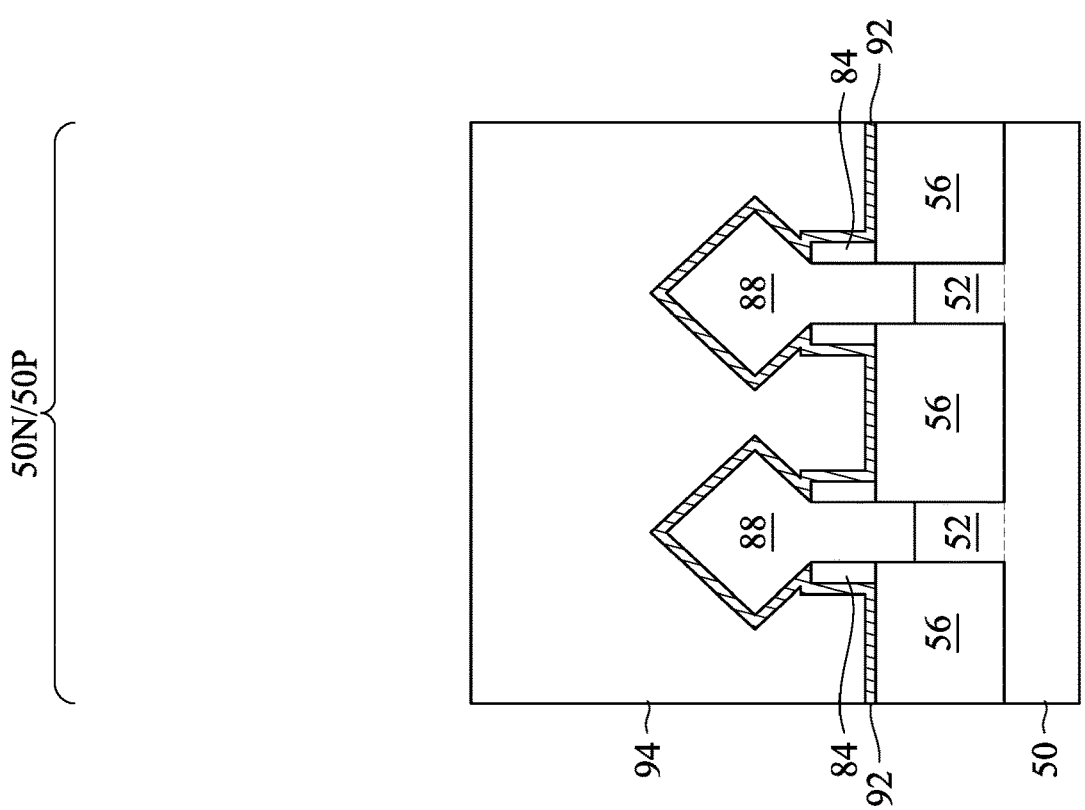
Figure 11B:
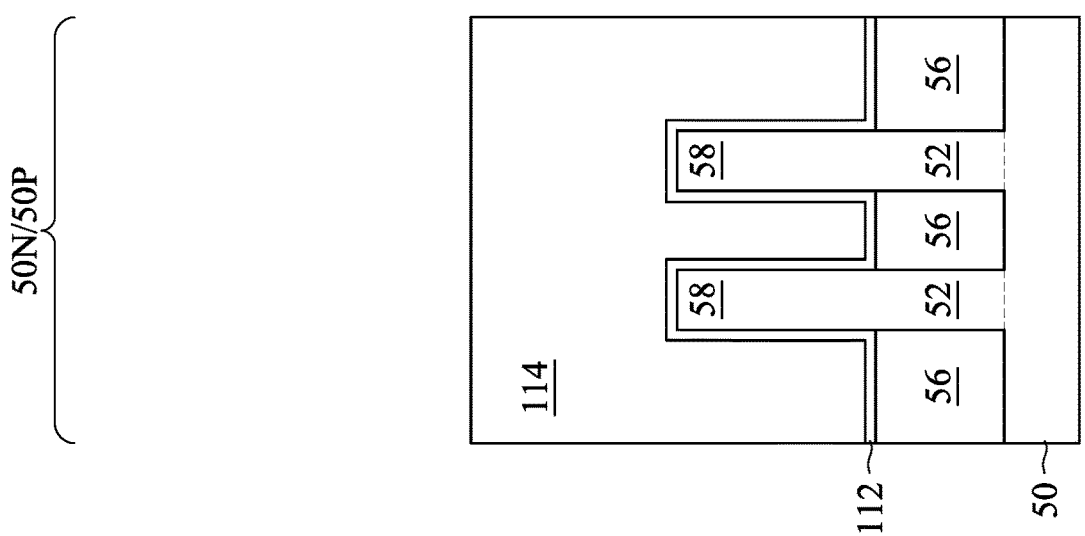

In FIGS. 11A-11C, gate dielectrics 112 and gate electrodes 114 are formed for replacement gate structures. Each pair of a gate dielectric 112 and a gate electrode 114 may be collectively referred to as a gate structure. Each gate structure extends along sidewalls and a top surface of a channel region 58 of a fin 52. The gate structures are also on the STI regions 56.

The gate dielectrics 112 include one or more gate dielectric layer(s) disposed on the top surfaces and the sidewalls of the fins 52, and on the sidewalls of the gate spacers 82. The gate dielectrics 112 may be formed of an oxide such as silicon oxide or a metal oxide, a silicate such as a metal silicate, combinations thereof, multi-layers thereof, or the like. Additionally, or alternatively, the gate dielectrics 112 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 112 may be formed by molecular-beam deposition (MBD), ALD, PECVD, or the like. Although a single-layered gate dielectrics 112 are illustrated, the gate dielectrics 112 may include any number of interfacial layers and any number of main layers. For example, the gate dielectrics 112 may include an interfacial layer and an overlying high-k dielectric layer.

The gate electrodes 114 include one or more gate electrode layer(s) disposed over the gate dielectrics 112. The gate electrodes 114 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 114 are illustrated, the gate electrodes 114 may include any number of work function tuning layers, any number of barrier layers, any number of glue layers, and a fill material.

As an example to form the gate structures, one or more gate dielectric layer(s) may be deposited in the recesses 96. The gate dielectric layer(s) may also be deposited on the top surfaces of the first ILD 94, the CESL 92, and the gate spacers 82. Subsequently, one or more gate electrode layer(s) may be deposited on the gate dielectric layer(s), and in the remaining portions of the recesses 96. A removal process may then be performed to remove the excess portions of the gate dielectric layer(s) and the gate electrode layer(s), which excess portions are over the top surfaces of the first ILD 94, the CESL 92, and the gate spacers 82. The gate dielectric layer(s), after the removal process, have portions left in the recesses 96 (thus forming the gate dielectrics 112). The gate electrode layer(s), after the removal process, have portions left in the recesses 96 (thus forming the gate electrodes 114). In some embodiments, a planarization process such as a chemical mechanical polish (CMP), an etch-back process, combinations thereof, or the like is utilized. After the planarization process, the top surfaces of the gate spacers 82, the CESL 92, the first ILD 94, and the gate structures (including the gate dielectrics 112 and the gate electrodes 114) are substantially coplanar (within process variations).

The formation of the gate dielectrics 112 in the n-type region 50N and the p-type region 50P may occur simultaneously such that the gate dielectrics 112 in each region are formed of the same material(s), and the formation of the gate electrodes 114 may occur simultaneously such that the gate electrodes 114 in each region are formed of the same material(s). In some embodiments, the gate dielectrics 112 in each region may be formed by distinct processes, such that the gate dielectrics 112 may include different materials and/or have a different number of layers, and/or the gate electrodes 114 in each region may be formed by distinct processes, such that the gate electrodes 114 may include different materials and/or have a different number of layers. Various masking steps may be used to mask and expose appropriate regions when using distinct processes.

Figure 12A:
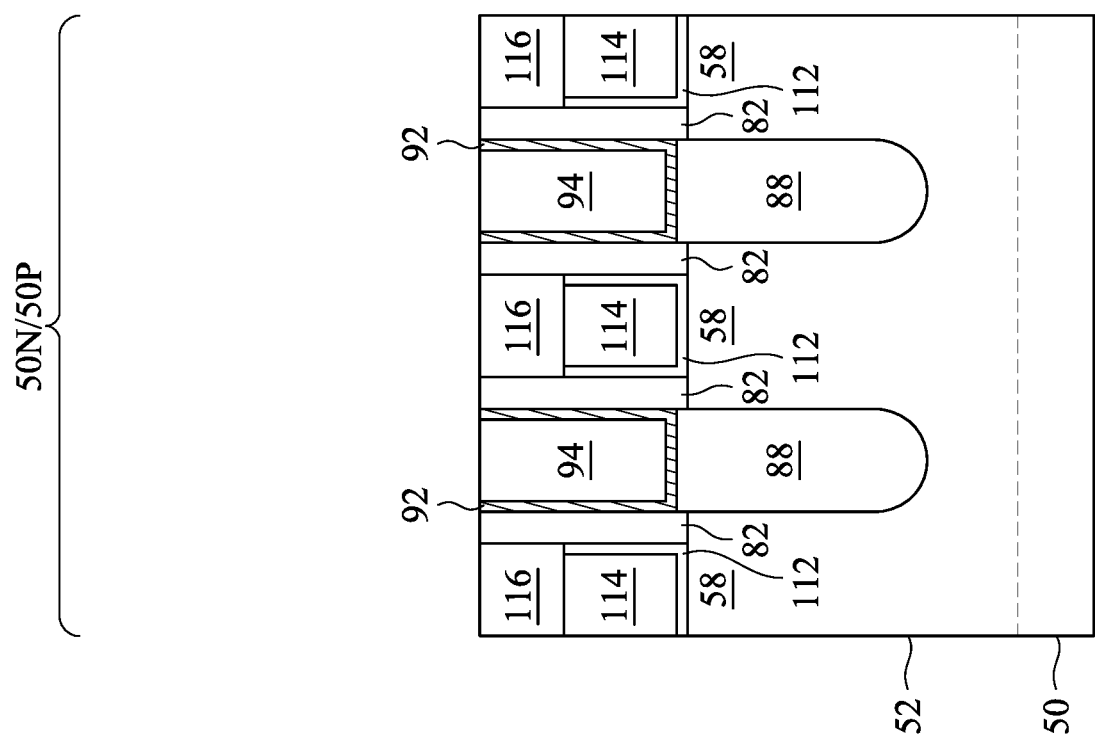
Figure 12C:
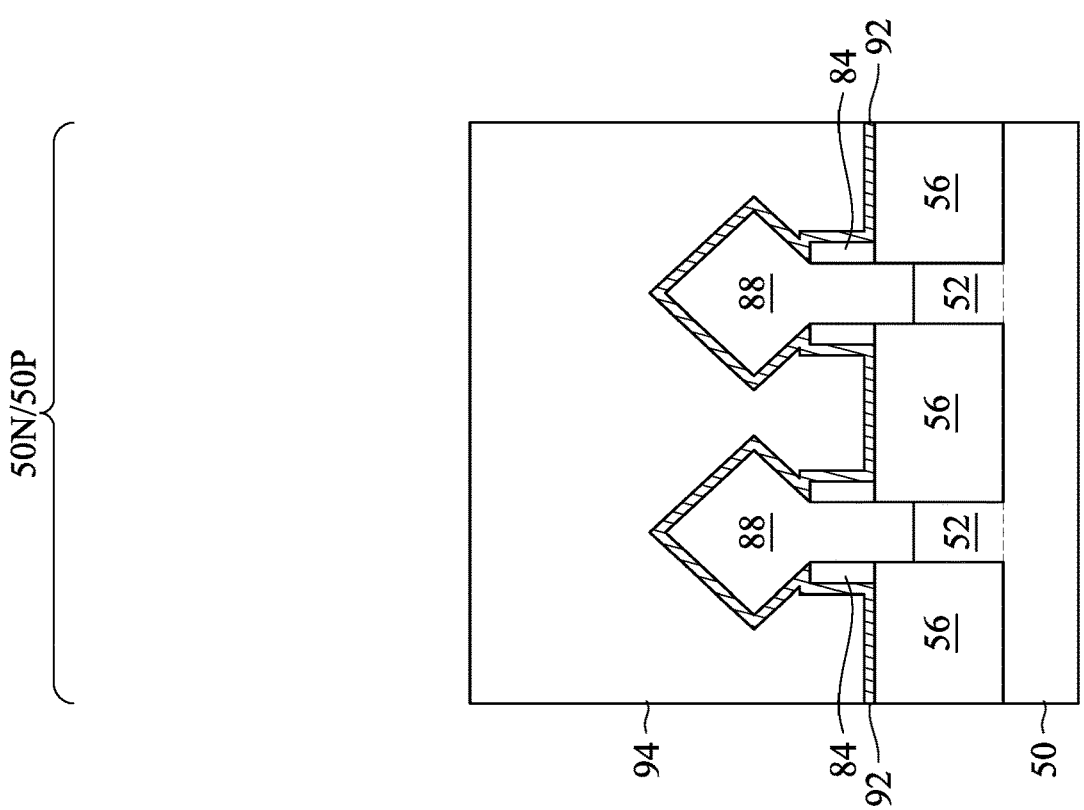
Figure 12B:
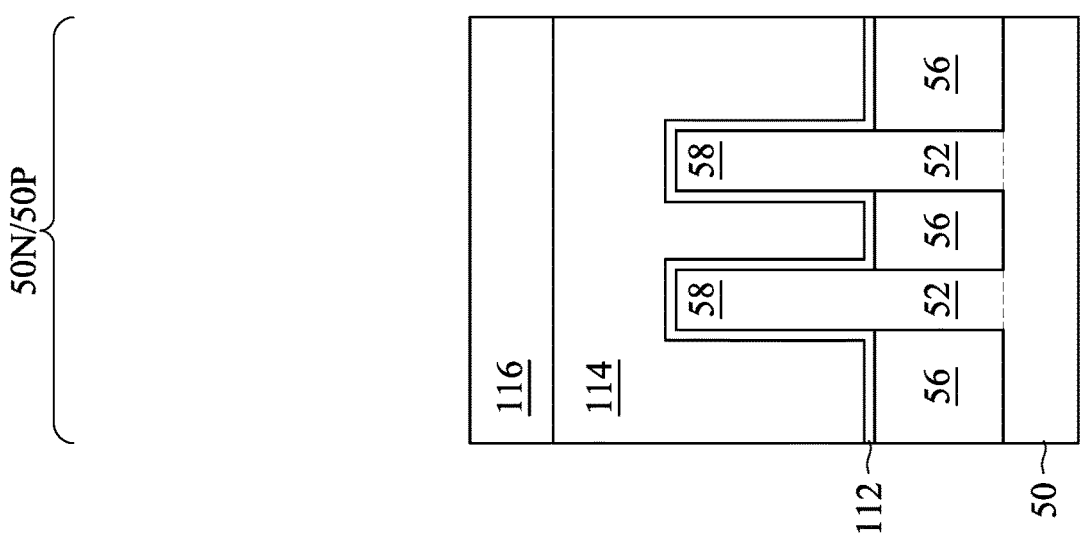

In FIGS. 12A-12C, gate masks 116 are formed over the gate structures (including the gate dielectrics 112 and the gate electrodes 114). In some embodiments, the gate masks 116 may also be formed over the gate spacers 82. Gate contacts will be subsequently formed to penetrate through the gate masks 116 to contact the top surfaces of the gate electrodes 114.

As an example to form the gate masks 116, the gate structures may be recessed using any acceptable etching process. In some embodiments (not separately illustrated), the gate spacers 82 are also recessed. One or more dielectric material(s) are then conformally deposited in the recesses. The dielectric material(s) may also be deposited on the top surfaces of the first ILD 94, the CESL 92, and the gate spacers 82. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), plasma-enhanced atomic layer deposition (PEALD), or the like. Other dielectric materials formed by any acceptable process may be used. A removal process is performed to remove the excess portions of the dielectric material(s), which excess portions are over the top surfaces of the first ILD 94, the CESL 92, and the gate spacers 82, thereby forming the gate masks 116. In some embodiments, a planarization process such as a chemical mechanical polish (CMP), an etch-back process, combinations thereof, or the like is utilized. The dielectric material(s), when planarized, have portions left in the recesses (thus forming the gate masks 116). After the planarization process, the top surfaces of the gate spacers 82, the CESL 92, the first ILD 94, and the gate masks 116 are substantially coplanar (within process variations).

Figure 13A:
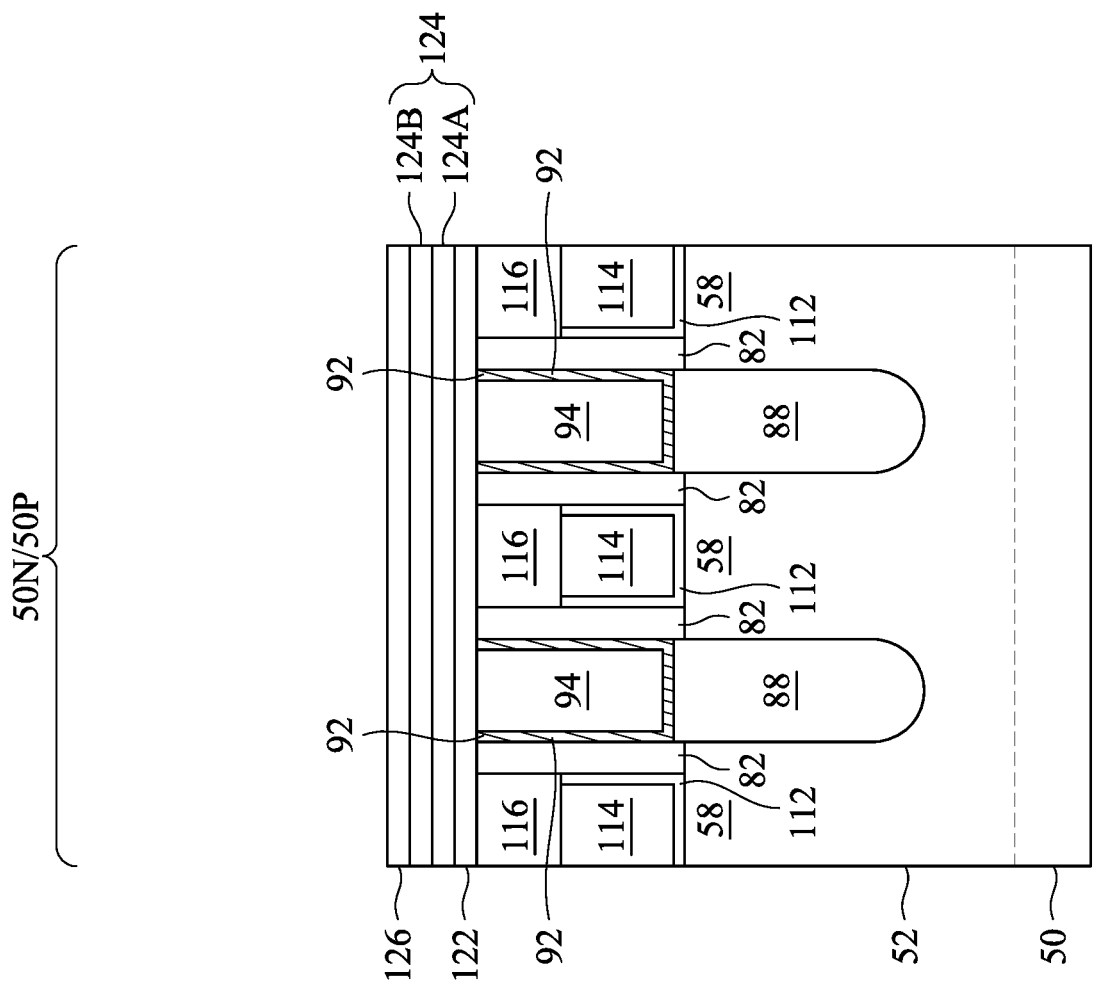
Figure 13C:
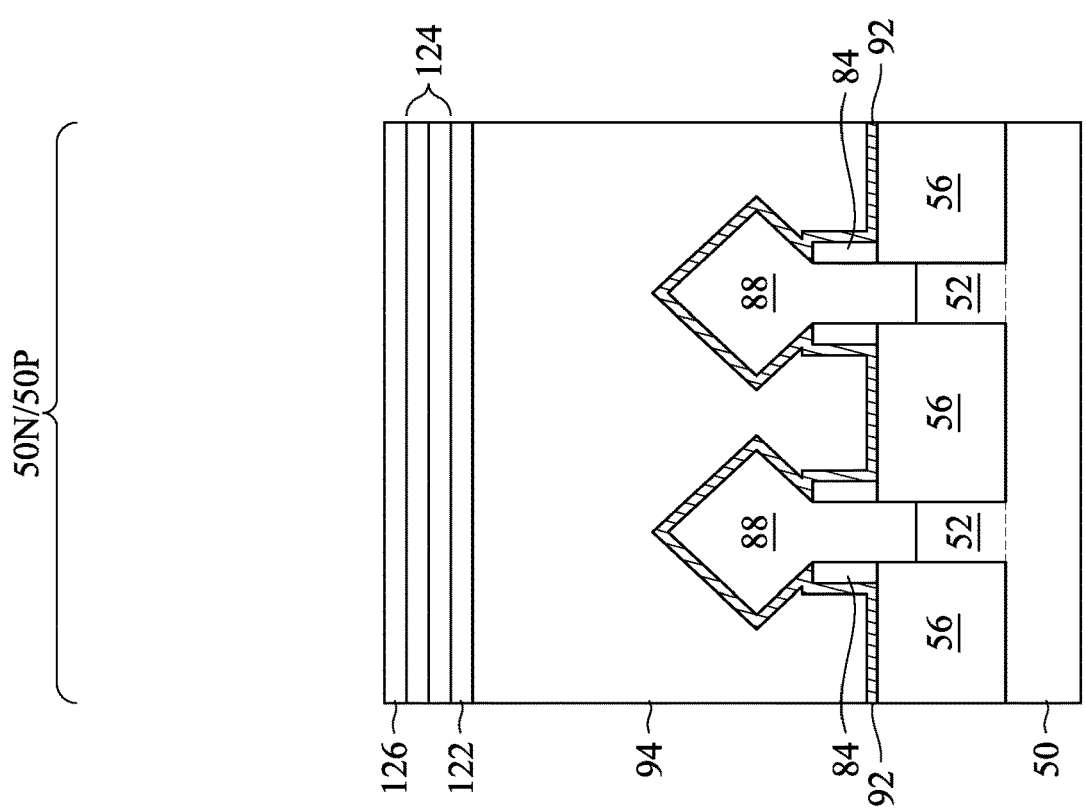
Figure 13B:
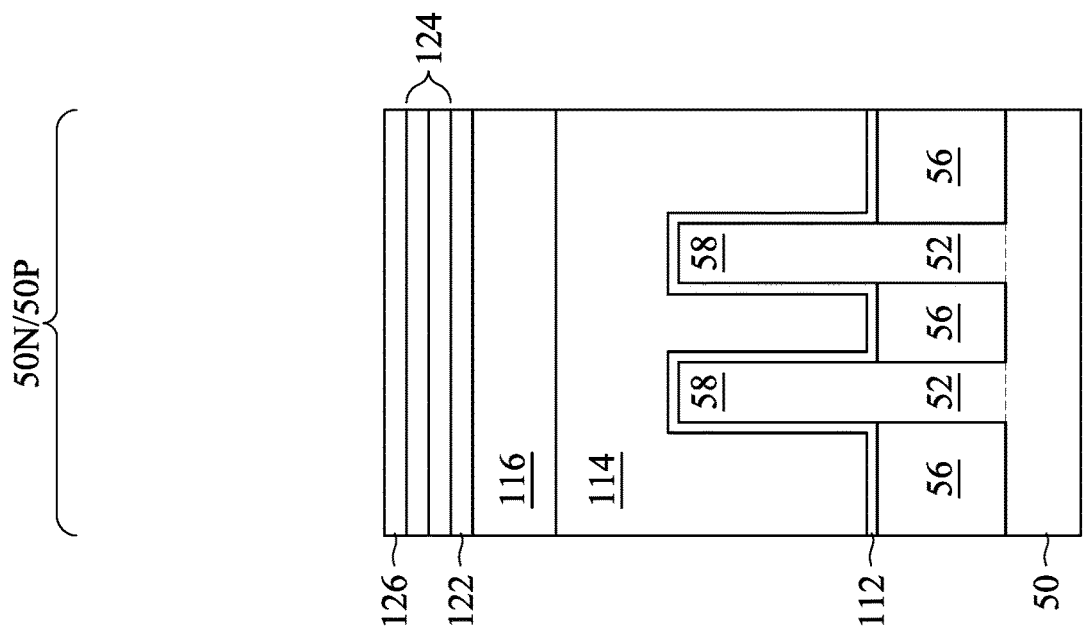

In FIGS. 13A-13C, one or more contact mask layer(s) 124 are formed over the gate spacers 82, the CESL 92, the first ILD 94, and the gate masks 116. The contact mask layer(s) 124 will be patterned to define where contact openings are subsequently formed through the first ILD 94. In some embodiments, the contact mask layer(s) 124 include a lower mask layer 124A and an upper mask layer 124B, with the upper mask layer 124B having a high etching selectivity from the etching of the lower mask layer 124A. The lower mask layer 124A may be formed of a metal such as tungsten carbide, titanium nitride, tantalum nitride, or the like, which may be formed by a deposition process such as PVD or the like. The upper mask layer 124B may be formed of a dielectric material such as silicon oxide or the like, which may be formed by a deposition process such as CVD, ALD, PEALD, or the like. Other acceptable materials formed by any acceptable process may be used.

In some embodiments, a pad layer 122 is formed between the contact mask layer(s) 124 and the gate spacers 82, the CESL 92, the first ILD 94, and the gate masks 116. The pad layer 122 may be formed of a dielectric material, such as an oxide, such as silicon oxide, aluminum oxide, or the like, which may be deposited by CVD, ALD, PEALD, or the like. In some embodiments, the pad layer 122 is a flowable film formed by a flowable CVD method. Additionally, an etch stop layer (not separately illustrated) may optionally be formed between the pad layer 122 and the gate spacers 82, the CESL 92, the first ILD 94, and the gate masks 116. The etch stop layer may include a dielectric material having a high etching selectivity from the etching of the pad layer 122, such as silicon nitride, silicon oxide, silicon oxynitride, or the like.

A cut mask layer 126 is formed on the contact mask layer(s) 124. The cut mask layer 126 will be patterned to define where cuts are located between subsequently formed contact openings, e.g., where the first ILD 94 will not be patterned such that the subsequently formed contact openings are separated. The cut mask layer 126 may be formed of an inorganic material, such as silicon or the like, which may be formed by CVD, ALD, or the like.

Figure 14A:
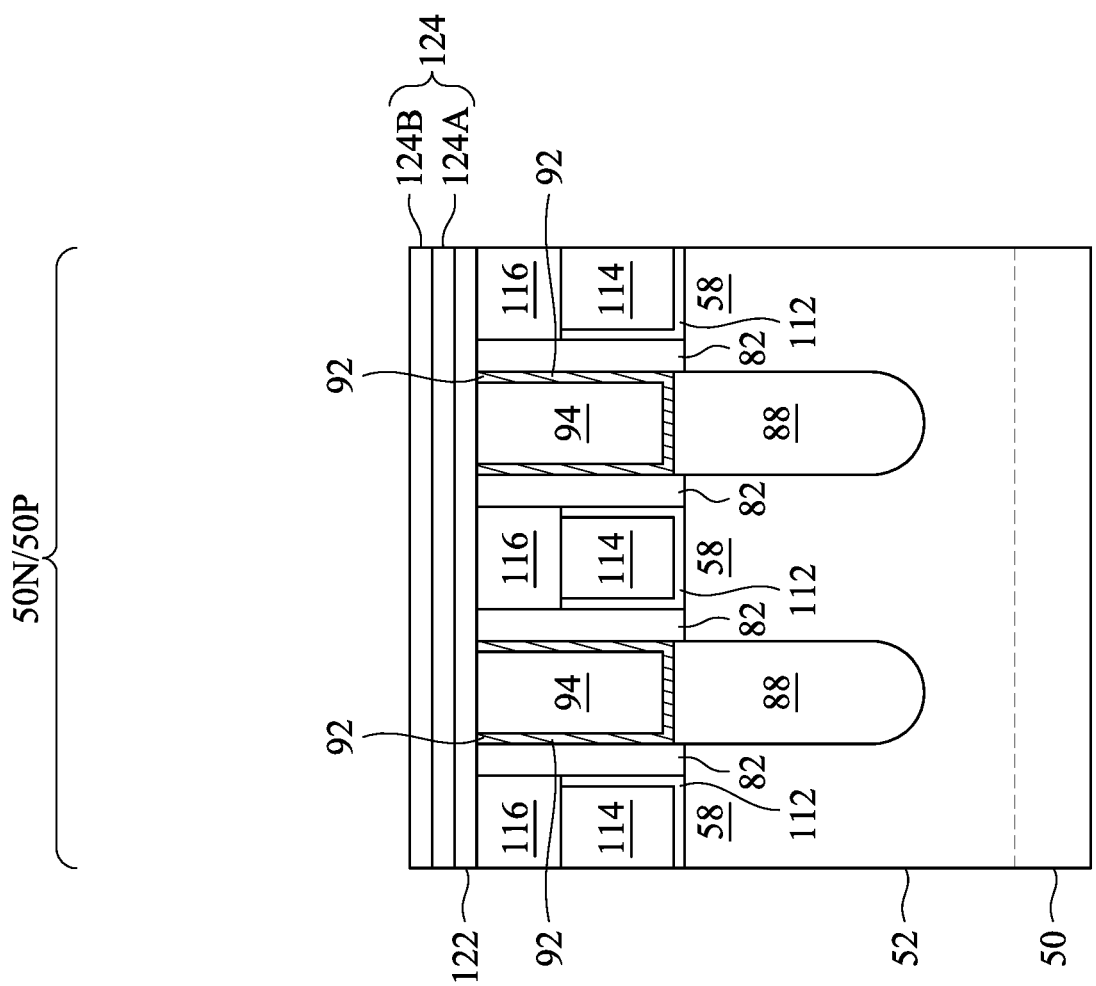
Figure 14C:
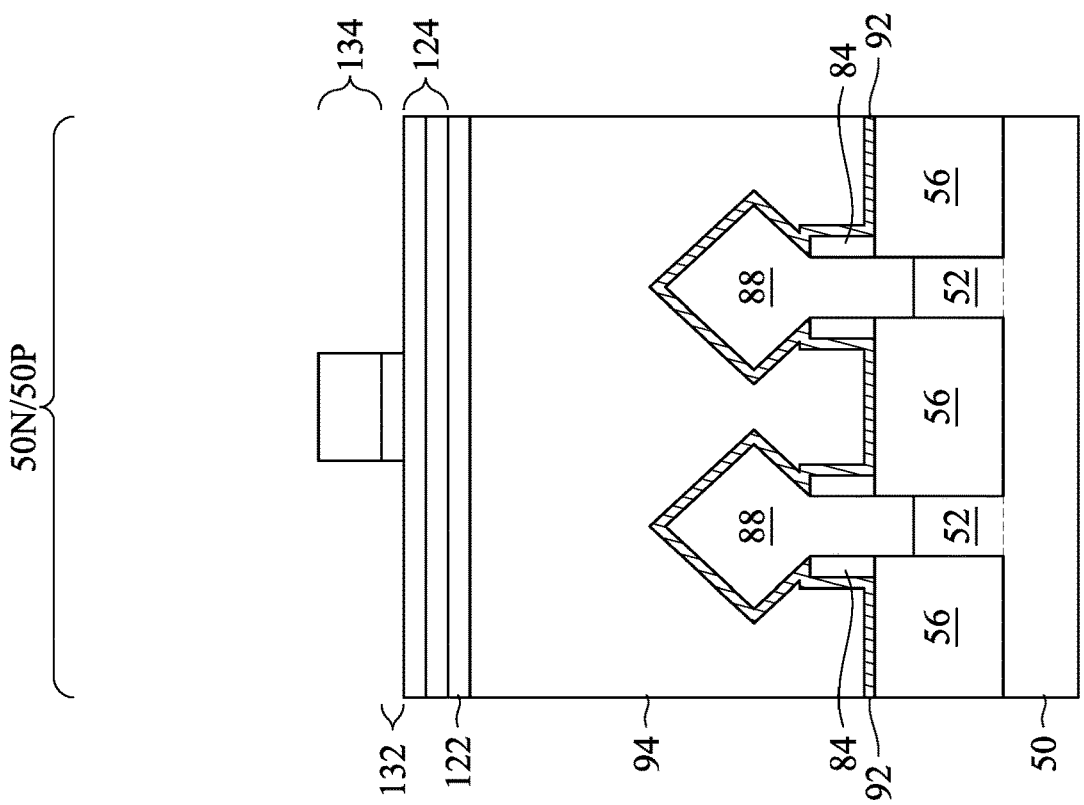
Figure 14B:
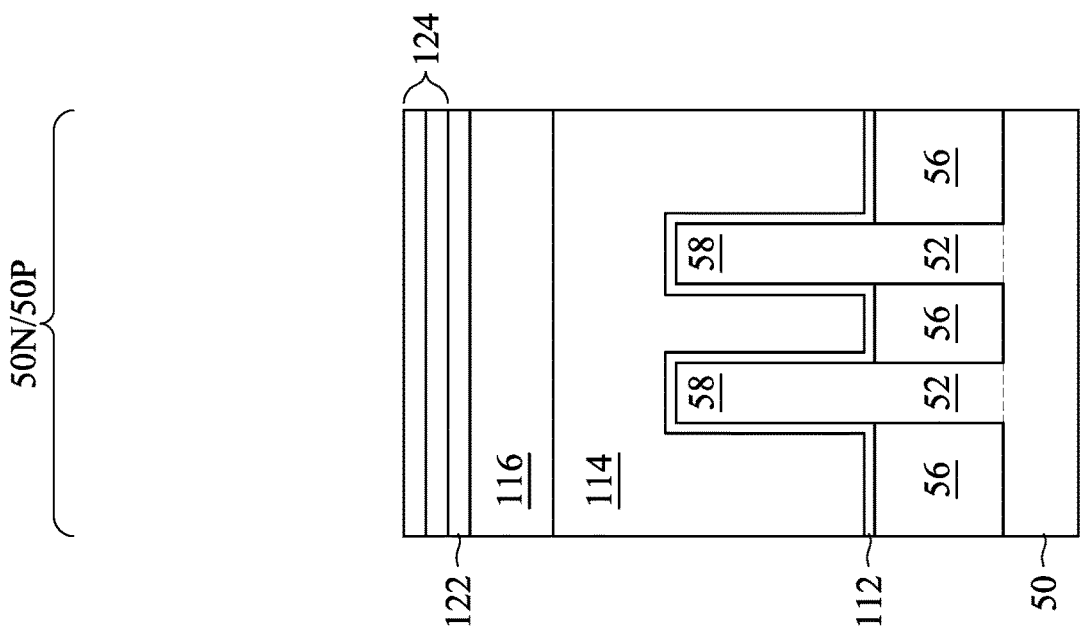

In FIGS. 14A-14C, the cut mask layer 126 is patterned using acceptable photolithography and etching techniques to form a cut mask 132. For example, an anisotropic dry etch can be performed using a photoresist 134 as an etching mask. The photoresist 134 may be a single layer photoresist, a bi-layer photoresist, a tri-layer photoresist, or the like. In some embodiments, the photoresist 134 is a tri-layer photoresist comprising a bottom layer (e.g., a bottom anti-reflective coating), a middle layer (e.g., a nitride, an oxide, an oxynitride, or the like), and a top layer (e.g., a photosensitive material). The photoresist 134 (and thus the cut mask 132) has a pattern of where the subsequently formed contact openings will be separated. After the cut mask 132 is formed, the photoresist 134 may be removed, such as by an acceptable ashing process.

Figure 15A:
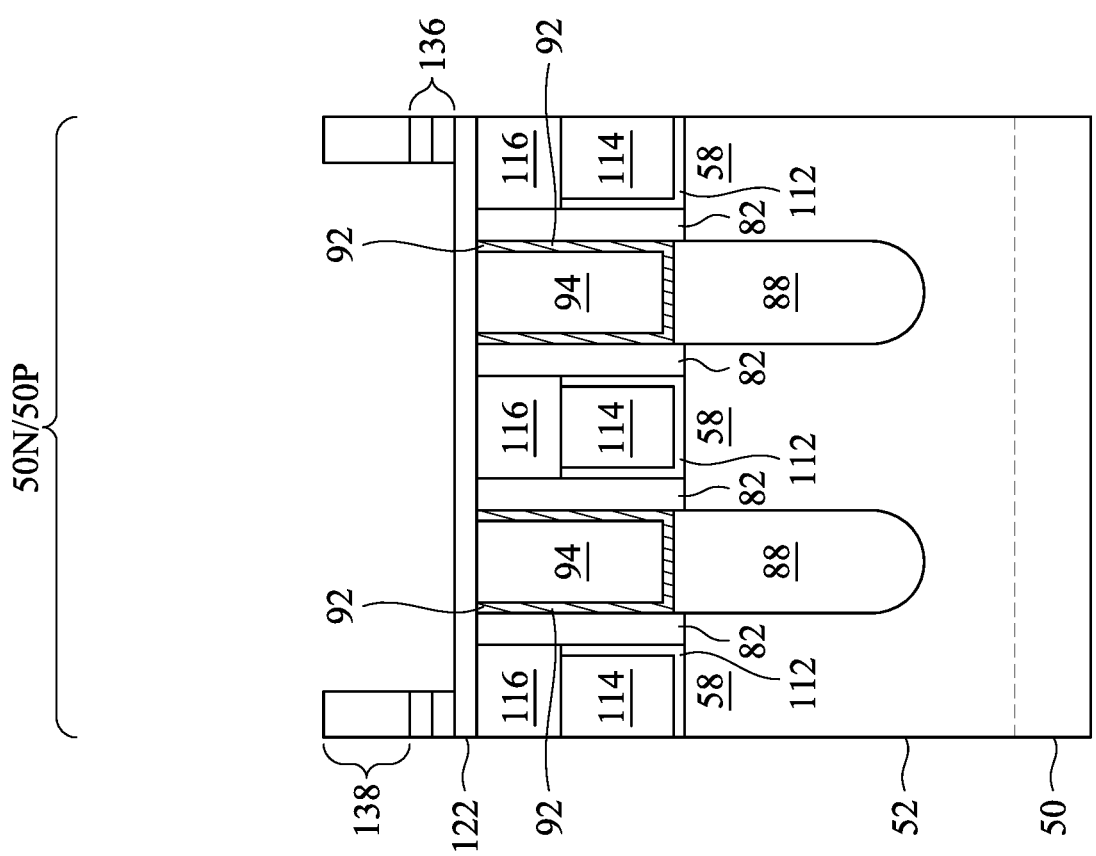
Figure 15C:
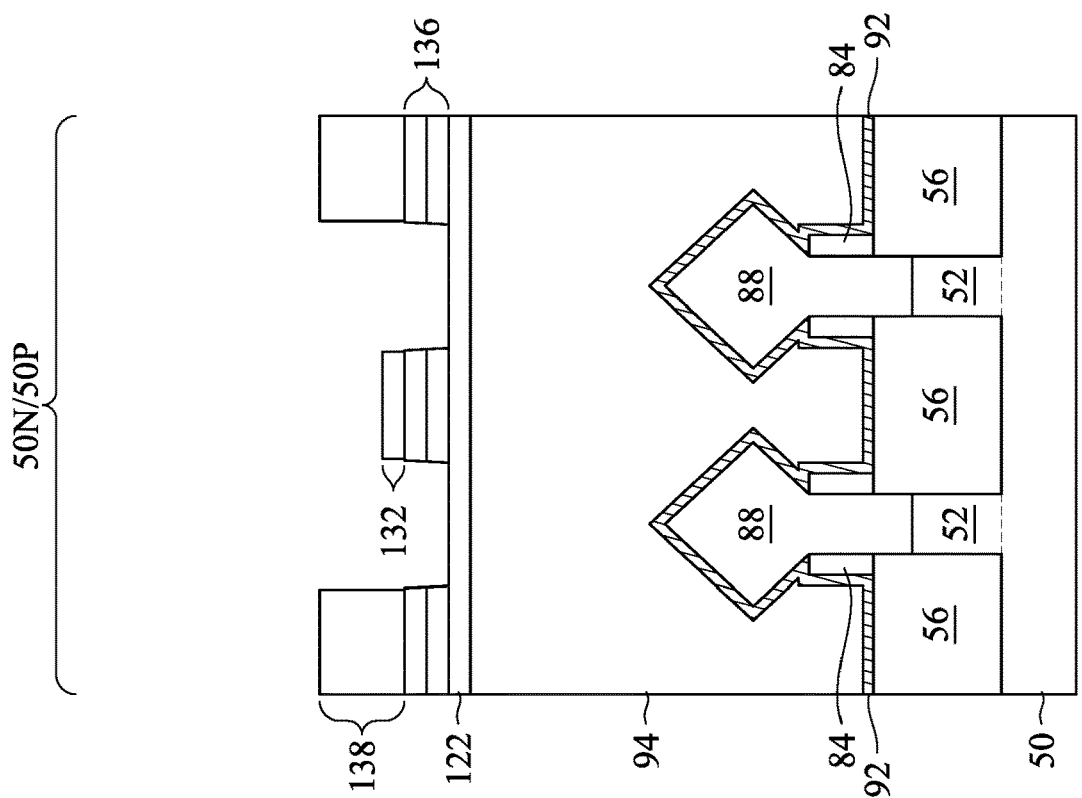
Figure 15B:
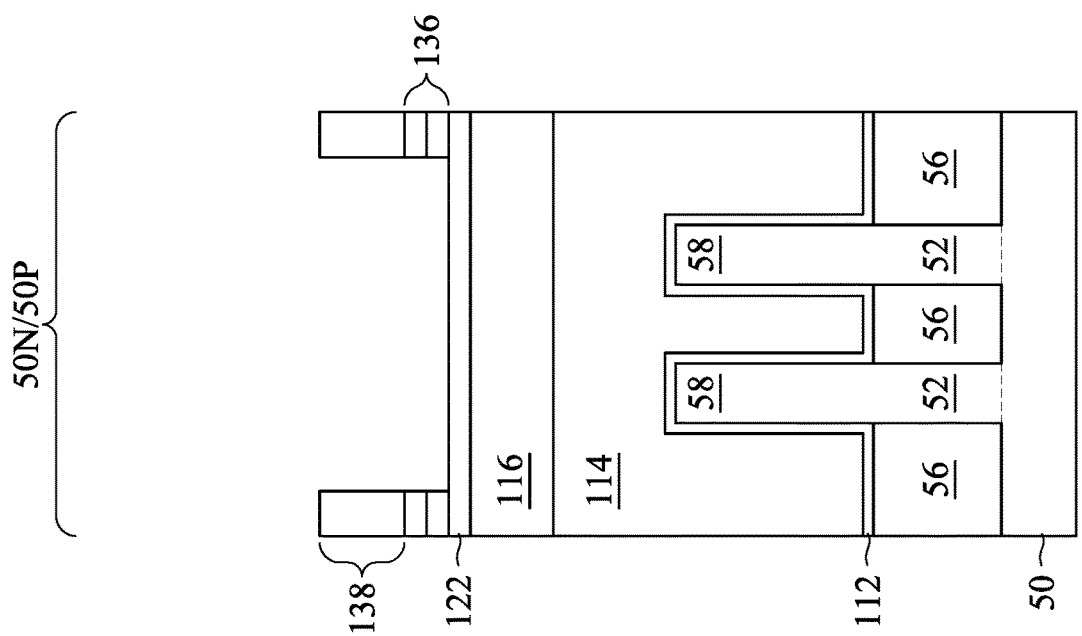

In FIGS. 15A-15C, the contact mask layer(s) 124 is patterned using acceptable photolithography and etching techniques to form a contact mask 136. For example, an anisotropic dry etch can be performed using the cut mask 132 and a photoresist 138 as a combined etching mask. The photoresist 138 may be a single layer photoresist, a bi-layer photoresist, a tri-layer photoresist, or the like. In some embodiments, the photoresist 138 is a tri-layer photoresist comprising a bottom layer (e.g., a bottom anti-reflective coating), a middle layer (e.g., a nitride, an oxide, an oxynitride, or the like), and a top layer (e.g., a photosensitive material). Collectively, the photoresist 138 and the cut mask 132 (and thus the contact mask 136) have a pattern of where the subsequently formed contact openings will be located. After the contact mask 136 is formed, the cut mask 132 and/or the photoresist 138 may be removed, such as by an acceptable ashing process, an acceptable etching process, combinations thereof, or the like.

Figure 16A:
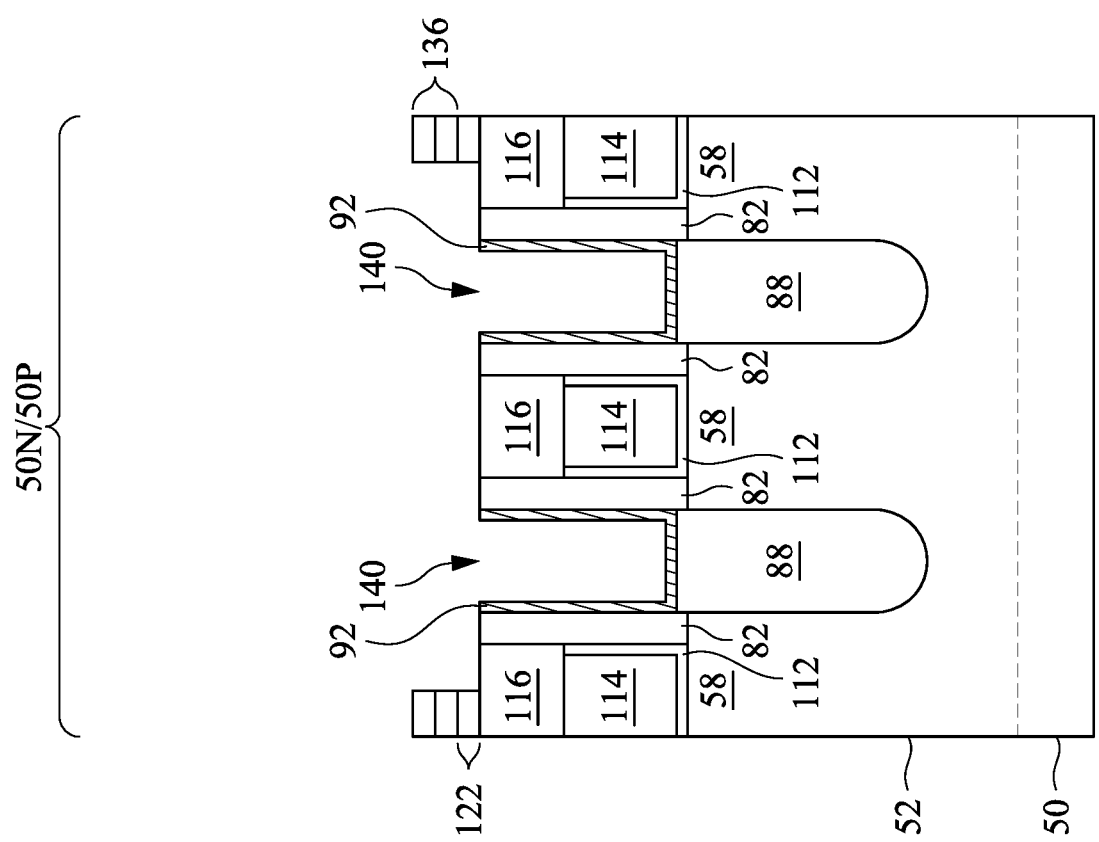
Figure 16C:
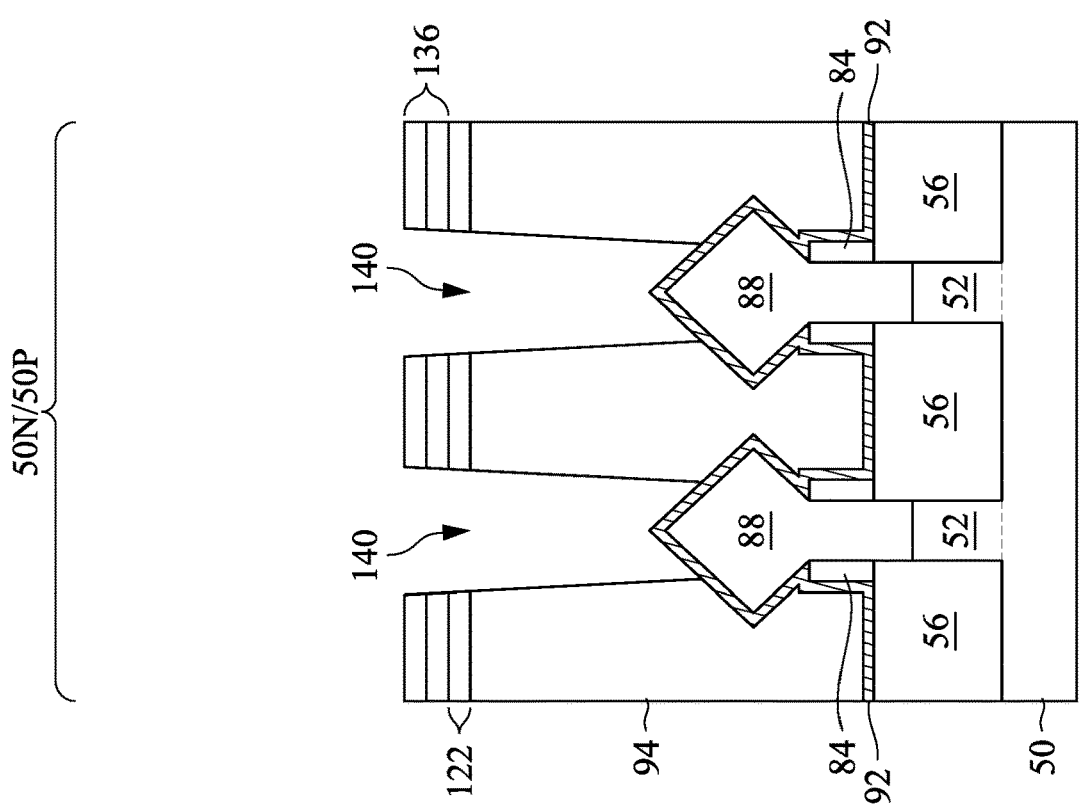
Figure 16B:
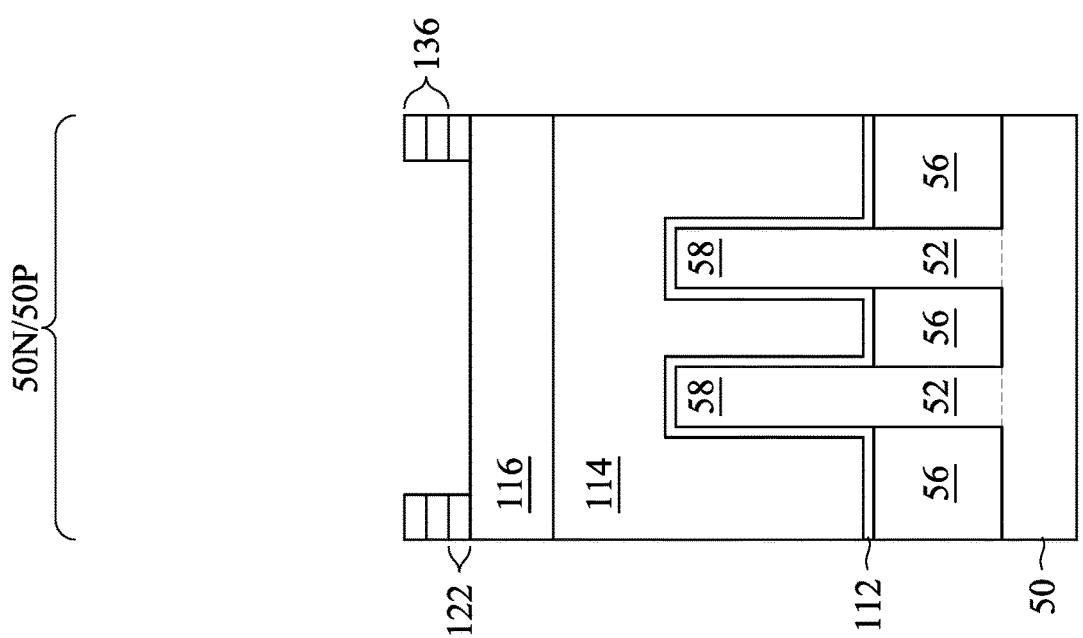

In FIGS. 16A-16C, contact openings 140 are formed through the first ILD 94. The contact openings 140 may be formed using acceptable etching techniques. The contact mask 136 is used as an etching mask. The pattern of the contact mask 136 is transferred to the pad layer 122 (if present) and/or to the first ILD 94. In the illustrated embodiment, the etching process for forming the contact openings 140 is a self-aligned contact (SAC) etching process, in which the gate spacers 82 and the gate masks 116 are exposed to etchants during the etching of the contact openings 140. The etching may include any acceptable etching process, such as one that is selective to the material of the first ILD 94 (e.g., selectively etches the material of the first ILD 94 at a faster rate than the material(s) of the gate spacers 82, the CESL 92, and the gate masks 116). The etching process may be anisotropic. The CESL 92 stops the etching of the contact openings 140. Accordingly, the contact openings 140 expose the CESL 92, and the CESL 92 still covers the epitaxial source/drain regions 88.

Figure 17A:
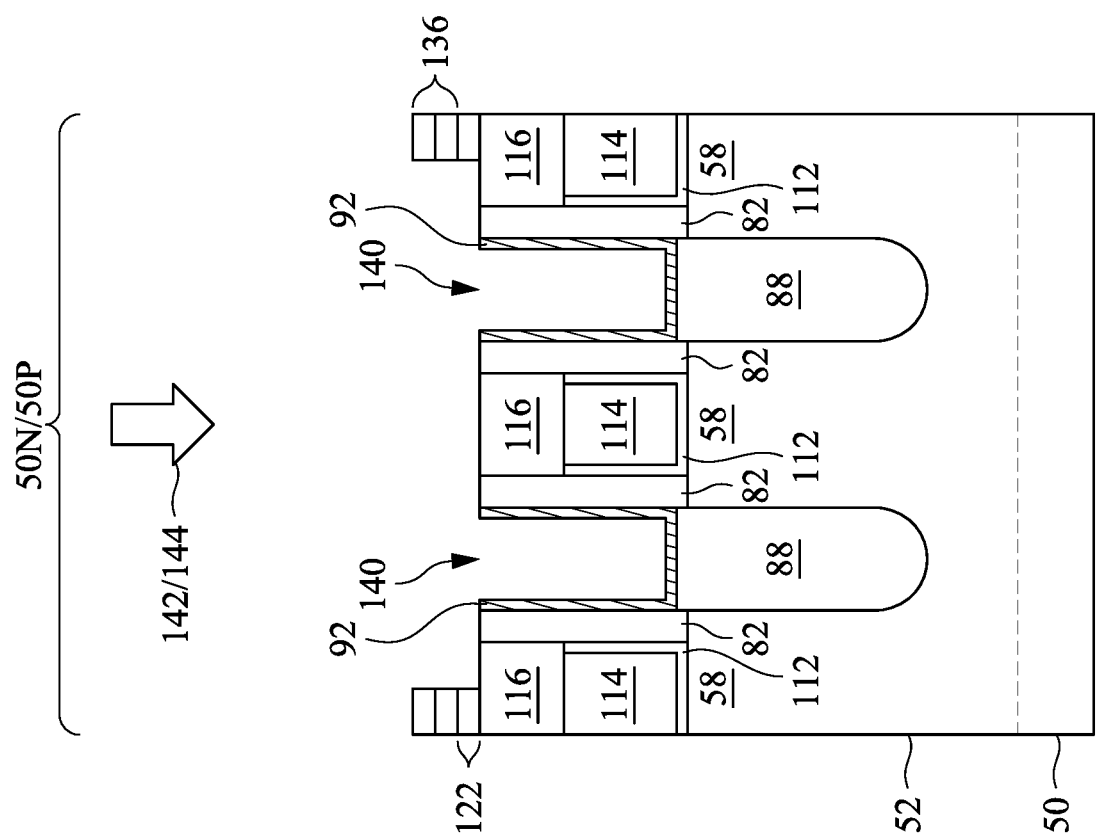
Figure 17C:
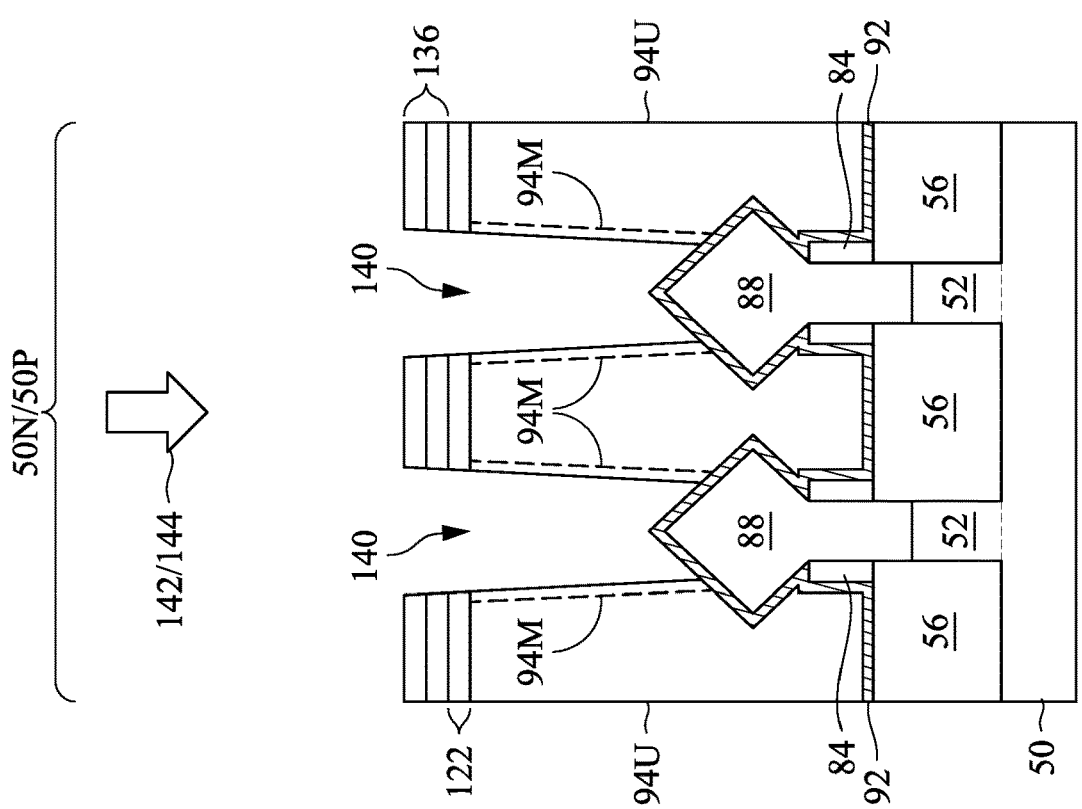
Figure 17B:
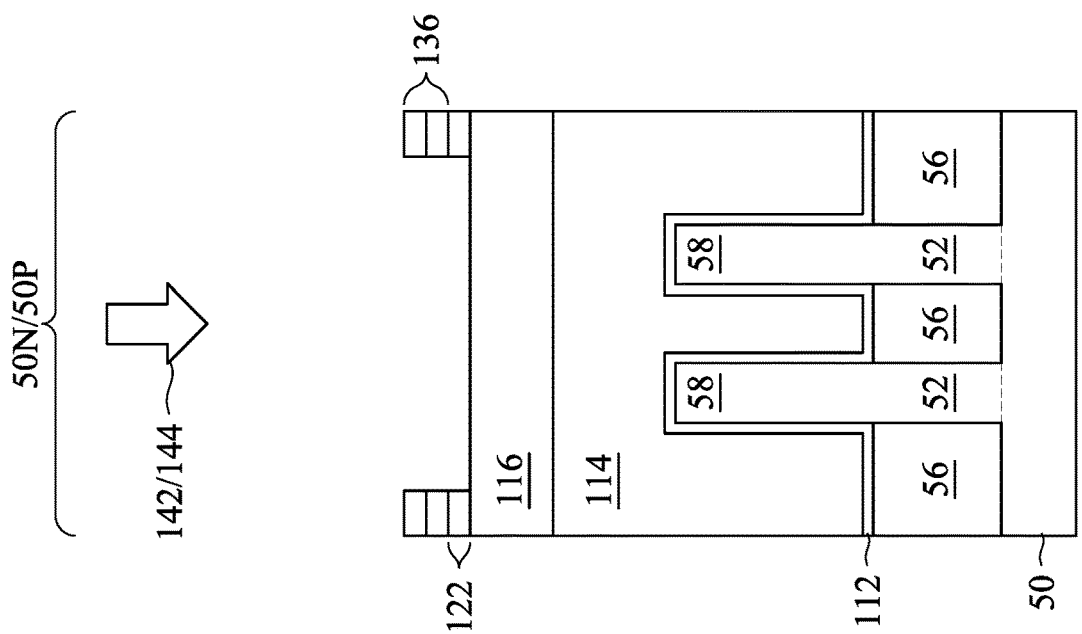

In FIGS. 17A-17C, a treatment process 142 is performed in the contact openings 140. After the treatment process 142, a cleaning process 144 is performed in the contact openings 140. The cleaning process 144 may be performed before the contact openings 140 are extended through the CESL 92 (subsequently described).

The treatment process 142 modifies an etch rate of treated regions of the first ILD 94. Specifically, the treatment process 142 modifies regions 94M of the first ILD 94 around the contact openings 140, with unmodified regions 94U of the first ILD 94 being unaffected by the treatment process 142 (or at least less affected than the modified ILD regions 94M). As described in greater detail, the cleaning process 144 will be performed to clean residue of the first ILD 94 from the contact openings 140 before extending the contact openings 140 through the CESL 92. The cleaning process 144 includes an etching process. The modified ILD regions 94M have a decreased etch rate relative the etch used in the cleaning process 144. Therefore, the modified ILD regions 94M have an increased etch selectivity as compared to the unmodified ILD regions 94U, relative the etch used in the cleaning process 144. In some embodiments, the treatment process 142 reduces the etching of the modified ILD regions 94M during the cleaning process 144 by an amount in the range of 60% to 98%. Damage to the first ILD 94 during the cleaning process 144, such as damage caused by etchants used in the cleaning process 144, may thus be reduced.

Depending on the type of deposition processes utilized to form the first ILD 94, it may contain one or more impurities capable of reacting with etchants that will be utilized in the cleaning process 144. The impurities may include hydrogen, carbon, or the like. For example, the first ILD 94 may contain hydrogen impurities when it is formed of silicon oxide by FCVD, and hydrogen impurities may react with fluorine-based etchants, which may be used in the cleaning process 144. The treatment process 142 decreases the etch rate of the modified ILD regions 94M to less than the etch rate of the unmodified ILD regions 94U, relative the etch used in the cleaning process 144, by reducing the concentration of those impurities in the modified ILD regions 94M. In some embodiments, the impurities are hydrogen, the first ILD 94 has a hydrogen impurity concentration in the range of 5% to 10% before the treatment process 142, and the treatment process 142 reduces the hydrogen impurity concentration of the modified ILD regions 94M by 2% to 10% as compared to the unmodified ILD regions 94U, such that the modified ILD regions 94M have a hydrogen impurity concentration of less than 5%. The impurities may (or may not) be eliminated from the modified ILD regions 94M, but in either case, the modified ILD regions 94M have a lesser concentration of the impurities than the unmodified ILD regions 94U. When the impurities are eliminated from the modified ILD regions 94M, the impurity concentration of the modified ILD regions 94M is zero. When the impurities are not eliminated from the modified ILD regions 94M, the impurity concentration of the modified ILD regions 94M is non-zero. Reducing the concentration of impurities may increase the density of the modified ILD regions 94M, depending on the type of the impurities removed. In some embodiments where the impurities include hydrogen, the treatment process 142 increases the density of the modified ILD regions 94M by 2% to 10% as compared to the unmodified ILD regions 94U, such that the modified ILD regions 94M have a density in the range of 2.25 g/cm$^3$ to 2.3 g/cm$^3$.

The unmodified ILD regions 94U remain unmodified or less modified by the treatment process 142, as compared to the modified ILD regions 94M. In some embodiments, the unmodified ILD regions 94U retain their initial composition, such that the final composition of the unmodified ILD regions 94U after the treatment process 142 is the same as the initial composition of the unmodified ILD regions 94U before the treatment process 142. In some embodiments, the unmodified ILD regions 94U are modified by the treatment process 142, but are less modified than the modified ILD regions 94M, such that the final composition of the unmodified ILD regions 94U is closer to the initial composition of the unmodified ILD regions 94U than to the final composition of the modified ILD regions 94M.

In some embodiments, the treatment process 142 includes a nitridation process. The nitridation process increases the nitrogen concentration of the modified ILD regions 94M. In some embodiments, the first ILD 94 has a nitrogen concentration in the range of 0% to 5% before the treatment process 142, and the treatment process 142 increases the nitrogen concentration of the modified ILD regions 94M by 2% to 10% as compared to the unmodified ILD regions 94U, such that the modified ILD regions 94M have a nitrogen concentration in the range of 5% to 25%. If the final nitrogen concentration is greater than 25%, the insulating ability of the first ILD 94 may be poor. If the final nitrogen concentration is less than 5%, too much etching of the modified ILD regions 94M may occur in the cleaning process 144.

In some embodiments, the nitridation process is a nitrogen radical treatment process, in which the modified ILD regions 94M are reacted with nitrogen free radicals. The modified ILD regions 94M may also be bombarded with nitrogen cations (e.g., positively charged nitrogen ions) during the nitrogen radical treatment process. The nitrogen radical treatment process may be performed in a chamber. A gas source is dispensed in the chamber. The gas source includes a nitrogen-containing gas and a carrier gas. The nitrogen-containing gas may include ammonia (NH$_3$), nitrogen gas (N$_2$), or the like. The carrier gas may be an inert gas such as Ar, He, Xe, Ne, Kr, Rn, the like, or combinations thereof. Optionally, hydrogen gas (H$_2$) may also be included in the gas source. A plasma is generated from the gas source. The plasma may be generated by a plasma generator such as an inductively coupled plasma system, a capacitively coupled plasma system, a microwave plasma generator, or the like. The plasma generator generates radio frequency power that produces a plasma from the gas source by exciting the gas source to a plasma state. In some embodiments, plasma generation power is pulsed between a low power (e.g., substantially zero watts) and a high power. The nitrogen radical treatment process may be performed using a plasma generation power having a high power in the range of 50 watts to 2000 watts. When the plasma is generated, nitrogen free radicals and corresponding ions are generated, and the portions of the first ILD 94 around the contact openings 140 are reacted with the nitrogen free radicals and/or bombarded with nitrogen cations. Reacting the modified ILD regions 94M with nitrogen free radicals and/or bombarding the modified ILD regions 94M with the nitrogen cations breaks bonds with the impurities (e.g., hydrogen) in the modified ILD regions 94M to create open bonds of silicon atoms and produce impurity byproducts, which can be evacuated from the chamber. The nitrogen readily bonds with the open bonds of silicon atoms, thereby nitrating the modified ILD regions 94M. The modified ILD regions 94M are reacted with the nitrogen free radicals and/or bombarded with the nitrogen cations until the modified ILD regions 94M have been nitrated by a desired amount. In some embodiments, the modified ILD regions 94M are reacted with the nitrogen free radicals and/or bombarded with the nitrogen cations at a temperature in the range of −40° C. to 140° C., at a pressure in the range of 3 mTorr to 500 mTorr, and for a duration in the range of 1 second to 200 seconds. If the plasma generation power, temperature, duration, or pressure of the nitrogen radical treatment process is greater than the previously described values, the final nitrogen concentration may be too large. If the plasma generation power, temperature, duration, or pressure of the nitrogen radical treatment process is less than the previously described values, the final nitrogen concentration may be too small.

In some embodiments, the nitridation process is a nitrogen soak process, in which the modified ILD regions 94M are soaked in a nitrogen-containing gas without generating a plasma. The nitrogen soak process may be performed in a chamber. A gas source is dispensed in the chamber. The gas source includes the nitrogen-containing gas and a carrier gas. The nitrogen-containing gas may include ammonia ($NH_3$), nitrogen gas ($N_2$), or the like. The carrier gas may be an inert gas such as Ar, He, Xe, Ne, Kr, Rn, the like, or combinations thereof. The nitrogen in the nitrogen-containing gas breaks bonds with the impurities (e.g., hydrogen) in the modified ILD regions 94M to create open bonds of silicon atoms and produce impurity byproducts, which can be evacuated from the chamber. The nitrogen readily bonds with the open bonds of silicon atoms, thereby nitrating the modified ILD regions 94M. The modified ILD regions 94M are soaked in the nitrogen-containing gas until the modified ILD regions 94M have been nitrated by a desired amount. In some embodiments, the modified ILD regions 94M are soaked in the nitrogen-containing gas at a temperature in the range of 20° C. to 140° C., at a pressure in the range of 3 mTorr to 200 mTorr, and for a duration in the range of 1 second to 200 seconds. If the temperature, duration, or pressure of the nitrogen soak process is greater than the previously described values, the final nitrogen concentration may be too large. If the temperature, duration, or pressure of the nitrogen soak process is less than the previously described values, the final nitrogen concentration may be too small.

In some embodiments, the treatment process 142 includes an ultraviolet curing process, in which the modified ILD regions 94M are exposed to ultraviolet light. The ultraviolet curing process may be performed in a chamber. A gas source is dispensed in the chamber. The gas source may include Ar, He, $H_2$, the like, or combinations thereof. A plasma is generated from the gas source. The plasma may be generated by a plasma generator such as an inductively coupled plasma system, a capacitively coupled plasma system, a microwave plasma generator, or the like. The plasma generator generates radio frequency power that produces a plasma from the gas source by exciting the gas source to a plasma state. The plasma emits the ultraviolet light. In some embodiments, the ultraviolet light has a wavelength in the range of 150 nm to 386 nm. The ultraviolet light breaks the bonds (e.g., Si—H bonds) between the impurities and silicon atoms of the modified ILD regions 94M, allowing the impurities to be outgassed, and thereby removing the impurities from the modified ILD regions 94M. The wavelength of the ultraviolet light is selected based on the impurities that are to be removed from the modified ILD regions 94M. Specifically, the wavelength of the ultraviolet light is small enough to generate energy greater than the dissociation energy of the impurities. For example, when the impurities include hydrogen bonded to silicon, the wavelength of the ultraviolet light is less than or equal to 376 nm, which generates energy greater than the dissociation energy of Si—H bonds, 3.3 eV. Similarly, when the impurities include hydrogen bonded to oxygen, the wavelength of the ultraviolet light is less than or equal to 259 nm, which generates energy greater than the dissociation energy of O—H bonds, 4.8 eV. In some embodiments, the ultraviolet curing process is performed for a duration in the range of 5 seconds to 200 seconds. If the duration of the ultraviolet curing process is greater than this duration, manufacturing costs may be too large. If the duration of the ultraviolet curing process is less than this duration, too much etching of the modified ILD regions 94M may occur in the cleaning process 144.

The treatment process 142 may include a combination of the previously described process(es). In some embodiments, the treatment process 142 includes a nitrogen radical treatment process and an ultraviolet curing process. For example, a nitrogen radical treatment process may be performed such that when a plasma is generated, nitrogen free radicals, nitrogen cations, and ultraviolet light of a desired wavelength are each generated.

In some embodiments, the treatment process 142 is performed in-situ with the etching of the contact openings 140. For example, the chamber utilized for the treatment process 142 may be the same etch chamber utilized when etching the contact openings 140. In some embodiments, the treatment process 142 is performed ex-situ with the etching of the contact openings 140. For example, the chamber utilized for the treatment process 142 may be different from the etch chamber utilized when etching the contact openings 140.

The cleaning process 144 cleans residue of the first ILD 94 from the contact openings 140. The cleaning process 144 may include an acceptable etching process. In some embodiments, the cleaning process 144 includes a wet or dry etch using a fluorine-based etchant. For example, the etch can be a dry etch such as a reactive ion etch (RIE), performed using one or more reaction gas(es) such as fluoromethane ($CH_3F$) or the like. As a result of performing the treatment process 142, the modified ILD regions 94M have a decreased concentration of impurities that the cleaning process 144 (e.g., the etching process) is selective to. Accordingly, the modified ILD regions 94M have a decreased etch rate relative the etchant(s) used in the cleaning process 144. Damage to the first ILD 94 during the cleaning process 144 may thus be reduced.

Figure 18A:
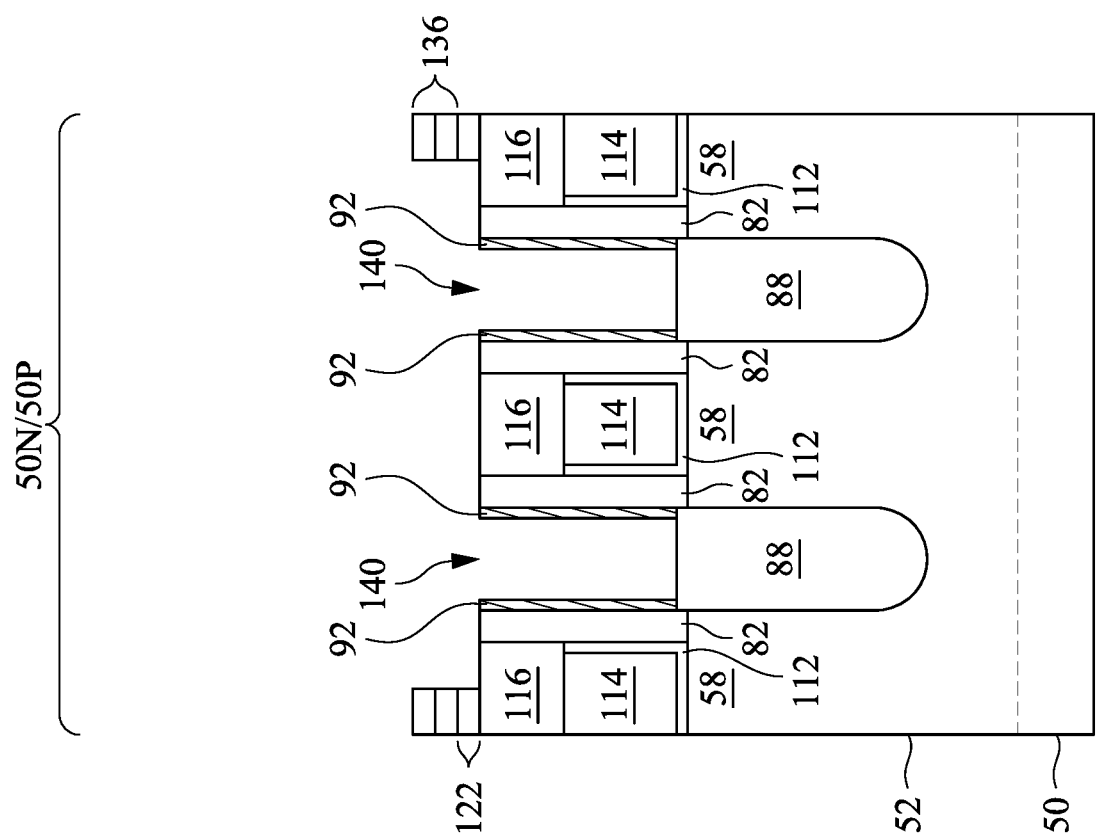
Figure 18C:
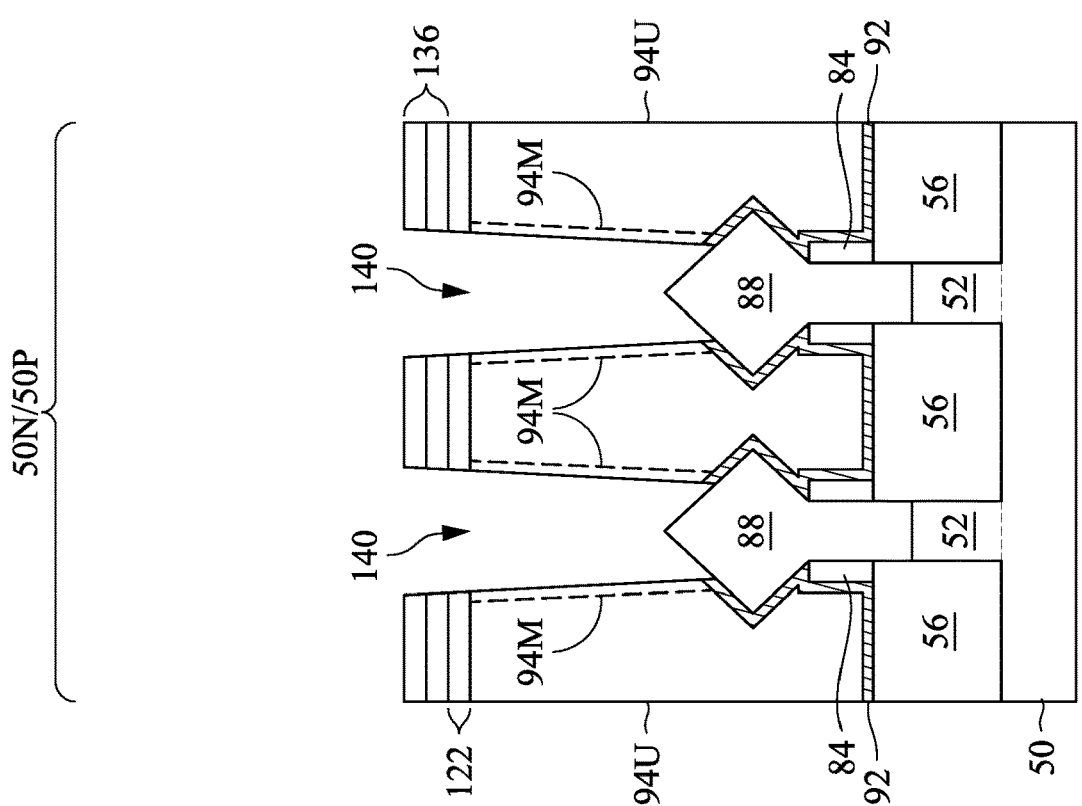
Figure 18B:
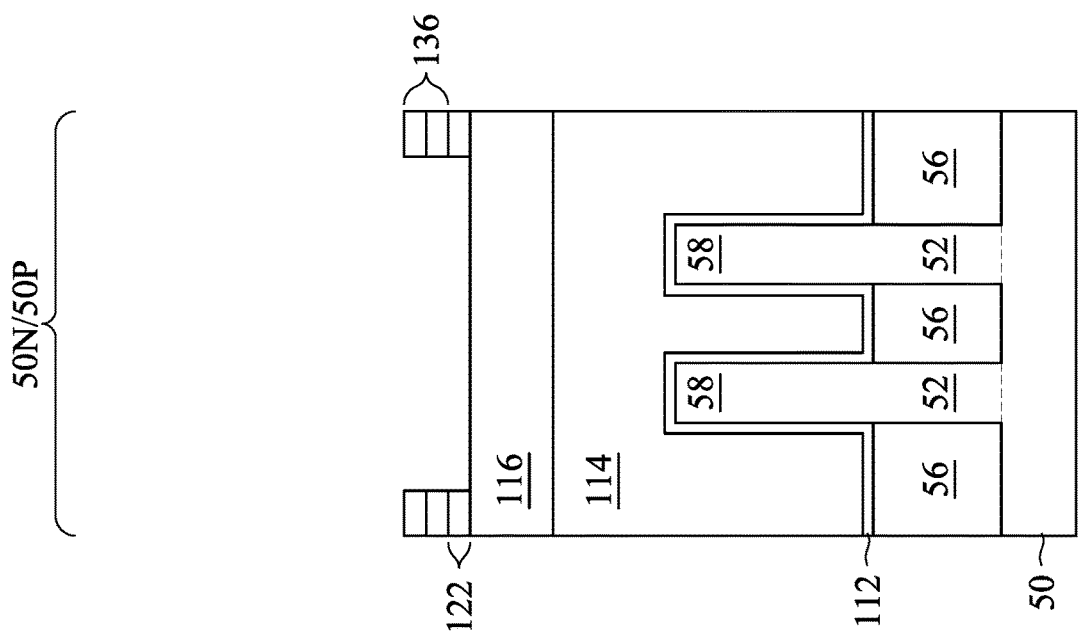
Figure 19A:
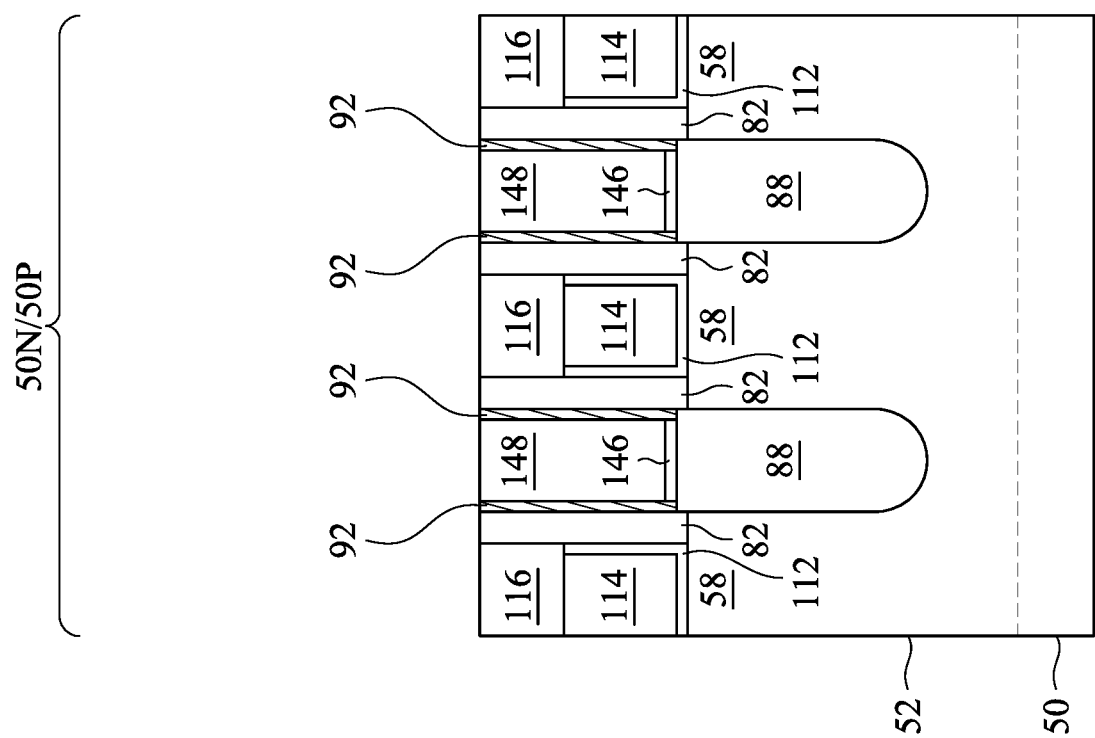
Figure 19C:
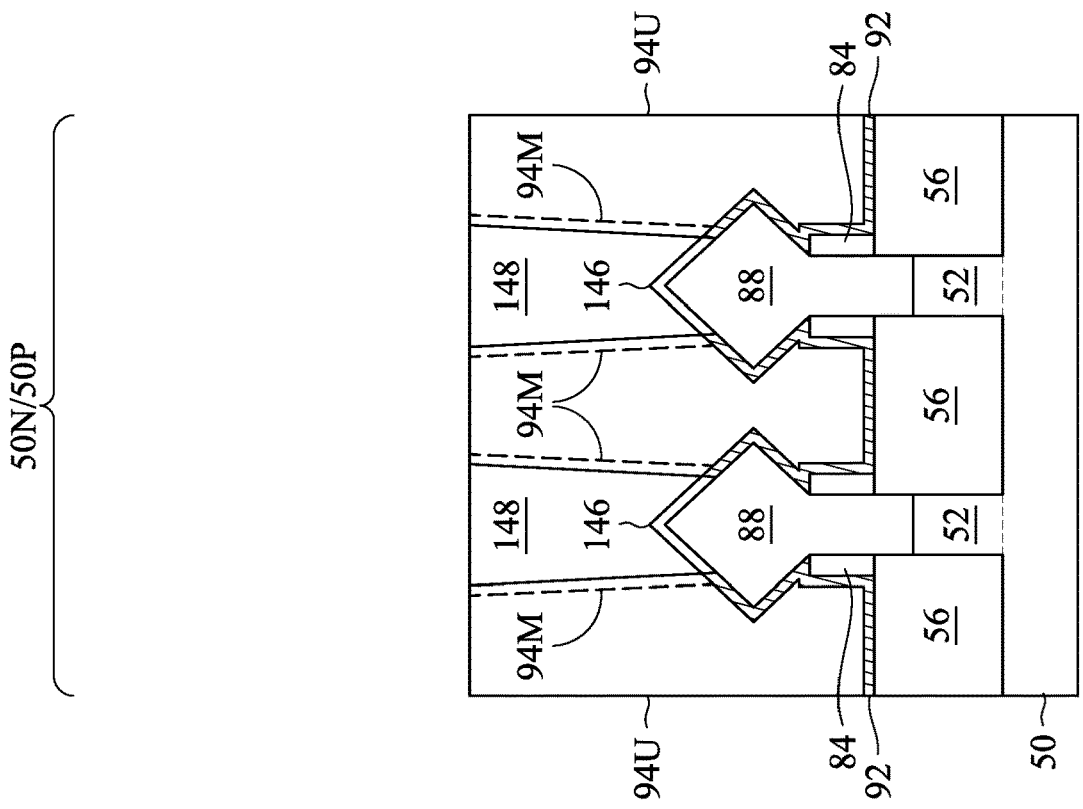
Figure 19B:
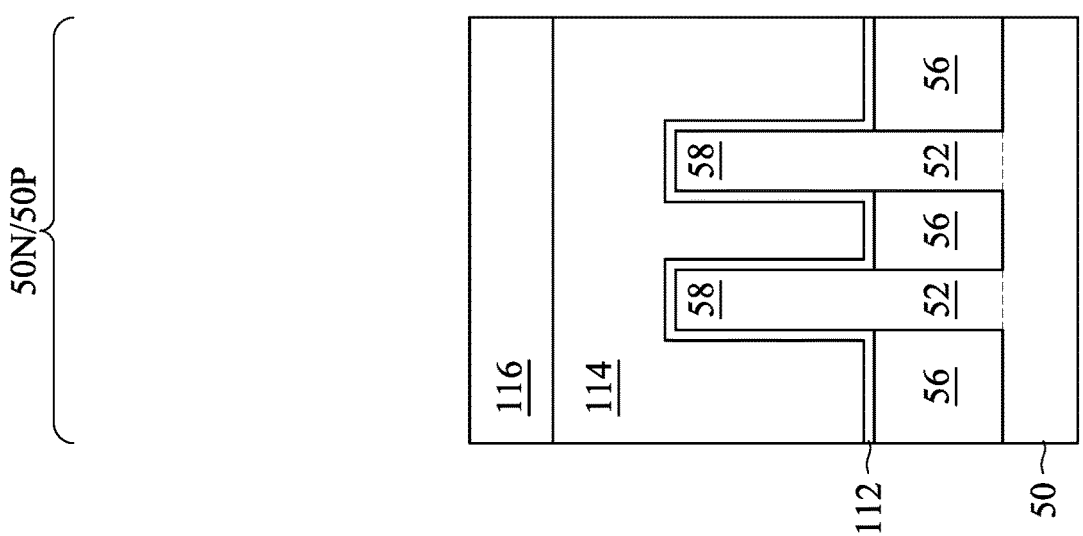
Figure 19D:
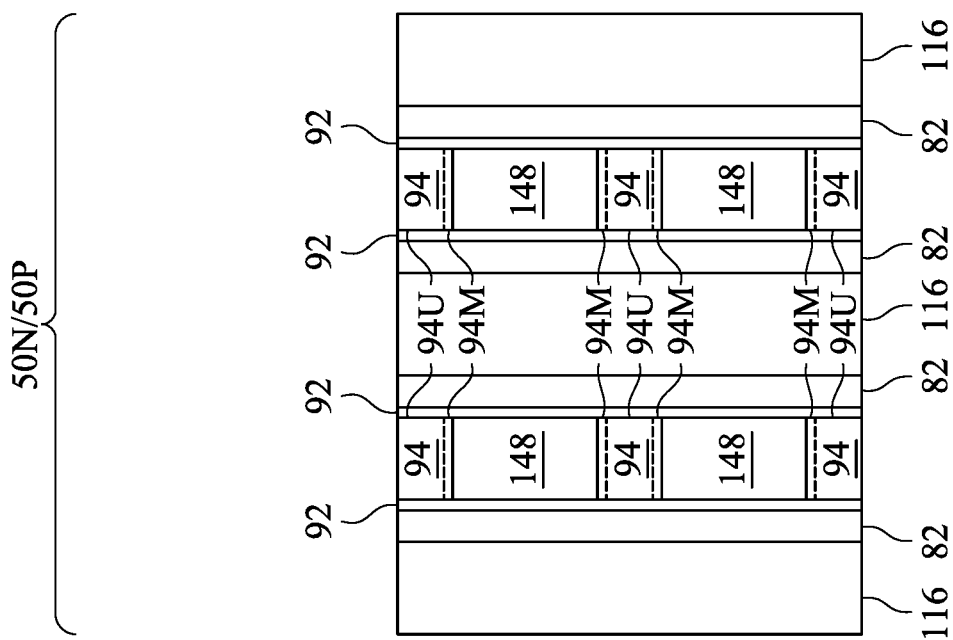

In FIGS. 18A-18C, the contact openings 140 are extended through the CESL 92. The CESL 92 is thus opened such that the contact openings 140 expose the epitaxial source/drain regions 88. The contact openings 140 may be extended through the CESL 92 using acceptable etching techniques. The etching may include any acceptable etching process, such as a wet or dry etch with an etchant that is selective to the material of the CESL 92 (e.g., selectively etches the material of the CESL 92 at a faster rate than the material of the first ILD 94). The etching process for opening the CESL 92 is different from (e.g., is performed with different etching parameters, different etchants, and/or a different type of etching than) the etching processes used for opening the first ILD 94 and for the cleaning process 144.

In FIGS. 19A-19D, source/drain contacts 148 are formed in the contact openings 140. A liner (not separately illustrated), such as a diffusion barrier layer, an adhesion layer, or the like, and a conductive material are formed in the contact openings 140. The liner may include titanium, titanium nitride, tantalum, tantalum nitride, or the like. The conductive material may be cobalt, tungsten, copper, a copper alloy, silver, gold, aluminum, nickel, or the like. A removal process may be performed to remove excess material from the top surfaces of the gate masks 116, the first ILD 94, and the gate spacers 82. The removal process may also remove any remaining portions of the pad layer 122, the cut mask 132, and/or the contact mask 136. The remaining liner and conductive material form the source/drain contacts 148 in the contact openings 140. In some embodiments, a planarization process such as a chemical mechanical polish (CMP), an etch-back process, combinations thereof, or the like is utilized. After the planarization process, the top surfaces of the source/drain contacts 148, the gate masks 116, the first ILD 94, and the gate spacers 82 are substantially coplanar (within process variations). The source/drain contacts 148 may be physically and electrically coupled to the epitaxial source/drain regions 88.

Optionally, metal-semiconductor alloy regions 146 are formed at the interfaces between the epitaxial source/drain regions 88 and the source/drain contacts 148. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the source/drain contacts 148 by depositing a metal in the contact openings 140 and then performing a thermal anneal process. The metal can be any metal capable of reacting with the semiconductor materials (e.g., silicon, silicon-germanium, germanium, etc.) of the epitaxial source/drain regions 88 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the contact openings 140, such as from surfaces of the metal-semiconductor alloy regions 146. The source/drain contacts 148 can then be formed on the metal-semiconductor alloy regions 146.

The modified ILD regions 94M are between the unmodified ILD regions 94U and the source/drain contacts 148. In some embodiments, the modified ILD regions 94M have a thickness in the range of 1 nm to 5 nm. Performing the treatment process 142 before the cleaning process 144 (described for FIGS. 17A-17C) decreases the amount of etching of the modified ILD regions 94M during the cleaning process 144. Specifically, damage caused by the etchants for the cleaning process 144 may be reduced. Avoiding damage to the first ILD 94 can improve its film quality, which may reduce leakage between adjacent source/drain contacts 148. Performance and yield of the resulting devices may thus be improved.

Figure 20A:
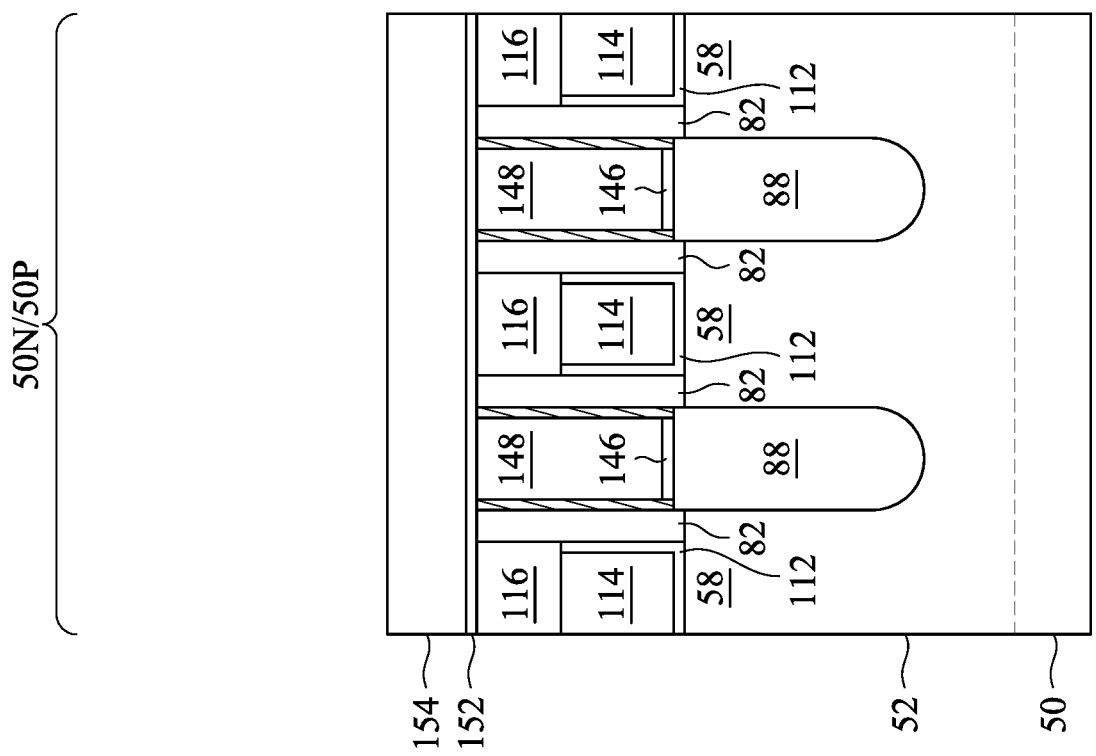
Figure 20C:
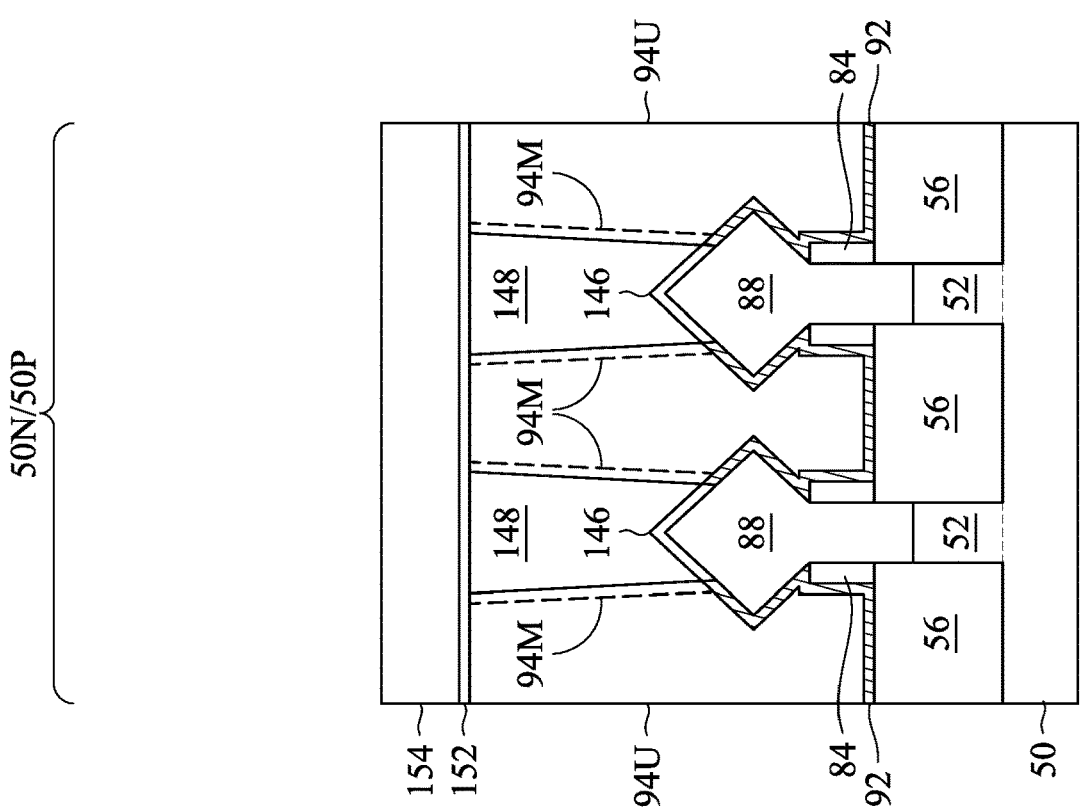
Figure 20B:
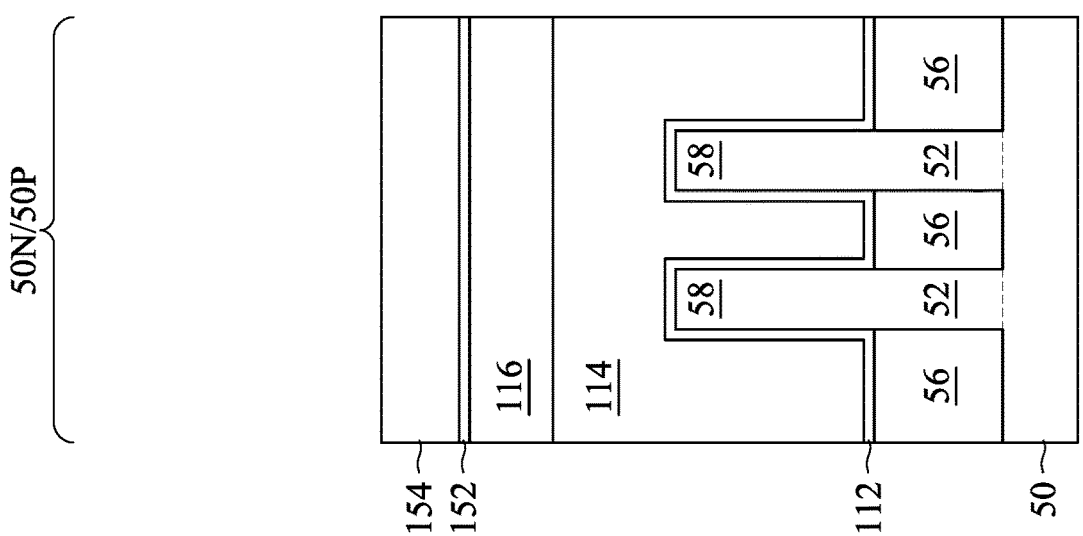

In FIGS. 20A-20C, a second ILD 154 is deposited over the source/drain contacts 148, the gate masks 116, the first ILD 94, and the gate spacers 82. In some embodiments, the second ILD 154 is a flowable film formed by a flowable CVD method. In some embodiments, the second ILD 154 is formed of a dielectric material such as PSG, BSG, BPSG, USG, or the like, which may be deposited by any suitable method, such as CVD, PECVD, or the like.

In some embodiments, an etch stop layer (ESL) 152 is formed between the second ILD 154 and the source/drain contacts 148, the gate masks 116, the first ILD 94, and the gate spacers 82. The ESL 152 may include a dielectric material, such as silicon nitride, silicon oxide, silicon oxynitride, or the like, having a high etching selectivity from the etching of the second ILD 154.

Figure 21A:
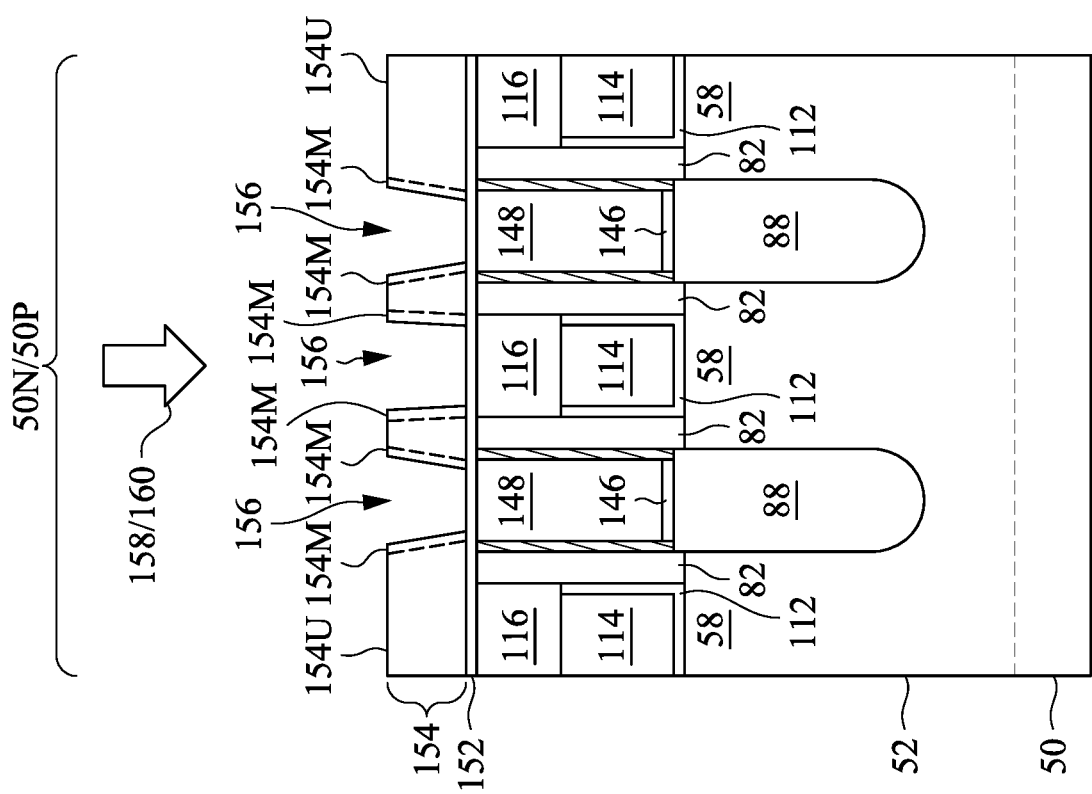
Figure 21C:
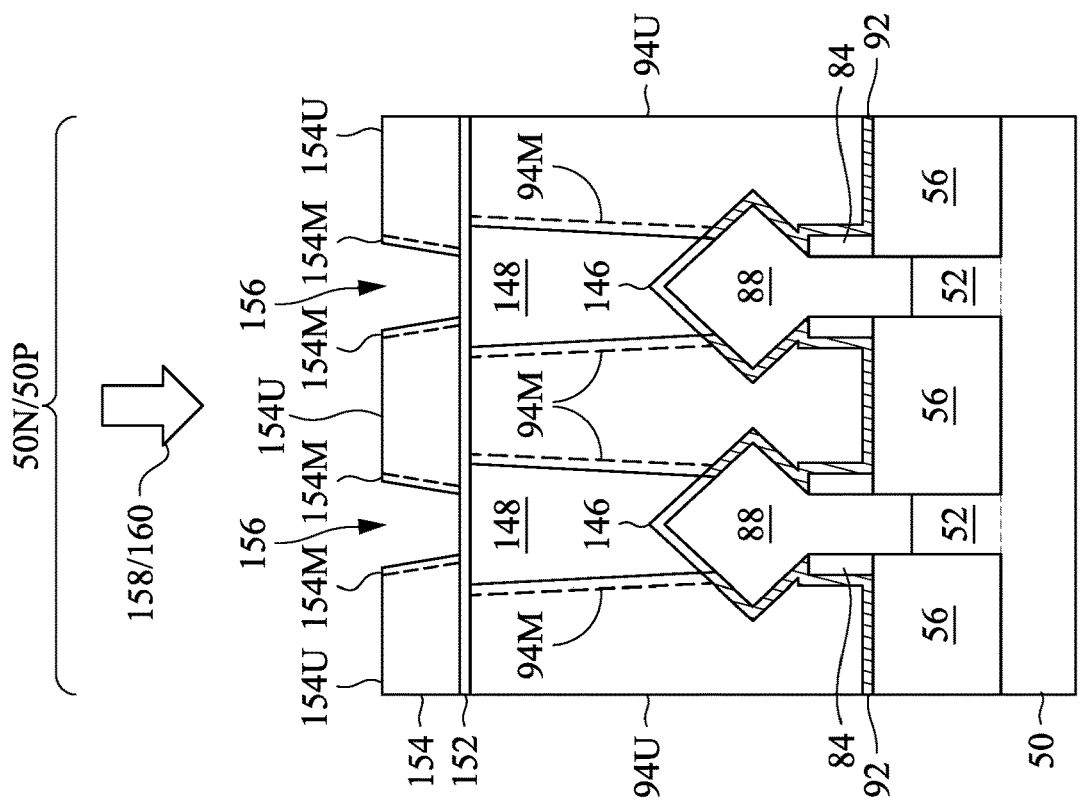
Figure 21B:
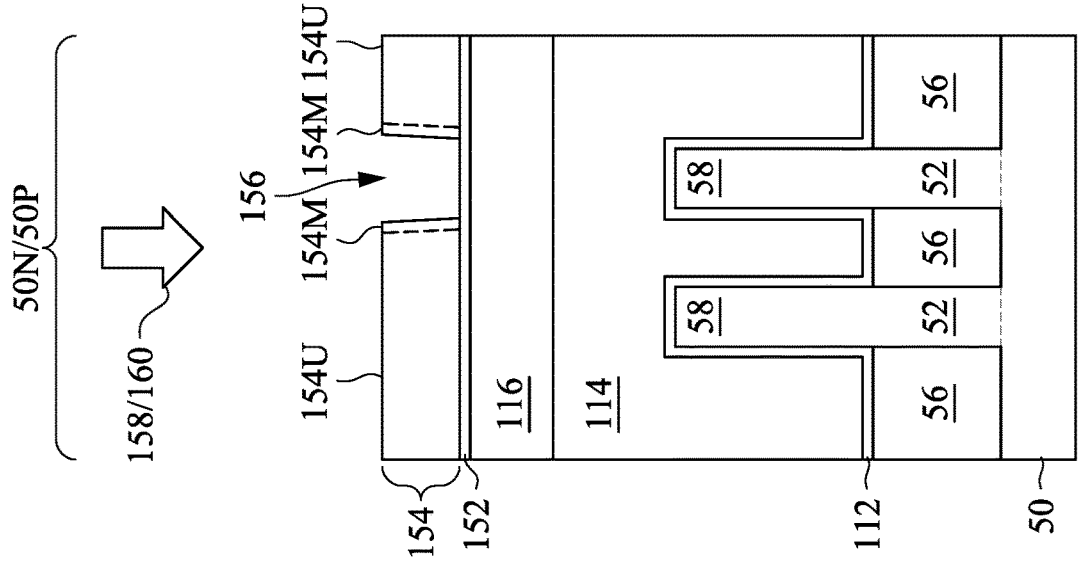

In FIGS. 21A-21C, via openings 156 are formed through the second ILD 154. The via openings 156 may be formed using acceptable photolithography and etching techniques. The etching may include any acceptable etching process, such as one that is selective to the material of the second ILD 154 (e.g., selectively etches the material of the second ILD 154 at a faster rate than the material of the ESL 152). The etching process may be anisotropic. The ESL 152 stops the etching of the via openings 156. Accordingly, the via openings 156 expose the ESL 152, and the ESL 152 still covers the source/drain contacts 148 and the gate masks 116.

After the via openings 156 are formed through the second ILD 154, a treatment process 158 is optionally performed in the via openings 156. After the treatment process 158, a cleaning process 160 is performed in the via openings 156. The cleaning process 160 may be performed before the via openings 156 are extended through the ESL 152 (subsequently described).

The treatment process 158 modifies an etch rate of treated regions of the second ILD 154. Specifically, the treatment process 158 modifies regions 154M of the second ILD 154 around the via openings 156, with unmodified regions 154U of the second ILD 154 being unaffected by the treatment process 158 (or at least less affected than the modified ILD regions 154M). The modified ILD regions 154M have a decreased etch rate relative an etch that will be used in the cleaning process 160. The treatment process 158 may include any of the candidate methods of the treatment process 142 (previously described for FIGS. 17A-17C). For example, the treatment process 158 can include a nitrogen radical treatment process (in which the modified ILD regions 154M are reacted with nitrogen free radicals and/or bombarded with nitrogen cations), a nitrogen soak process (in which the modified ILD regions 154M are soaked in a nitrogen-containing gas without generating a plasma), and/or an ultraviolet curing process (in which the modified ILD regions 154M are exposed to ultraviolet light). The treatment process 158 may be the same as the treatment process 142, or may be different than the treatment process 142. The treatment process 158 may be performed in-situ or ex-situ with the etching of the via openings 156. The treatment process 158 decreases the amount of etching of the modified ILD regions 154M during the cleaning process 160, similar to how the treatment process 142 decreased the etching of the modified ILD regions 94M during the cleaning process 144 (described for FIGS. 17A-17C).

The cleaning process 160 cleans residue of the second ILD 154 from the via openings 156. The cleaning process 160 may include any of the candidate methods of the cleaning process 144 (previously described for FIGS. 17A-17C). As a result of performing the treatment process 158, the modified ILD regions 154M have a decreased concentration of impurities that the cleaning process 160 is selective to.

Figure 22A:
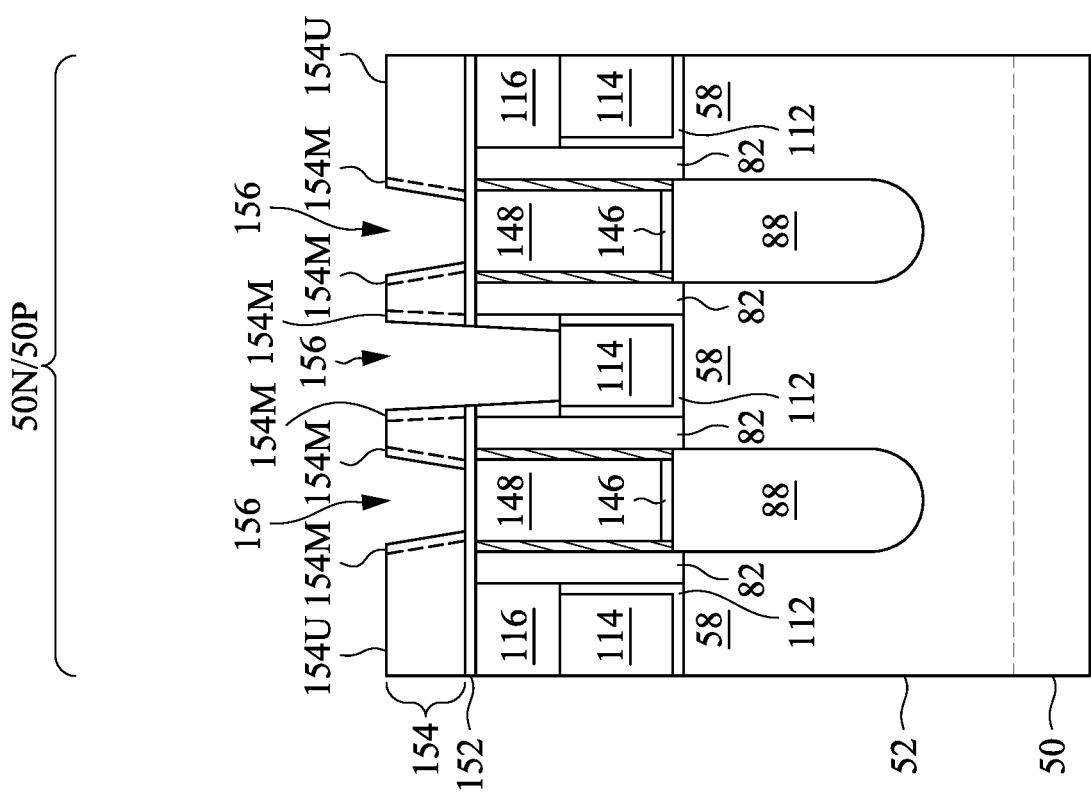
Figure 22C:
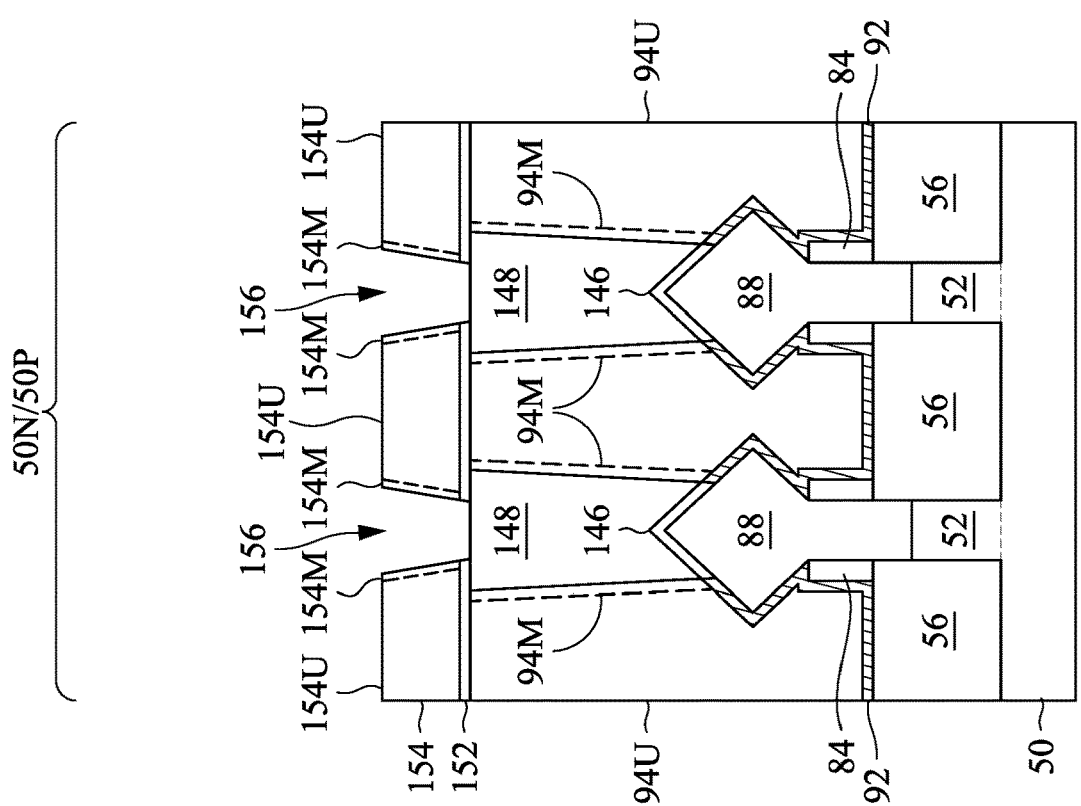
Figure 22B:
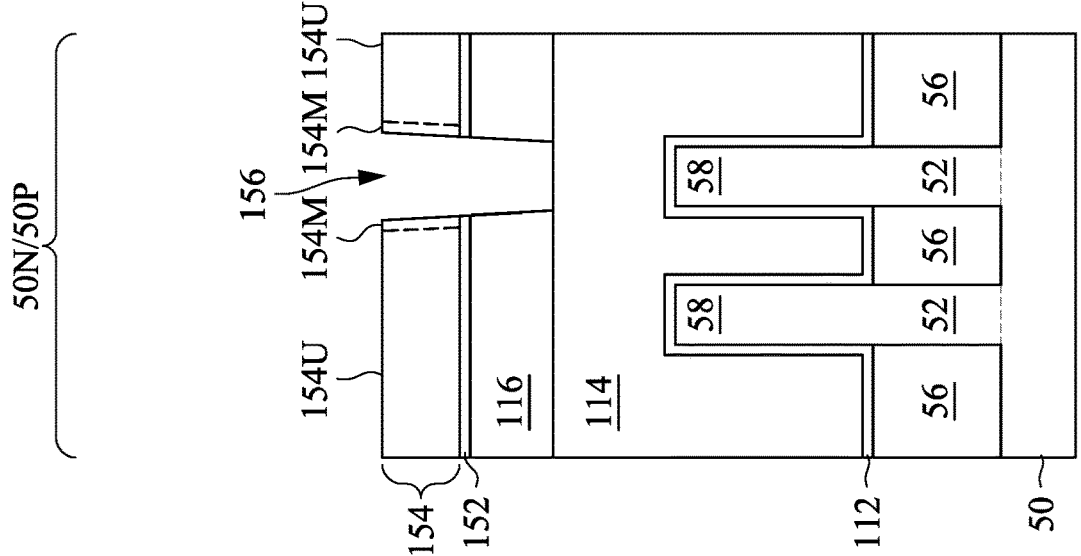
Figure 23A:
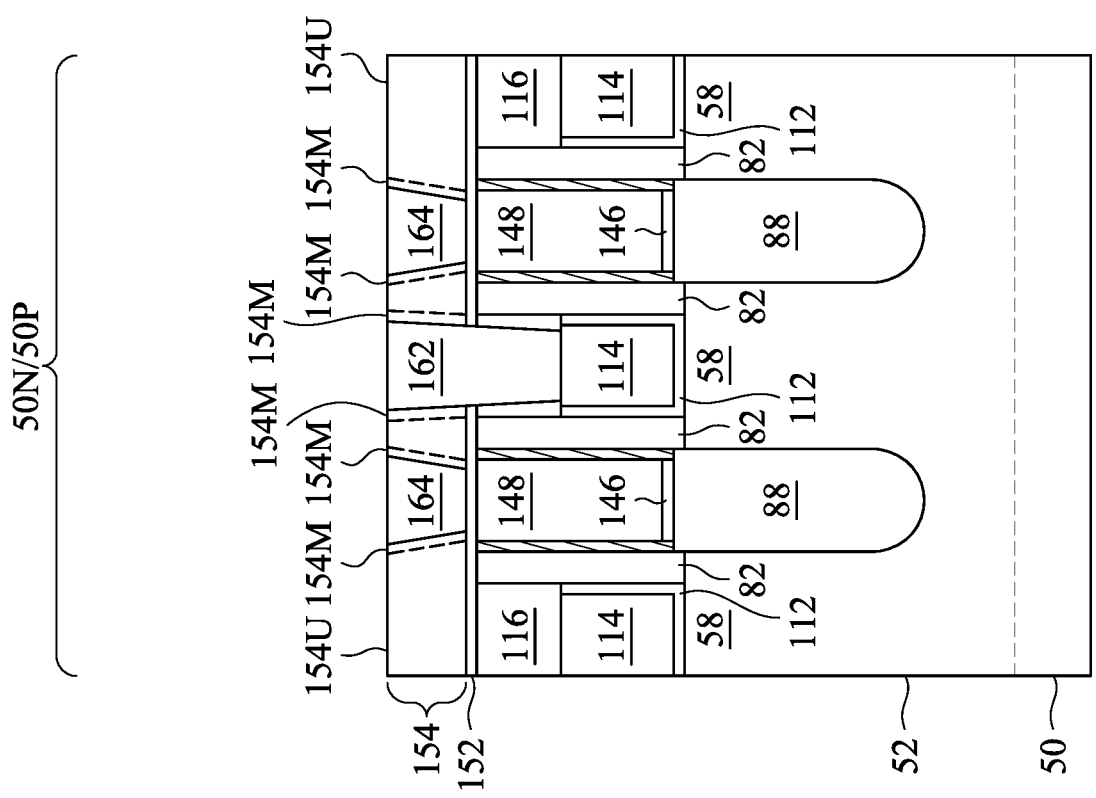
Figure 23C:
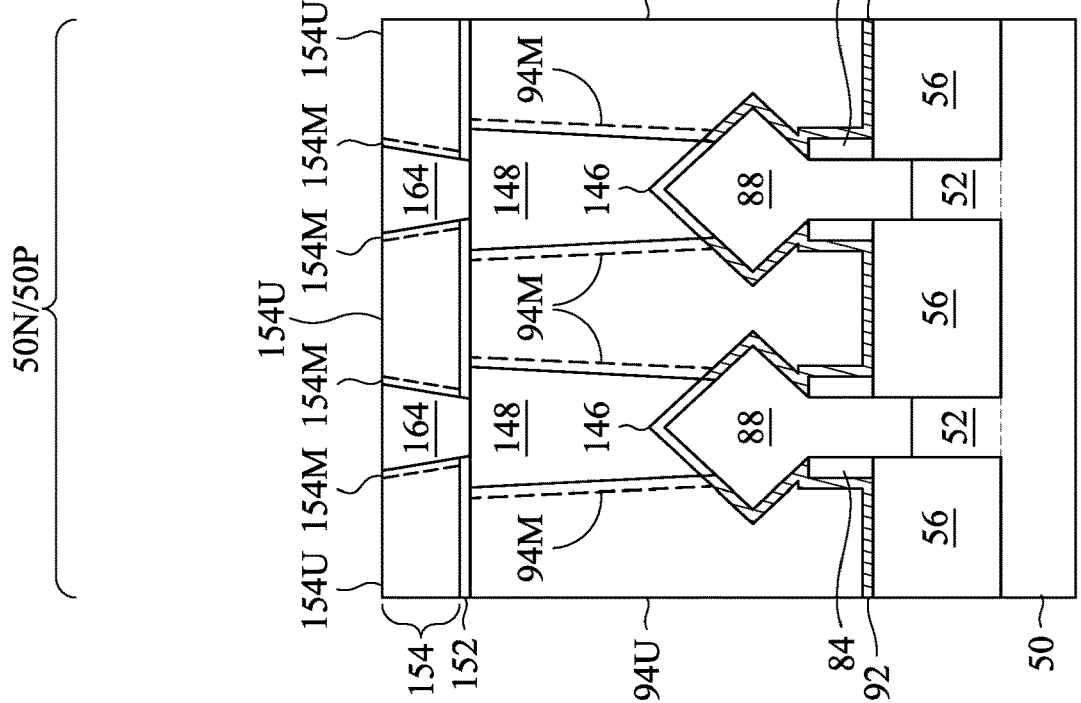
Figure 23B:
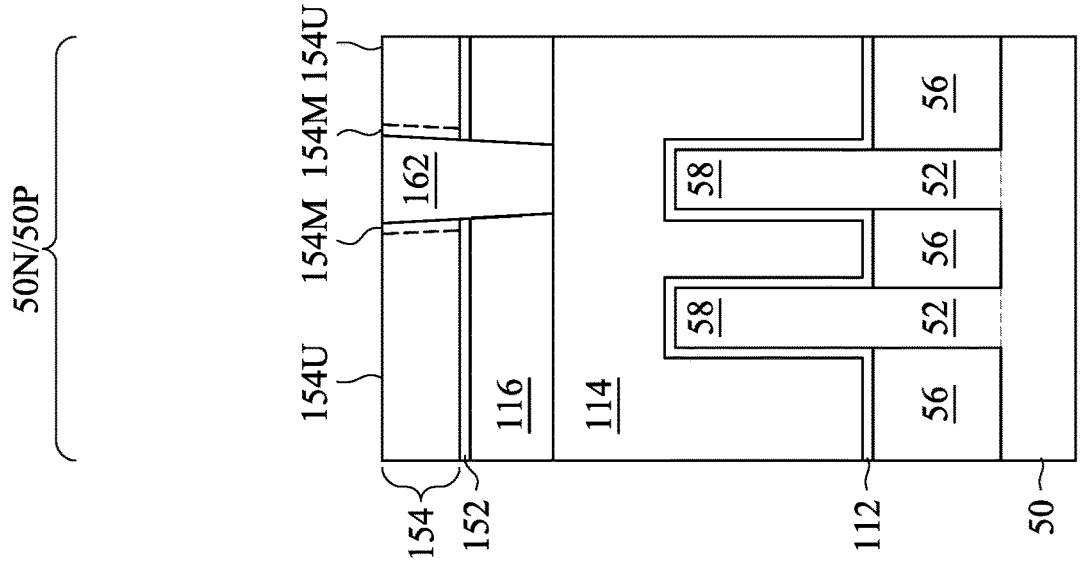
Figure 23D:
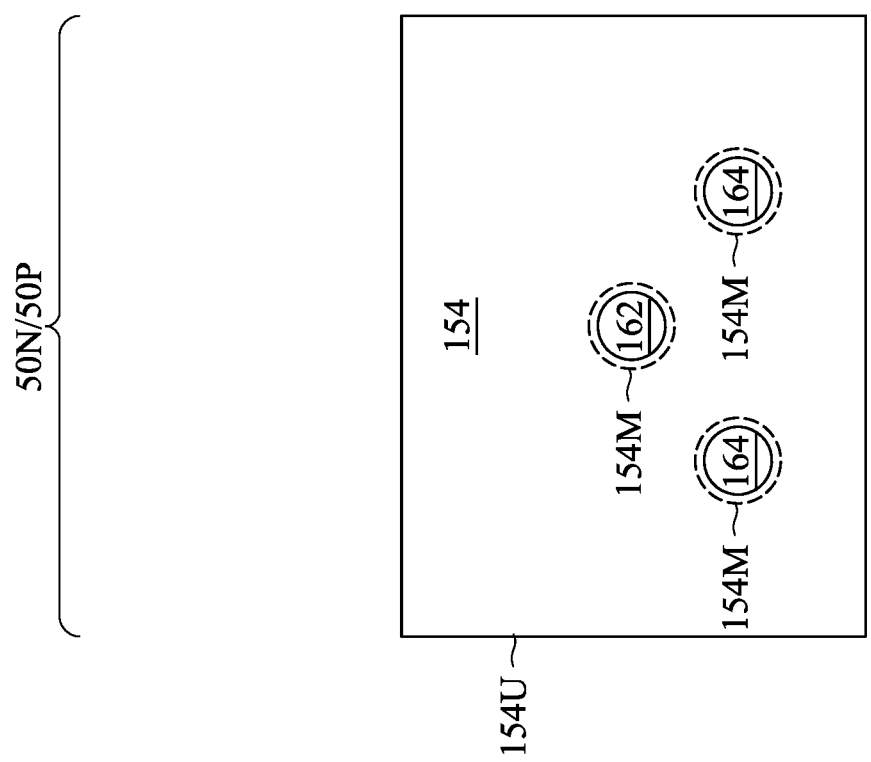
Figure 24A:
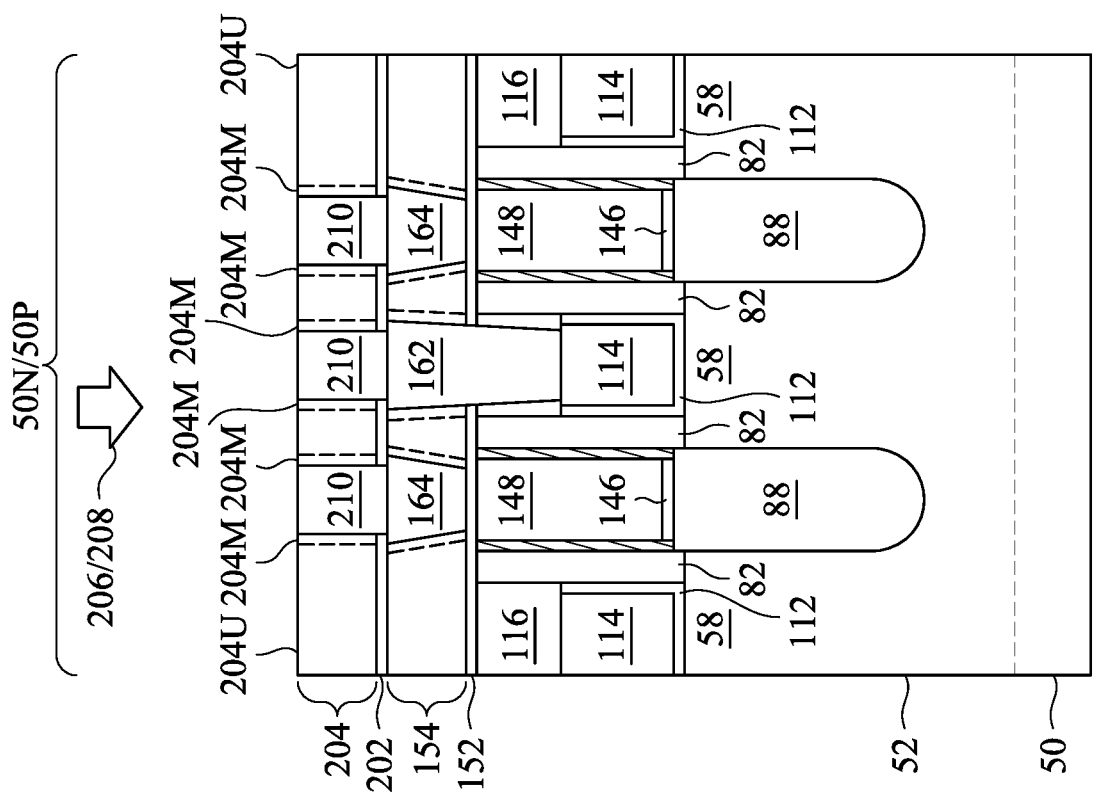
FIGS. 24A-24D are views of FinFETs, in accordance with some embodiments.
Figure 24C:
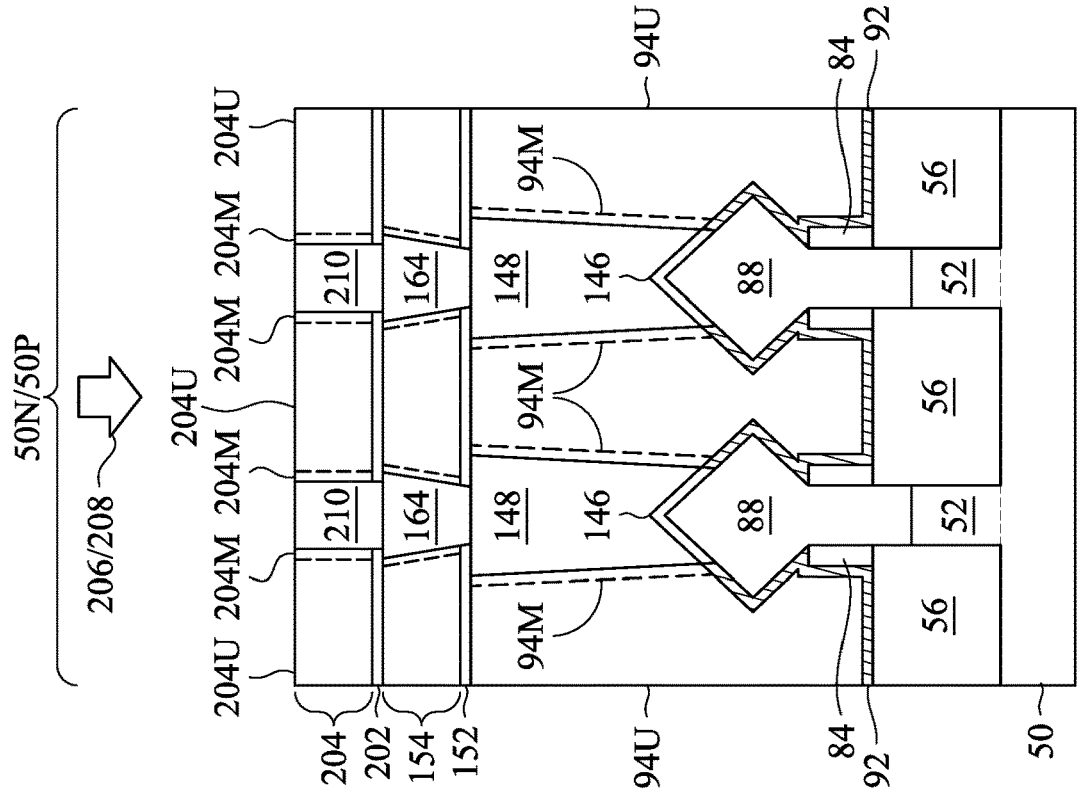
Figure 24B:
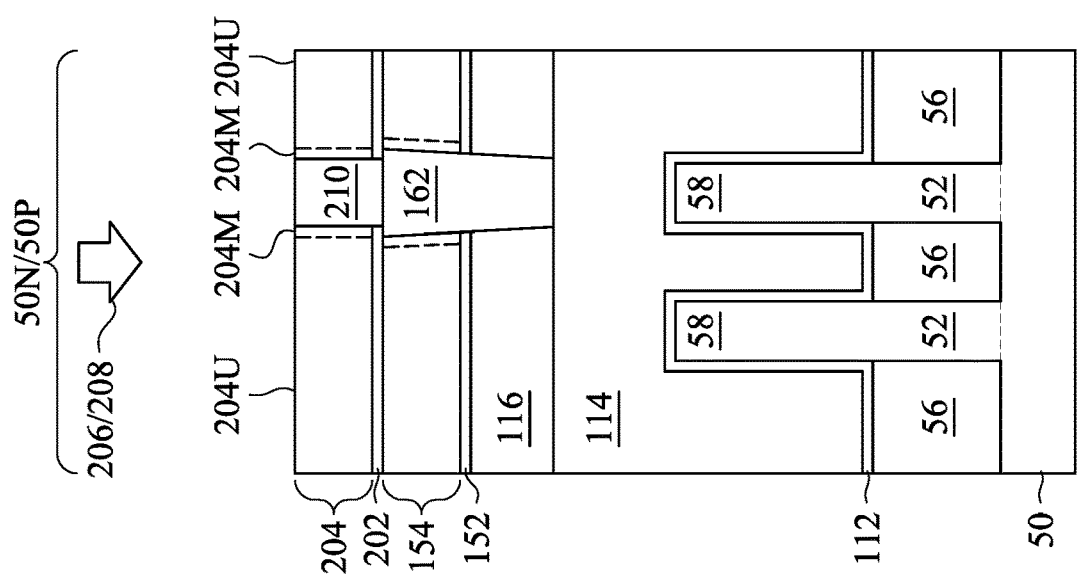
Figure 24D:
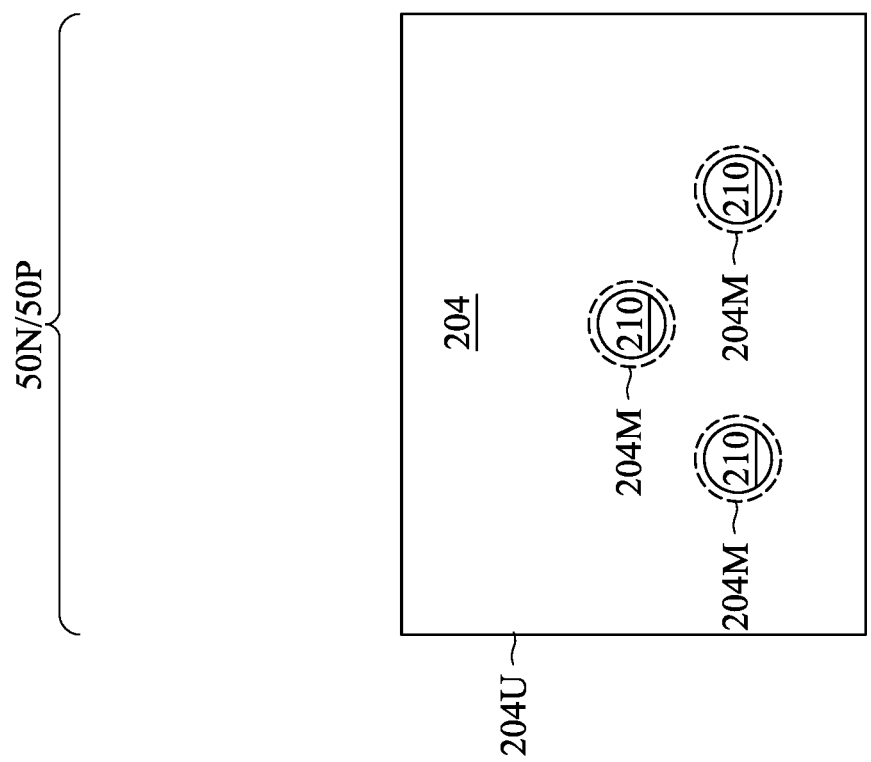

In FIGS. 22A-22C, the via openings 156 are extended through the ESL 152. Some of the via openings 156 are also extended through the gate masks 116, where applicable. The ESL 152 is thus opened such that each via opening 156 exposes a gate electrode 114 or a source/drain contact 148. The via openings 156 may be extended through the ESL 152 using acceptable etching techniques. The etching may include any acceptable etching process, such as a wet or dry etch with an etchant that is selective to the material of the ESL 152 (e.g., selectively etches the material of the ESL 152 at a faster rate than the material of the second ILD 154).

In FIGS. 23A-23D, gate vias 162 and source/drain vias 164 are formed in the via openings 156. A liner (not separately illustrated), such as a diffusion barrier layer, an adhesion layer, or the like, and a conductive material are formed in the via openings 156. The liner may include titanium, titanium nitride, tantalum, tantalum nitride, or the like. The conductive material may be cobalt, tungsten, copper, a copper alloy, silver, gold, aluminum, nickel, or the like. A removal process may be performed to remove excess material from the top surface of the second ILD 154. The remaining liner and conductive material form the gate vias 162 and the source/drain vias 164 in the via openings 156. In some embodiments, a planarization process such as a chemical mechanical polish (CMP), an etch-back process, combinations thereof, or the like is utilized. After the planarization process, the top surfaces of the source/drain vias 164, the gate vias 162, and the second ILD 154 are substantially coplanar (within process variations). The gate vias 162 and the source/drain vias 164 may be physically and electrically coupled to, respectively, the gate electrodes 114 and the source/drain contacts 148.

The gate vias 162 and the source/drain vias 164 may be formed in distinct processes, or may be formed in the same process. Although shown as being formed in the same cross-section in FIG. 23A, it should be appreciated that each of the gate vias 162 and the source/drain vias 164 may be formed in different cross-sections, which may avoid shorting of the contacts.

The modified ILD regions 154M are between the unmodified ILD regions 154U and the gate vias 162 or the source/drain vias 164 (whichever is applicable). In some embodiments, the modified ILD regions 154M have a thickness in the range of 1 nm to 5 nm. The modified ILD regions 154M extend around the gate vias 162 or the source/drain vias 164 in a top-down view. Performing the treatment process 158 before the cleaning process 160 (described for FIGS. 21A-21C) decreases the amount of etching of the modified ILD regions 154M during the cleaning process 160.

Specifically, damage caused by the etchants for the cleaning process 160 may be reduced. Avoiding damage to the second ILD 154 can improve its film quality, which may reduce leakage between adjacent gate vias 162 and/or adjacent source/drain vias 164. Performance and yield of the resulting devices may thus be improved.

It should be appreciated that any combination of the treatment process 142 (see FIGS. 17A-17C) and the treatment process 158 (see FIGS. 21A-21C) may be utilized. In some embodiments, the treatment process 142 and the treatment process 158 are both performed. In other embodiments, the treatment process 142 is performed and the treatment process 158 is omitted. In yet other embodiments, the treatment process 158 is performed and the treatment process 142 is omitted.

Embodiments may achieve advantages. Performing the treatment process 158 and/or the treatment process 142 can help improve the quality of the second ILD 154 and/or the first ILD 94. The electrical isolation between adjacent source/drain vias 164, adjacent gate vias 162, and/or adjacent source/drain contacts 148 may thus be improved, thereby reducing leakage. Performance and yield of the resulting device s may thus be improved.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

Further, the FinFET/NSFET devices may be interconnected by metallization layers in an overlying interconnect structure to form integrated circuits. Additional features, such as passive devices, memories (e.g., magnetoresistive random-access memory (MRAM), resistive random access memory (RRAM), phase-change random access memory (PCRAM), etc.), or the like may be integrated with the interconnect structure during a back end of line (BEOL) process.

FIGS. 24A-24D are views of FinFETs, in accordance with some embodiments. An interconnect structure is formed on the structure of FIGS. 23A-23D, interconnecting the FinFETs to form integrated circuits. The interconnect structure can be formed in a back end of line (BEOL) process, in which metallization layers are connected to the gate vias 162 and the source/drain vias 164.

An inter-metal dielectric (IMD) 204 is deposited over the second ILD 154, the gate vias 162, and the source/drain vias 164. In some embodiments, the IMD 204 is a flowable film formed by a flowable CVD method. In some embodiments, the IMD 204 is formed of a dielectric material such as PSG, BSG, BPSG, USG, or the like, which may be deposited by any suitable method, such as CVD, PECVD, or the like. The IMD 204 may be formed of a low-k dielectric material having a k-value of less than about 3.0. The IMD 204 may be formed of an extra-low-k (ELK) dielectric material having a k-value of less than about 2.5.

In some embodiments, an etch stop layer (ESL) 202 is formed between the IMD 204 and the second ILD 154, the gate vias 162, and the source/drain vias 164. The ESL 202 may include a dielectric material, such as silicon nitride, silicon oxide, silicon oxynitride, or the like, having a high etching selectivity from the etching of the IMD 204.

Interconnects 210 are formed extending through the second ILD 154 and the ESL 202. The interconnects 210 may include metal lines and vias, which may be formed of a conductive material, such as copper, aluminum, or the like. The interconnects 210 may be formed by a damascene process, such as a single damascene process, a dual damascene process, or the like.

When forming openings for the interconnects 210, a treatment process 206 may be performed after forming the openings in the IMD 204. After the treatment process 206, a cleaning process 208 is performed in the openings in the IMD 204. The cleaning process 208 may be performed before extending the openings through the ESL 202.

The treatment process 206 modifies an etch rate of treated regions of the IMD 204. Specifically, the treatment process 206 modifies regions 204M of the IMD 204 around the interconnect openings, with unmodified regions 204U of the IMD 204 being unaffected by the treatment process 206 (or at least less affected than the modified IMD regions 204M). The modified IMD regions 204M have a decreased etch rate relative an etch that will be used in the cleaning process 208. The treatment process 206 may include any of the candidate methods of the treatment process 142 (previously described for FIGS. 17A-17C). For example, the treatment process 206 can include a nitrogen radical treatment process (in which the modified IMD regions 204M are reacted with nitrogen free radicals and/or bombarded with nitrogen cations), a nitrogen soak process (in which the modified IMD regions 204M are soaked in a nitrogen-containing gas without generating a plasma), and/or an ultraviolet curing process (in which the modified IMD regions 204M are exposed to ultraviolet light). The treatment process 206 may be the same as the treatment process 142, or may be different than the treatment process 142. The treatment process 206 may be performed in-situ or ex-situ with the etching of the interconnect openings. The treatment process 206 decreases the amount of etching of the modified IMD regions 204M during the cleaning process 208, similar to how the treatment process 142 decreased the etching of the modified ILD regions 94M during the cleaning process 144 (described for FIGS. 17A-17C).

The cleaning process 208 cleans residue of the IMD 204 from the openings for the interconnects 210. The cleaning process 208 may include any of the candidate methods of the cleaning process 144 (previously described for FIGS. 17A-17C). As a result of performing the treatment process 206, the modified IMD regions 204M have a decreased concentration of impurities that the cleaning process 208 is selective to.

The modified IMD regions 204M are between the unmodified IMD regions 204U and the interconnects 210. In some embodiments, the modified IMD regions 204M have a thickness in the range of 1 nm to 5 nm. The modified IMD regions 204M extend around the interconnects 210 in a top-down view. Performing the treatment process 206 before the cleaning process 208 decreases the amount of etching of the modified IMD regions 204M during the cleaning process 208. Specifically, damage caused by the etchants for the cleaning process 208 may be reduced. Avoiding damage to the IMD 204 may reduce leakage between adjacent interconnects 210. Performance and yield of the resulting devices may thus be improved.

It should be appreciated that the previously described treatment process(es) may, more generally, be applied to any dielectric layer over a first conductive feature. The dielectric layer may be any of the previously described ILDs, IMDs, etc. The first conductive feature may be any of the previously described gate electrodes, source/drain contacts, etc. A second conductive feature may be formed through the dielectric layer to contact the first conductive feature. The second conductive feature may be any of the previously described metal vias, metal lines, etc. The portions of the dielectric layer proximate the second conductive feature may have a lesser impurity concentration than the portions of the dielectric layer distal the second conductive feature, as a result of the treatment process(es). In some embodiments, the portions of the dielectric layer proximate the second conductive feature comprise silicon oxide without hydrogen impurities, and the portions of the dielectric layer distal the second conductive feature comprise silicon oxide with hydrogen impurities.

In an embodiment, a device includes: a source/drain region over a semiconductor substrate; a dielectric layer over the source/drain region, the dielectric layer including a first dielectric material; an inter-layer dielectric over the dielectric layer, the inter-layer dielectric including a second dielectric material and an impurity, the second dielectric material different from the first dielectric material, a first portion of the inter-layer dielectric having a first concentration of the impurity, a second portion of the inter-layer dielectric having a second concentration of the impurity, the first concentration less than the second concentration; and a source/drain contact extending through the inter-layer dielectric and the dielectric layer to contact the source/drain region, the first portion of the inter-layer dielectric disposed between the source/drain contact and the second portion of the inter-layer dielectric. In some embodiments of the device, the first dielectric material is silicon nitride, the second dielectric material is silicon oxide, and the impurity is hydrogen. In some embodiments of the device, the first portion of the inter-layer dielectric has a first density, the second portion of the inter-layer dielectric has a second density, and the first density is greater than the second density. In some embodiments of the device, the inter-layer dielectric further includes nitrogen, the first portion of the inter-layer dielectric has a third concentration of nitrogen, the second portion of the inter-layer dielectric has a fourth concentration of nitrogen, and the third concentration is greater than the fourth concentration. In some embodiments of the device, the first concentration is less than 5%. In some embodiments of the device, the first concentration is zero.

In an embodiment, a device includes: a first conductive feature over a semiconductor substrate; a dielectric layer over the first conductive feature; and a second conductive feature extending through the dielectric layer to contact the first conductive feature, a first portion of the dielectric layer wrapped around the second conductive feature in a top-down view, a second portion of the dielectric layer separated from the second conductive feature in the top-down view by the first portion of the dielectric layer, the second portion of the dielectric layer including silicon oxide with hydrogen impurities, the first portion of the dielectric layer including silicon oxide without hydrogen impurities. In some embodiments of the device, the first conductive feature is a gate electrode. In some embodiments of the device, the first conductive feature is a source/drain contact. In some embodiments of the device, the second conductive feature is a metal via. In some embodiments of the device, the second conductive feature is a metal line. In some embodiments of the device, the dielectric layer is an inter-layer dielectric or an inter-metal dielectric. In some embodiments of the device, the first portion of the dielectric layer has a greater density than the second portion of the dielectric layer.

In an embodiment, a method includes: depositing a dielectric material on an etch stop layer; patterning a contact opening in the dielectric material to expose the etch stop layer; decreasing a first etch rate of a first portion of the dielectric material to less than a second etch rate of a second portion of the dielectric material, the first portion of the dielectric material disposed between the contact opening and the second portion of the dielectric material; cleaning the contact opening by performing an etching process, the first etch rate and the second etch rate being relative the etching process; after cleaning the contact opening, extending the contact opening through the etch stop layer; and forming a contact in the contact opening. In some embodiments of the method, the dielectric material includes an impurity, and decreasing the first etch rate of the first portion of the dielectric material includes decreasing a first concentration of the impurity in the first portion of the dielectric material to less than a second concentration of the impurity in the second portion of the dielectric material. In some embodiments of the method, the impurity is hydrogen and the etching process is performed with a fluorine-based etchant. In some embodiments of the method, decreasing the first concentration of the impurity in the first portion of the dielectric material includes nitrating the first portion of the dielectric material. In some embodiments of the method, nitrating the first portion of the dielectric material includes soaking the first portion of the dielectric material in a nitrogen-containing gas. In some embodiments of the method, nitrating the first portion of the dielectric material includes bombarding the first portion of the dielectric material with nitrogen free radicals. In some embodiments of the method, decreasing the first concentration of the impurity in the first portion of the dielectric material includes exposing the first portion of the dielectric material to ultraviolet light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a dielectric material on an etch stop layer;
   patterning a contact opening in the dielectric material to expose the etch stop layer;
   decreasing a first etch rate of a first portion of the dielectric material to less than a second etch rate of a second portion of the dielectric material, the first portion of the dielectric material disposed between the contact opening and the second portion of the dielectric material;
   cleaning the contact opening by performing an etching process, the first etch rate and the second etch rate being relative the etching process;
   after cleaning the contact opening, extending the contact opening through the etch stop layer; and
   forming a contact in the contact opening.

2. The method of claim 1, wherein the dielectric material comprises an impurity, and decreasing the first etch rate of the first portion of the dielectric material comprises decreasing a first concentration of the impurity in the first portion of the dielectric material to less than a second concentration of the impurity in the second portion of the dielectric material.

3. The method of claim 2, wherein the impurity is hydrogen and the etching process is performed with a fluorine-based etchant.

4. The method of claim 2, wherein decreasing the first concentration of the impurity in the first portion of the dielectric material comprises nitrating the first portion of the dielectric material.

5. The method of claim 4, wherein nitrating the first portion of the dielectric material comprises soaking the first portion of the dielectric material in a nitrogen-containing gas.

6. The method of claim 4, wherein nitrating the first portion of the dielectric material comprises bombarding the first portion of the dielectric material with nitrogen free radicals.

7. The method of claim 2, wherein decreasing the first concentration of the impurity in the first portion of the dielectric material comprises exposing the first portion of the dielectric material to ultraviolet light.

8. A method comprising:
   growing a source/drain region adjacent a channel region;
   depositing a dielectric layer over the source/drain region, the dielectric layer comprising a first dielectric material;
   depositing an inter-layer dielectric over the dielectric layer, the inter-layer dielectric comprising a second dielectric material and an impurity, the second dielectric material different from the first dielectric material;
   patterning a contact opening in the inter-layer dielectric to expose the dielectric layer;
   treating a first portion of the inter-layer dielectric around the contact opening with a treatment process, a second portion of the inter-layer dielectric being unaffected by the treatment process, the first portion of the inter-layer dielectric having a first concentration of the impurity, the second portion of the inter-layer dielectric having a second concentration of the impurity, the first concentration being less than the second concentration;
   after the treatment process, extending the contact opening through the dielectric layer; and
   forming a source/drain contact in the contact opening.

9. The method of claim 8, wherein the treatment process comprises a nitridation process.

10. The method of claim 8, wherein the treatment process comprises an ultraviolet curing process.

11. The method of claim 8, wherein the impurity is hydrogen, and the treatment process reduces a hydrogen concentration in the first portion of the inter-layer dielectric as compared to the second portion of the inter-layer dielectric.

12. The method of claim 8, wherein the treatment process increases a nitrogen concentration of the first portion of the inter-layer dielectric as compared to the second portion of the inter-layer dielectric.

13. The method of claim 8, further comprising:
    after the treatment process and before extending the contact opening through the dielectric layer, performing a cleaning process in the contact opening, the cleaning process comprising an etching process that is selective to the impurity.

14. A method comprising:
    forming a first conductive feature;
    depositing a dielectric layer over the first conductive feature;
    patterning an opening in the dielectric layer;
    decreasing a first etch rate of a first portion of the dielectric layer to less than a second etch rate of a second portion of the dielectric layer, the first portion of the dielectric layer disposed between the opening and the second portion of the dielectric layer;
    cleaning the opening by performing an etching process, the first etch rate and the second etch rate being relative the etching process; and
    forming a second conductive feature in the opening, the second conductive feature being in contact with the first conductive feature.

15. The method of claim 14, wherein forming the first conductive feature comprises:
    forming a gate electrode over a channel region.

16. The method of claim 14, wherein forming the first conductive feature comprises:
    forming a contact to a source/drain region, the source/drain region being adjacent a channel region.

17. The method of claim 14, wherein forming the second conductive feature comprises:
    forming a metal via in the opening.

18. The method of claim 14, wherein forming the second conductive feature comprises:
    forming a metal line in the opening.

19. The method of claim 14, wherein the first portion of the dielectric layer has a greater density than the second portion of the dielectric layer.

20. The method of claim 14, wherein the first portion of the dielectric layer has a greater nitrogen concentration than the second portion of the dielectric layer.

* * * * *